US011195561B2

(12) United States Patent
Atsumi et al.

(10) Patent No.: US 11,195,561 B2
(45) Date of Patent: Dec. 7, 2021

(54) SEMICONDUCTOR DEVICE

(71) Applicant: SEMICONDUCTOR ENERGY LABORATORY CO., LTD., Atsugi (JP)

(72) Inventors: Tomoaki Atsumi, Kanagawa (JP); Kiyoshi Kato, Kanagawa (JP); Tatsuya Onuki, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/764,955

(22) PCT Filed: Nov. 30, 2018

(86) PCT No.: PCT/IB2018/059488
§ 371 (c)(1),
(2) Date: Sep. 4, 2020

(87) PCT Pub. No.: WO2019/111112
PCT Pub. Date: Jun. 13, 2019

(65) Prior Publication Data
US 2021/0012816 A1    Jan. 14, 2021

(30) Foreign Application Priority Data

Dec. 8, 2017 (JP) .............................. JP2017-236145
Feb. 20, 2018 (JP) .............................. JP2018-027585
(Continued)

(51) Int. Cl.
*G11C 7/04* (2006.01)
*G11C 5/04* (2006.01)
(Continued)

(52) U.S. Cl.
CPC .................. *G11C 7/04* (2013.01); *G11C 5/14* (2013.01); *G11C 11/4074* (2013.01);
(Continued)

(58) Field of Classification Search
CPC ......... G11C 7/04; G11C 5/14; G11C 11/4074; G11C 5/147; H01L 27/108;
(Continued)

(56) References Cited

U.S. PATENT DOCUMENTS 9,818,750 B2    11/2017    Ohshima et al.
2005/0104566 A1    5/2005    Kim
(Continued)

FOREIGN PATENT DOCUMENTS

JP    2012-069932 A    4/2012
JP    2012-146965 A    8/2012
(Continued)

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
(Continued)

*Primary Examiner* — Tri M Hoang
(74) *Attorney, Agent, or Firm* — Fish & Richardson P.C.

(57) ABSTRACT

A semiconductor device with a high on-state current and high operating speed is provided. The semiconductor device includes a transistor and a first circuit. The transistor includes a first gate and a second gate, and the first gate and the second gate include a region where they overlap each other with a semiconductor layer therebetween. The first circuit includes a temperature sensor and a voltage control circuit. The temperature sensor has a function of obtaining temperature information and outputting the temperature
(Continued)

information to the voltage control circuit. The voltage control circuit has a function of converting the temperature information into a control voltage. The first circuit applies the control voltage to the second gate.

10 Claims, 46 Drawing Sheets

(30) Foreign Application Priority Data

Jul. 11, 2018 (JP) .............................. JP2018-131207
Sep. 7, 2018 (JP) .............................. JP2018-167559

(51) Int. Cl.

| | | |
|---|---|---|
| G11C 11/4074 | (2006.01) | |
| H01L 27/108 | (2006.01) | |
| H01L 27/12 | (2006.01) | |
| H01L 29/221 | (2006.01) | |
| G11C 5/14 | (2006.01) | |

(52) U.S. Cl.
CPC ........ *H01L 27/108* (2013.01); *H01L 27/1225* (2013.01); *H01L 29/221* (2013.01)

(58) Field of Classification Search
CPC ............... H01L 27/1225; H01L 29/221; H01L 29/78648; H01L 23/34; H01L 29/7869
See application file for complete search history.

(56) References Cited

U.S. PATENT DOCUMENTS

| | | | |
|---|---|---|---|
| 2012/0051118 A1 | 3/2012 | Yamazaki et al. | |
| 2012/0161139 A1 | 6/2012 | Endo et al. | |
| 2013/0148411 A1 | 6/2013 | Atsumi et al. | |
| 2017/0179294 A1* | 6/2017 | Kato | H01L 29/7869 |
| 2017/0186749 A1 | 6/2017 | Ohshima et al. | |

FOREIGN PATENT DOCUMENTS

| | | |
|---|---|---|
| JP | 2013-168631 A | 8/2013 |
| JP | 2017-121046 A | 7/2017 |
| KR | 2017-0077792 A | 7/2017 |

OTHER PUBLICATIONS

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
International Search Report (Application No. PCT/IB2018/059488) dated Feb. 26, 2019.
Written Opinion (Application No. PCT/IB2018/059488) dated Feb. 26, 2019.

\* cited by examiner

11a

11b

FIG. 6A
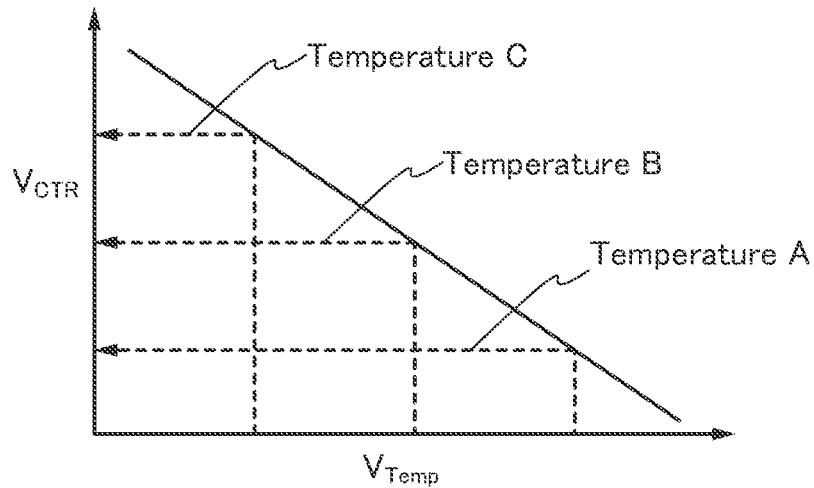
FIG. 6B
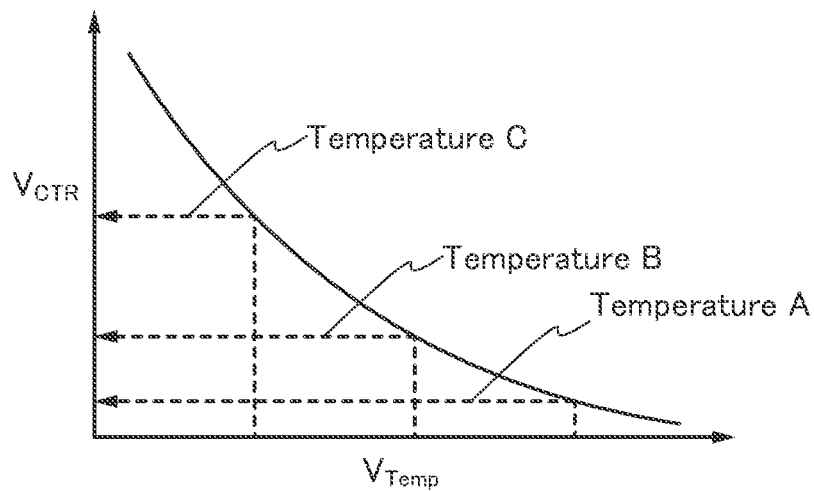
FIG. 6C
| $V_{Temp}$ | $V_{CTR}$ |
|---|---|
| $V_{Temp1}$ | $V_{CTR1}$ |
| $V_{Temp2}$ | $V_{CTR2}$ |
| $V_{Temp3}$ | $V_{CTR3}$ |
| ⋮ | ⋮ |
| $V_{Tempn}$ | $V_{CTRn}$ |

FIG. 20A
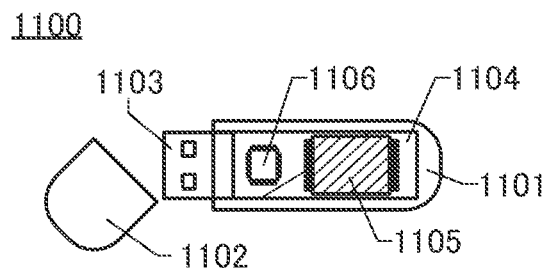
FIG. 20B    FIG. 20C
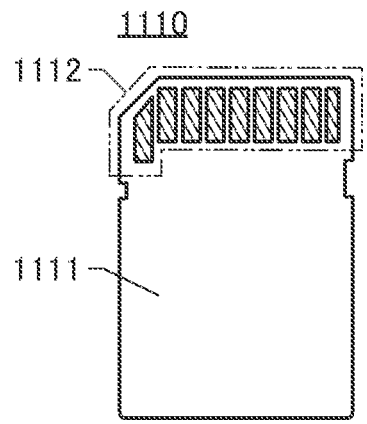 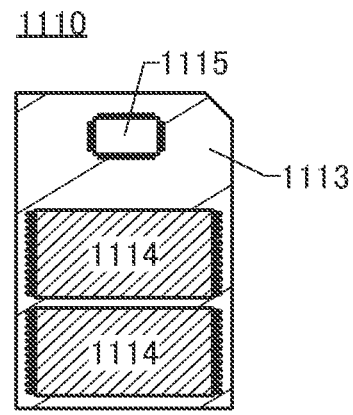
FIG. 20D    FIG. 20E
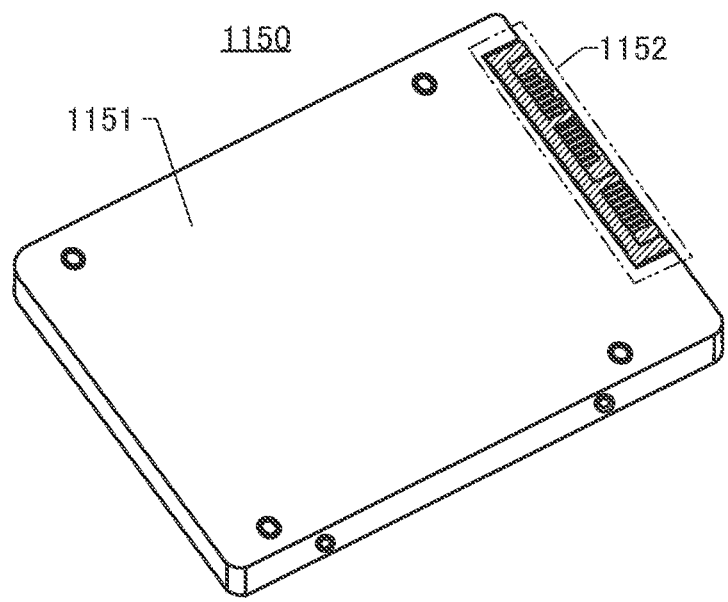 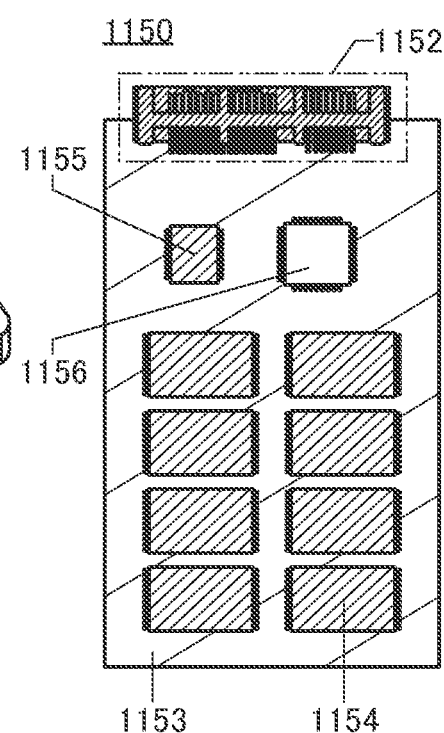

SEMICONDUCTOR DEVICE

CROSS REFERENCE TO RELATED APPLICATIONS

This application is a U.S. National Phase Application under 35 U.S.C. § 371 of International Application PCT/IB2018/059488, filed on Nov. 30, 2018, which is incorporated by reference and claims the benefit of foreign priority applications filed in Japan on Dec. 8, 2017, as application Ser. No. 2017-236145, on Feb. 20, 2018, as application Ser. No. 2018-027585, on Jul. 11, 2018, as application Ser. No. 2018-131207, and on Sep. 7, 2018, as application Ser. No. 2018-167559.

TECHNICAL FIELD

One embodiment of the present invention relates to a semiconductor device.

Furthermore, one embodiment of the present invention relates to an object, a method, or a manufacturing method. Alternatively, one embodiment of the present invention relates to a process, a machine, manufacture, or a composition of matter. One embodiment of the present invention relates to a driving method thereof or a manufacturing method thereof In this specification and the like, a semiconductor device generally means a device that can function by utilizing semiconductor characteristics. A memory device, a display device, an electro-optical device, a power storage device, a semiconductor circuit, and an electronic device include a semiconductor device in some cases.

BACKGROUND ART

A silicon-based semiconductor material is widely known as a semiconductor thin film that can be used in a transistor, and as another material, an oxide semiconductor (OS) has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively researched.

From the researches on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). Non-Patent Document 1 and Non-Patent Document 2 also disclose a technique for fabricating a transistor using an oxide semiconductor having a CAAC structure. Moreover, Non-Patent Document 4 and Non-Patent Document 5 show that a fine crystal is included even in an oxide semiconductor which has lower crystallinity than the CAAC structure or the nc structure.

A transistor using IGZO for an active layer has an extremely low off-state current (see Non-Patent Document 6), and LSI and a display utilizing the feature have been reported (see Non-Patent Document 7 and Non-Patent Document 8).

A variety of semiconductor devices utilizing a transistor including an oxide semiconductor in its channel formation region (hereinafter also referred to as an "OS transistor") have been proposed.

Patent Document 1 discloses an example in which an OS transistor is used in a DRAM (Dynamic Random Access Memory). The OS transistor has an extremely low leakage current in an off state (off-state current), and thus enables fabrication of a low-power-consumption DRAM having long refresh intervals.

Patent Document 2 discloses a nonvolatile memory using an OS transistor. Unlike a flash memory, these nonvolatile memories have unlimited rewrite cycles, can easily operate at high speed, and have low power consumption.

In such memories using OS transistors, an increase in the threshold voltage of the OS transistors can reduce the off-state current and thus can improve data retention characteristics of the memories. Patent Document 2 discloses an example in which an OS transistor has a second gate to control the threshold voltage of the OS transistor so that the off-state current is lowered.

For long-term data retention of the memory, a constant negative potential needs to be continuously applied to the second gate of the OS transistor. Patent Document 2 and Patent Document 3 each disclose a structure example of a circuit for driving a second gate of an OS transistor.

REFERENCES

Patent Documents

[Patent Document 1] Japanese Published Patent Application No. 2013-168631
[Patent Document 2] Japanese Published Patent Application No. 2012-069932
[Patent Document 3] Japanese Published Patent Application No. 2012-146965

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

One object of one embodiment of the present invention is to provide a semiconductor device with a high on-state current. Another object of one embodiment of the present invention is to provide a semiconductor device with high operating speed. Another object is to provide a semiconductor device capable of being used in a wide temperature range. Another object of one embodiment of the present invention is to provide a semiconductor device capable of retaining data for a long time. Another object of one embodiment of the present invention is to provide a semiconductor device with low power consumption. An object of one embodiment of the present invention is to provide a novel semiconductor device.

Note that the description of a plurality of objects does not preclude the existence of each object. One embodiment of the present invention does not necessarily achieve all these objects. Objects other than those listed above will be apparent from the description of the specification, the drawings, the claims, and the like, and such objects could be objects of one embodiment of the present invention.

Means for Solving the Problems

One embodiment of the present invention is a semiconductor device including a transistor and a first circuit. The transistor includes a first gate and a second gate, and the first gate and the second gate have a region where they overlap each other with a semiconductor layer therebetween. The first circuit includes a temperature sensor and a voltage control circuit. The temperature sensor has a function of obtaining temperature information and outputting the temperature information to the voltage control circuit. The voltage control circuit has a function of converting the temperature information into a control voltage, and the first circuit applies the control voltage to the second gate.

In the above semiconductor device, the voltage control circuit preferably converts the temperature information into the control voltage according to a conversion formula.

In the above semiconductor device, the voltage control circuit preferably includes a microcomputer or an amplifier.

In the above semiconductor device, the semiconductor layer preferably includes a metal oxide.

It is preferred that the above semiconductor device further include a second circuit and the second circuit apply a negative voltage to the second gate.

In the above semiconductor device, the second circuit can hold the negative voltage.

In the above semiconductor device, the second circuit preferably includes a transistor including a metal oxide in its channel formation region.

The above semiconductor device preferably has a function of applying a positive voltage or a negative voltage to the first gate, and a function of applying a negative voltage to the second gate.

Effect of the Invention

According to one embodiment of the present invention, a semiconductor device with a high on-state current can be provided. According to one embodiment of the present invention, a semiconductor device with high operating speed can be provided. According to one embodiment of the present invention, a semiconductor device capable of being used in a wide temperature range can be provided. According to one embodiment of the present invention, a semiconductor device capable of retaining data for a long time can be provided. According to one embodiment of the present invention, a semiconductor device with low power consumption can be provided. According to one embodiment of the present invention, a novel semiconductor device can be provided.

Note that the description of these effects does not preclude the existence of other effects. One embodiment of the present invention does not have to have all of these effects. Effects other than these will be apparent from and can be derived from the description of the specification, the drawings, the claims, and the like.

BRIEF DESCRIPTION OF THE DRAWINGS

[FIGS. 6A to 6C] Diagrams illustrating temperature correction.

[FIGS. 20A to 20E] Diagrams illustrating structure examples of memory devices.

MODE FOR CARRYING OUT THE INVENTION

Figure 1:
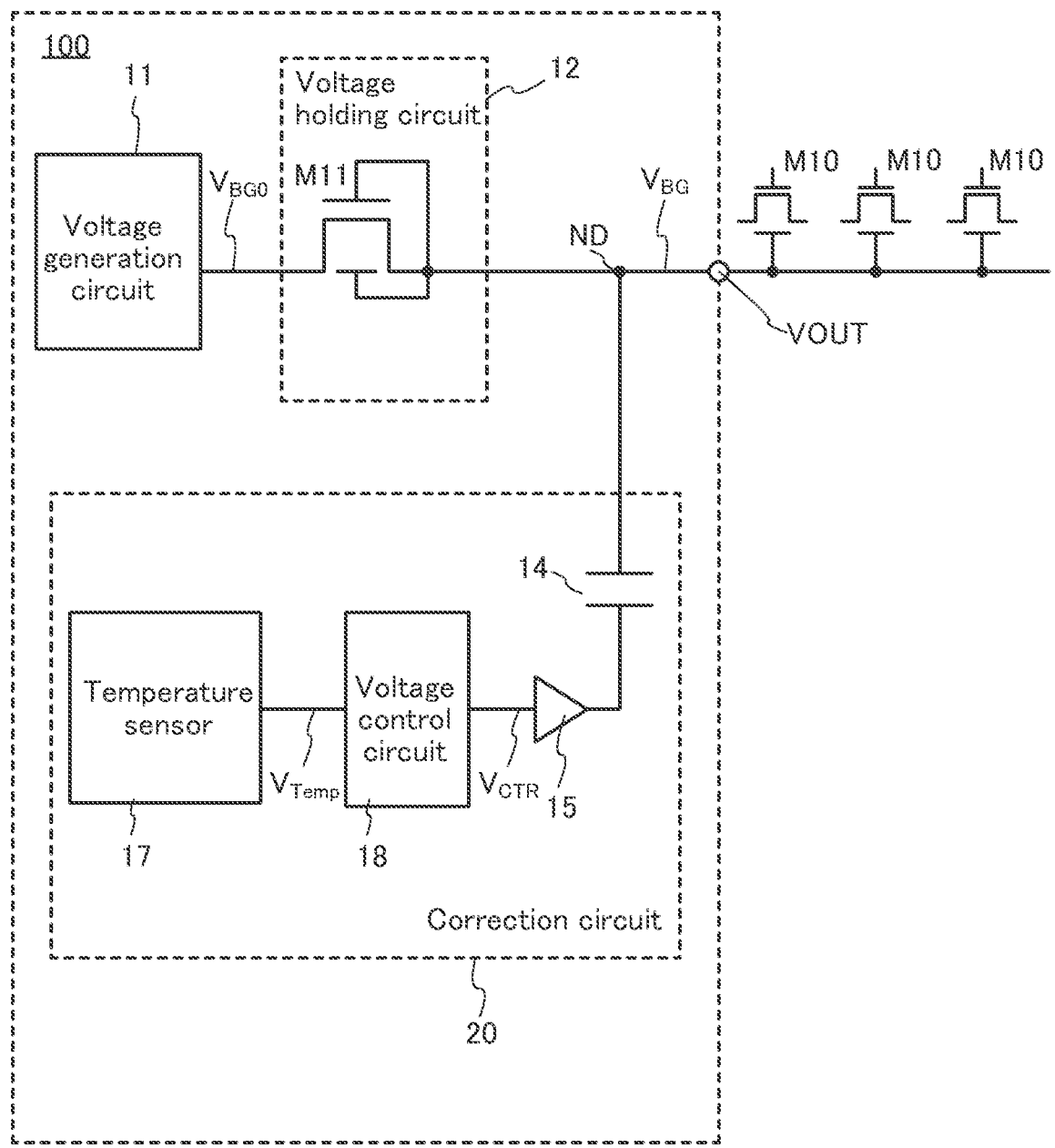
[FIG. 1] A block diagram illustrating a structure example of a semiconductor device.

Embodiments of the present invention will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be limited to description of the following embodiments and examples.

Note that in structures of the invention described below, the same portions or portions having similar functions are denoted by the same reference numerals in different drawings, and the description thereof is not repeated. Furthermore, the same hatch pattern is used for portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification, a high power supply voltage and a low power supply voltage are sometimes referred to as an H level (or VDD) and an L level (or GND), respectively.

Note that voltage refers to a potential difference between two points, and potential refers to electrostatic energy (electric potential energy) of a unit charge at a given point in an electrostatic field. Note that in general, a potential difference between a potential of one point and a reference potential (e.g., a ground potential) is simply called potential or voltage, and potential and voltage are used as synonymous words in many cases. Therefore, in this specification and the like, potential is interchangeable with voltage and voltage is interchangeable with potential unless explicitly stated.

In this specification, the embodiments and the examples described below can be combined as appropriate. In the case where a plurality of structure examples are described in one embodiment, the structure examples can be combined with each other as appropriate.

In this specification and the like, a metal oxide is an oxide of metal in a broad sense. Metal oxides are classified into an oxide insulator, an oxide conductor (including a transparent oxide conductor), an oxide semiconductor, and the like. For example, in the case where a metal oxide is used in a semiconductor layer of a transistor, the metal oxide is referred to as an oxide semiconductor in some cases. In the case where an OS transistor is mentioned, the OS transistor can also be referred to as a transistor including a metal oxide or an oxide semiconductor. In this specification and the like, a metal oxide containing nitrogen is also referred to as a metal oxide in some cases.

Embodiment 1

A semiconductor device of one embodiment of the present invention includes a temperature sensor and a voltage correction circuit. The semiconductor device is electrically connected to a transistor included in a memory device or the like and has a function of applying a voltage corresponding to the temperature to a back gate of the transistor. The back gate voltage is controlled so that the cutoff current of the transistor is substantially the same regardless of the temperature, whereby the memory device or the like can have a high operating frequency in a wide temperature range.

<Semiconductor Device 100>

FIG. 1 is a circuit diagram illustrating a structure example of a semiconductor device 100 of one embodiment of the present invention. The semiconductor device 100 includes a voltage generation circuit 11, a voltage holding circuit 12, and a correction circuit 20. The voltage generation circuit 11 is electrically connected to the voltage holding circuit 12, and the voltage holding circuit 12 is electrically connected to the correction circuit 20. Note that a node of the correction circuit 20 and the voltage holding circuit 12 is referred to as a node ND. The voltage holding circuit 12 and the correction circuit 20 are electrically connected to an output terminal VOUT through the node ND.

The semiconductor device 100 is electrically connected to second gates of a plurality of transistors M10 through the output terminal VOUT. Each of the transistors M10 includes a first gate (also referred to as a "front gate" or simply as a "gate") and the second gate (also referred to as the "back gate"). These second gates have a function of controlling a threshold voltage ($V_{th0}$) of each transistor M10. In the transistor M10, the first gate and the second gate preferably have a region where they overlap each other with a semiconductor layer therebetween. The semiconductor device 100 is electrically connected to the second gate of the transistor M10 through the output terminal VOUT.

The transistor M10 represents a transistor used in a variety of circuits included in a memory device, a pixel device, an arithmetic device, and the like. For example, the transistor M10 represents a transistor included in a memory device of NOR type, NAND type, or the like. As another example, the transistor M10 represents a transistor included in a display device such as a liquid crystal display device or an EL display device. As another example, the transistor M10 represents a transistor included in a CPU (Central Processing Unit), a GPU (Graphic Processing Unit), an FPGA (Field Programmable Gate Array), or the like. Without limitation to three transistors M10 illustrated in FIG. 1, the semiconductor device 100 may be connected to more transistors M10. Note that in the following description, the transistor M10 is described as an n-channel transistor.

As compared with a transistor using silicon in a semiconductor layer where a channel is formed (also referred to as a "Si transistor"), the off-state current is less likely to increase in an OS transistor even in the operation at high temperatures. In addition, in the OS transistor, Vth shifts in the negative direction with the increase in operating temperature, and the on-state current increases. On the other hand, in the Si transistor, the off-state current increases with the increase in temperature. Moreover, in the Si transistor, Vth shifts in the positive direction with the increase in temperature, and the on-state current decreases. Thus, the use of the OS transistor as the transistor M10 can reduce power consumption of the entire semiconductor device including the transistor M10 even in the operation at high temperatures.

The semiconductor device 100 has a function of writing a voltage $V_{BG}$ to the second gate of the transistor M10 and holding the voltage $V_{BG}$. For example, in the case where a negative potential is supplied as the voltage $V_{BG}$, $V_{th0}$ of the transistor M10 can be shifted to the positive side while the negative potential of the second gate is held. Keeping $V_{th0}$ high can prevent the transistor M10 from being normally-on, and power consumption of the entire semiconductor device including the transistor M10 can be reduced. For example, in the case where the transistor M10 is used as a selection transistor of a memory cell, charge in a capacitor functioning as a storage can be held for a long time.

[Voltage Generation Circuit 11]

Figure 2A:
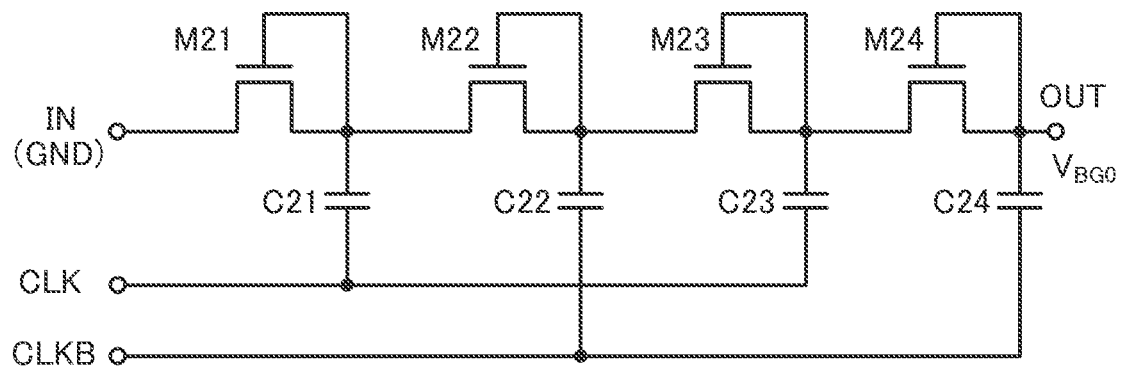
[FIGS. 2A and 2B] Circuit diagrams each illustrating a configuration example of a voltage generation circuit.
Figure 2B:
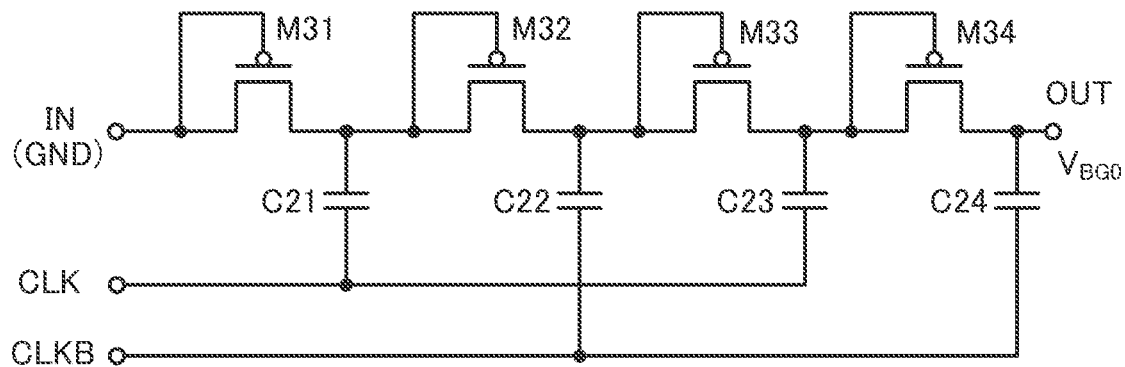

FIG. 2(A) and FIG. 2(B) illustrate circuit configuration examples of the voltage generation circuit 11. These circuit diagrams are step-down charge pumps; GND is input to an input terminal IN, and $V_{BG0}$ is output from an output terminal OUT. Here, as an example, the number of stages of fundamental circuits in the charge pump circuit is four; however, it is not limited thereto, and the charge pump circuit may be configured with a given number of stages.

A voltage generation circuit 11a illustrated in FIG. 2(A) includes a transistor M21 to a transistor M24 and a capacitor C21 to a capacitor C24. The transistor M21 to the transistor M24 are hereinafter described as n-channel transistors.

The transistor M21 to the transistor M24 are connected in series between the input terminal IN and the output terminal OUT, and a gate and a first electrode of each transistor are connected so that the transistor functions as a diode. The capacitor C21 to the capacitor C24 are respectively connected to the gates of the transistor M21 to the transistor M24.

CLK is input to first electrodes of the capacitor C21 and the capacitor C23 in the odd-numbered stages, and CLKB is input to first electrodes of the capacitor C22 and the capacitor C24 in the even-numbered stages. CLKB is an inverted clock signal obtained by phase inversion of CLK.

The voltage generation circuit 11 a has a function of stepping down GND input to the input terminal IN and generating $V_{BG0}$. The voltage generation circuit 11a can generate a negative potential only by the supply of CLK and CLKB.

The above-described transistor M21 to transistor M24 may be OS transistors. The use of OS transistors is preferable because the reverse current of the diode-connected transistor M21 to transistor M24 can be reduced.

A voltage generation circuit 11b illustrated in FIG. 2(B) is configured with a transistor M31 to a transistor M34 that are p-channel transistors. The description of the voltage generation circuit 11a is referred to for the other components.

[Voltage Holding Circuit 12]

The voltage holding circuit 12 includes a transistor M11 (see FIG. 1). The transistor M11 includes a first gate and a second gate. The first gate and the second gate preferably have a region where they overlap each other with a semiconductor layer therebetween. Note that in the following description, the transistor M11 is described as an n-channel transistor.

A first terminal of the transistor M11 is electrically connected to the voltage generation circuit 11, and a second terminal of the transistor M11 is electrically connected to the node ND. The second terminal of the transistor M11 is electrically connected to the first gate of the transistor M11 and the second gate of the transistor M11. The transistor M11 has a function of a diode.

The voltage holding circuit 12 has a function of applying the voltage $V_{BG0}$, which is generated by the voltage generation circuit 11, as the voltage $V_{BG}$ to the second gate of the transistor M10 and holding the voltage $V_{BG}$. Note that the relation $V_{BG0}=V_{BG}-V_{th1}$ holds, where $V_{th1}$ represents the threshold voltage of the transistor M11.

Figure 3A:
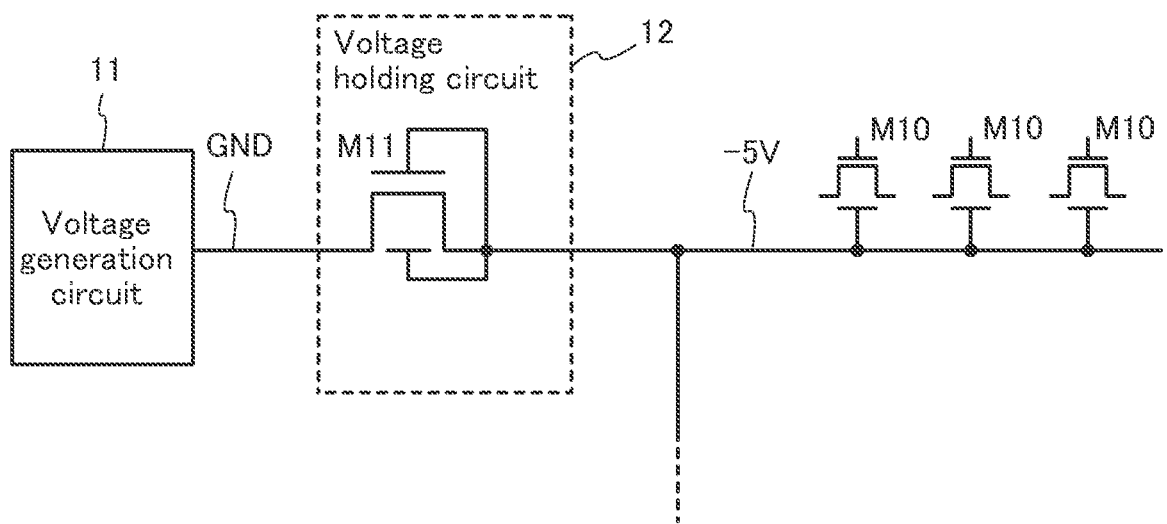
[FIGS. 3A and 3B] Circuit diagrams each illustrating a structure example of a voltage holding circuit.

The transistor M11 has a function of writing a potential to the second gate of the transistor M10 and holding the potential. As an example, FIG. 3(A) illustrates an example in which a negative potential (−5 V) is written to the second gate of the transistor M10. The negative potential written to the second gate of the transistor M10 makes $V_{th0}$ of the transistor M10 shifted in the positive direction. The transistor M11 holds the written negative potential when its first terminal is set to GND, and the transistor M10 can keep normally off.

In FIG. 3(A), $V_G$ of the transistor M11 is 0 V. When a drain current at $V_G=0$ V (hereinafter referred to as a "cutoff current" or "Icut") is sufficiently low, the transistor M11 interrupts the charge flow and the voltage holding circuit 12 can hold the negative potential for a long time.

The channel length of the transistor M11 is preferably longer than the channel length of the transistor M10. For example, in the case where the channel length of the transistor M10 is shorter than 1 μm, the channel length of the transistor M11 is longer than or equal to 1 μm, further preferably longer than or equal to 3 μm, further preferably longer than or equal to 5 μm, further preferably longer than or equal to 10 μm. When the channel length of the transistor M11 is long, the transistor M11 is not affected by a short-channel effect and can keep the cutoff current low. Furthermore, the withstand voltage between the source and the drain of the transistor M11 can be increased. The high withstand voltage between the source and the drain of the transistor M11 is preferable because it can facilitate connection between the transistor M10 and the voltage generation circuit 11 generating a high voltage.

As the transistor M11, an OS transistor or a transistor using a wide-bandgap semiconductor in a channel formation region is preferably used. The cutoff current is low and the withstand voltage between a source and a drain is high in the OS transistor and the transistor using a wide-bandgap semiconductor. Note that in this specification, a wide-bandgap semiconductor is a semiconductor whose bandgap is 2.2 eV or greater. Examples include silicon carbide, gallium nitride, and diamond.

The transistor M11 is required to have a lower cutoff current than the transistor M10. Meanwhile, the transistor M10 is required to have a higher on-state current than the transistor M11. In the case where transistors having different required properties as above are formed over the same substrate, the transistors are formed using different semiconductors. In the transistor M11, a semiconductor whose bandgap is wider than that of the transistor M10 is preferably used in a channel formation region. In the transistor M10, a semiconductor whose electron mobility is higher than that of the transistor M11 is preferably used in a channel formation region.

Note that the second gate of the transistor M11 may be omitted in some cases.

Figure 3B:
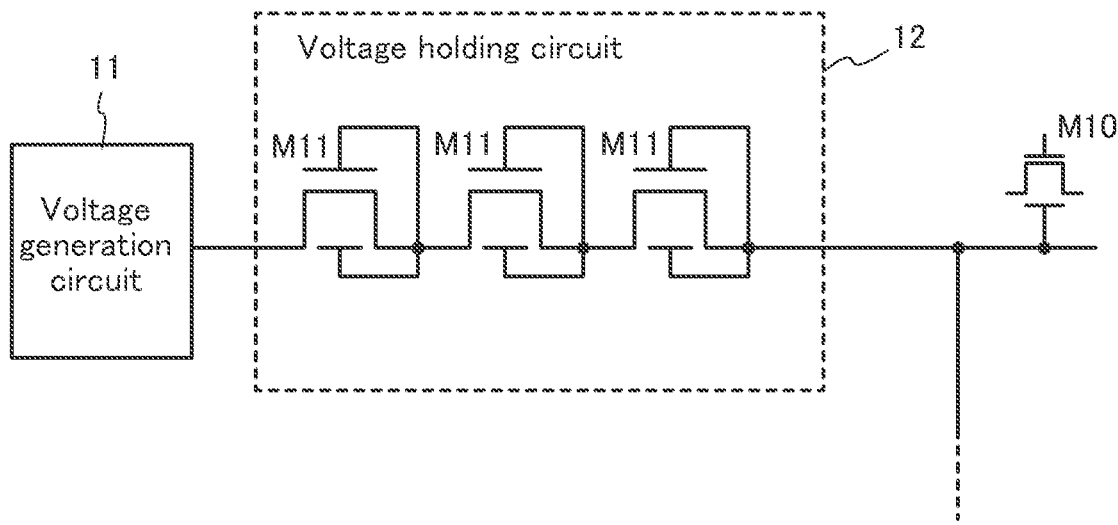

The voltage generation circuit 12 may be configured with a plurality of transistors M11 connected in series (see FIG. 3(B)).

[Correction Circuit 20]

The correction circuit 20 has a function of measuring the temperature and controlling a voltage applied to the second gate of the transistor M10 in accordance with the obtained temperature information. The correction circuit 20 controls a voltage applied to the second gate so that the off-state current of the transistor M10 is substantially the same at varying temperatures.

Figure 4:
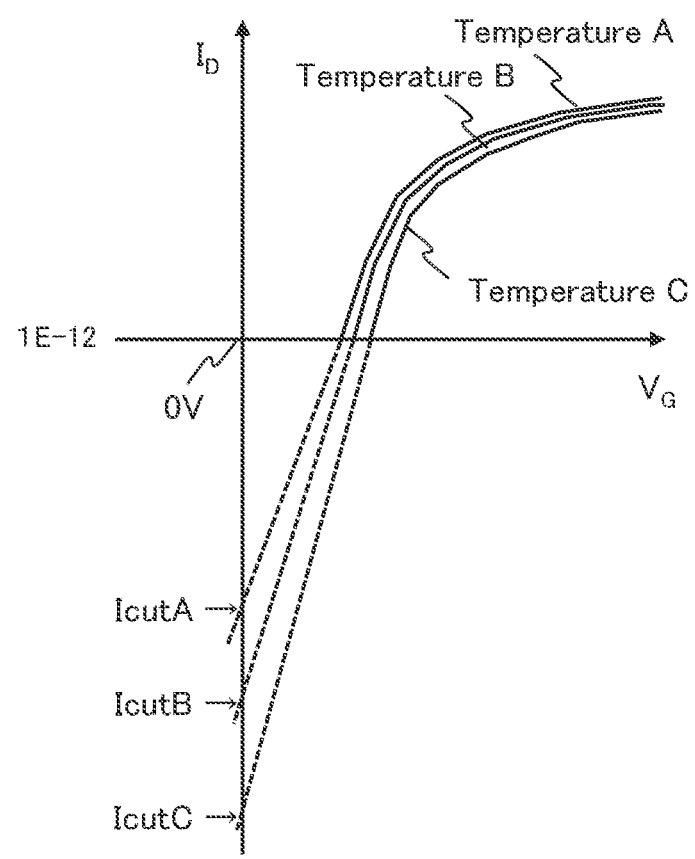
[FIG. 4] A diagram illustrating temperature dependence of $V_G$-$I_D$ characteristics of an OS transistor.

FIG. 4 is a schematic view showing the temperature dependence of $I_D$ (drain current)-$V_G$ (gate voltage) characteristics of an OS transistor. The $I_D$-$V_G$ characteristics show a change in the drain current ($I_D$) with respect to a change in the gate voltage ($V_G$). In FIG. 4, the horizontal axis represents Vg on a linear scale, and the vertical axis represents ID on a logarithmic scale.

In FIG. 4, Temperature A, Temperature B, and Temperature C indicate examples of the $I_D$-$V_G$ characteristics of the OS transistor measured at 85° C., 27° C., and −40° C., respectively. Note that the back gate voltage is the same at each of the temperatures. As the temperature decreases, the threshold voltage of the OS transistor shifts in the positive direction, and the on-state current decreases. Thus, the operating speed of a circuit decreases. Meanwhile, as the temperature increases, the threshold voltage shifts in the negative direction, and the subthreshold swing increases. Thus, the cutoff current increases. In FIG. 4, the cutoff current at Temperature A is represented by IcutA, that at Temperature B by IcutB, and that at Temperature C by IcutC. As shown in FIG. 4, the cutoff current increases as the temperature increases.

In the case where an OS transistor is used as the transistor M10, the threshold voltage ($V_{th0}$) varies depending on the temperature as shown in FIG. 4. $V_{th0}$ shifts in the positive direction as the temperature decreases, and $V_{th0}$ shifts in the negative direction as the temperature increases. This becomes a factor for narrowing a temperature range in which a circuit can operate. Accordingly, the semiconductor device 100 preferably includes the correction circuit 20. The semiconductor device 100 has a function of supplying the transistor M10 with a higher back gate voltage at a lower temperature, for example; hence, $V_{th0}$ of the transistor M10 can be shifted in the negative direction and the on-state current can be increased. Thus, the operating speed of the circuit can be increased.

The correction circuit 20 includes a temperature sensor 17, a voltage control circuit 18, a buffer 15, and a capacitor 14 (see FIG. 1).

The temperature sensor 17 has a function of sensing the temperature of the semiconductor device 100 and outputting temperature information $V_{Temp}$. The temperature information $V_{Temp}$ is analog data and corresponds to a temperature sensed by the temperature sensor 17. The temperature information $V_{Temp}$ can be a voltage or a current.

As the temperature sensor 17, for example, a resistance thermometer such as platinum, nickel, or copper, a thermistor, a thermocouple, an IC temperature sensor, or the like can be used.

The voltage control circuit 18 has a function of controlling a voltage that is applied to the second gate of the transistor M10 in accordance with the temperature information $V_{Temp}$ obtained from the temperature sensor 17. The voltage control circuit 18 includes a microcomputer, a microprocessor, or an amplifier, and converts the temperature information $V_{Temp}$ according to a conversion formula and outputs a control voltage $V_{CTR}$. Note that in this specification and the like, a microcomputer or a microprocessor may be referred to as a microcomputer.

The control voltage $V_{CTR}$ controls the back gate voltage $V_{BG}$ so that the cutoff current of the transistor M10 is substantially the same regardless of the temperature. The above-described conversion formula is a formula for converting the temperature information $V_{Temp}$ into the control voltage $V_{CTR}$ corresponding to the temperature. The cutoff current of the transistor M10 is made substantially the same by using different back gate voltages $V_{BG}$ depending on the temperature, whereby a circuit electrically connected to the output terminal VOUT can have a high operating frequency in a wide temperature range.

Figure 5:
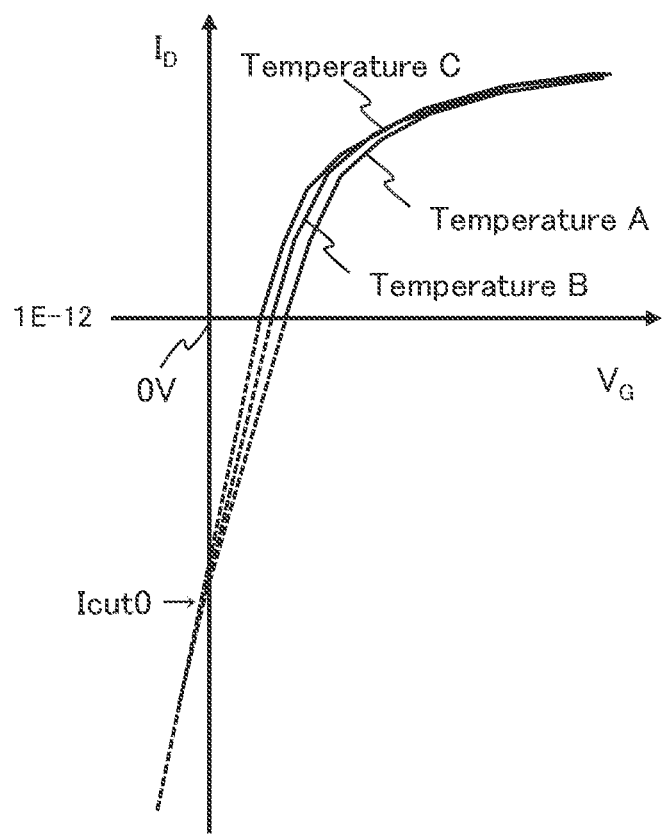
[FIG. 5] A diagram illustrating temperature dependence of $V_G$-$I_D$ characteristics of an OS transistor.

FIG. 5 shows $I_D$-$V_G$ characteristics in the case where the back gate voltage $V_{BG}$ is controlled so that the cutoff currents of the transistor M10 are substantially the same. FIG. 5 illustrates an example in which the back gate voltage $V_{BG}$ is adjusted so that the cutoff current at each of Temperature A, Temperature B, and Temperature C becomes Icut0. As Icut0, for example, a cutoff current value required for a transistor by the specifications of the semiconductor device may be used.

For example, the highest cutoff current value in the temperature range of the specifications may be used as Icut0. In the examples illustrated in FIG. 4 and FIG. 5, IcutA at Temperature A, at which the cutoff current is the highest, can be used as Icut0. To make the cutoff current at Temperature B to be Icut0, a higher control voltage $V_{CTR}$ than that at Temperature A is output so that the back gate voltage $V_{BG}$ is higher than that at Temperature A. To make the cutoff current at Temperature C to be Icut0, a higher control voltage $V_{CTR}$ than that at Temperature B is output so that the back gate voltage $V_{BG}$ is higher than that at Temperature B.

FIG. 6(A), FIG. 6(B), and FIG. 6(C) show examples of conversion of the temperature information $V_{Temp}$ into the control voltage $V_{CTR}$. As illustrated in FIG. 6(A), the temperature information $V_{Temp}$ and the control voltage $V_{CTR}$ can have a linear relation. As illustrated in FIG. 6(B), the temperature information $V_{Temp}$ and the control voltage $V_{CTR}$ may have a non-linear relation. The use of the conversion formula of the temperature information $V_{Temp}$ and the control voltage $V_{CTR}$ as illustrated in FIG. 6(A) and FIG. 6(B) enables fine correction of a temperature difference. Note that FIG. 6(A) and FIG. 6(B) show examples in which the temperature information $V_{Temp}$ becomes a higher value as the temperature increases. In addition, conversion may be performed using a table of the temperature information $V_{Temp}$ and the control voltage $V_{CTR}$ as illustrated in FIG. 6(C). For example, control voltages $V_{CTR1}$ to $V_{CTRn}$ may be output in response to respective temperature information $V_{Temp1}$ to $V_{Tempn}$ (n is an integer of 2 or more).

The conversion formula illustrated in FIG. 6(A) or FIG. 6(B) or the table illustrated in FIG. 6(C) is created in advance from the characteristics of a transistor having the same structure as or a similar structure to the transistor M10, and the conversion formula or the table is held in the voltage control circuit 18. With the use of the conversion formula or the table held in the voltage control circuit 18, the voltage control circuit 18 can output the control voltage $V_{CTR}$ corresponding to the temperature information $V_{Temp}$.

The control voltage $V_{CTR}$ output from the voltage control circuit 18 is supplied to an input of the buffer 15. One electrode of the capacitor 14 is electrically connected to an output of the buffer 15, and the other electrode is electrically connected to the node ND. Note that a plurality of buffers 15 may be provided as necessary, or the buffer 15 may be omitted in some cases.

A voltage applied from the voltage control circuit 18 to the node ND is determined by the ratio of the capacitance of the capacitor 14 to the parasitic capacitance generated at the node ND. It is preferred that the capacitance of the capacitor 14 be sufficiently larger than the parasitic capacitance. Specifically, the capacitance of the capacitor 14 is preferably 5 times or more, further preferably 10 times or more the parasitic capacitance. In this manner, a voltage corresponding to the temperature can be supplied from the correction circuit 20 to the node ND. Moreover, the voltage $V_{BG}$ of the output terminal VOUT can be changed in accordance with the temperature.

In the case where the change in electrical characteristics of the transistor M10 due to temperature is not considered, a voltage higher than necessary is applied to the second gate of the transistor M10. When a voltage higher than necessary is applied to the second gate of the transistor M10 for a long time, the electrical characteristics of the transistors M10 deteriorate, which might impair the reliability. According to one embodiment of the present invention, a voltage applied to the second gate of the transistor M10 can be changed depending on the temperature. Consequently, a minimum necessary voltage can be applied to the second gate of the transistor M10. According to one embodiment of the present invention, the reliability of the semiconductor device including the transistor M11 can be increased.

Figure 7:
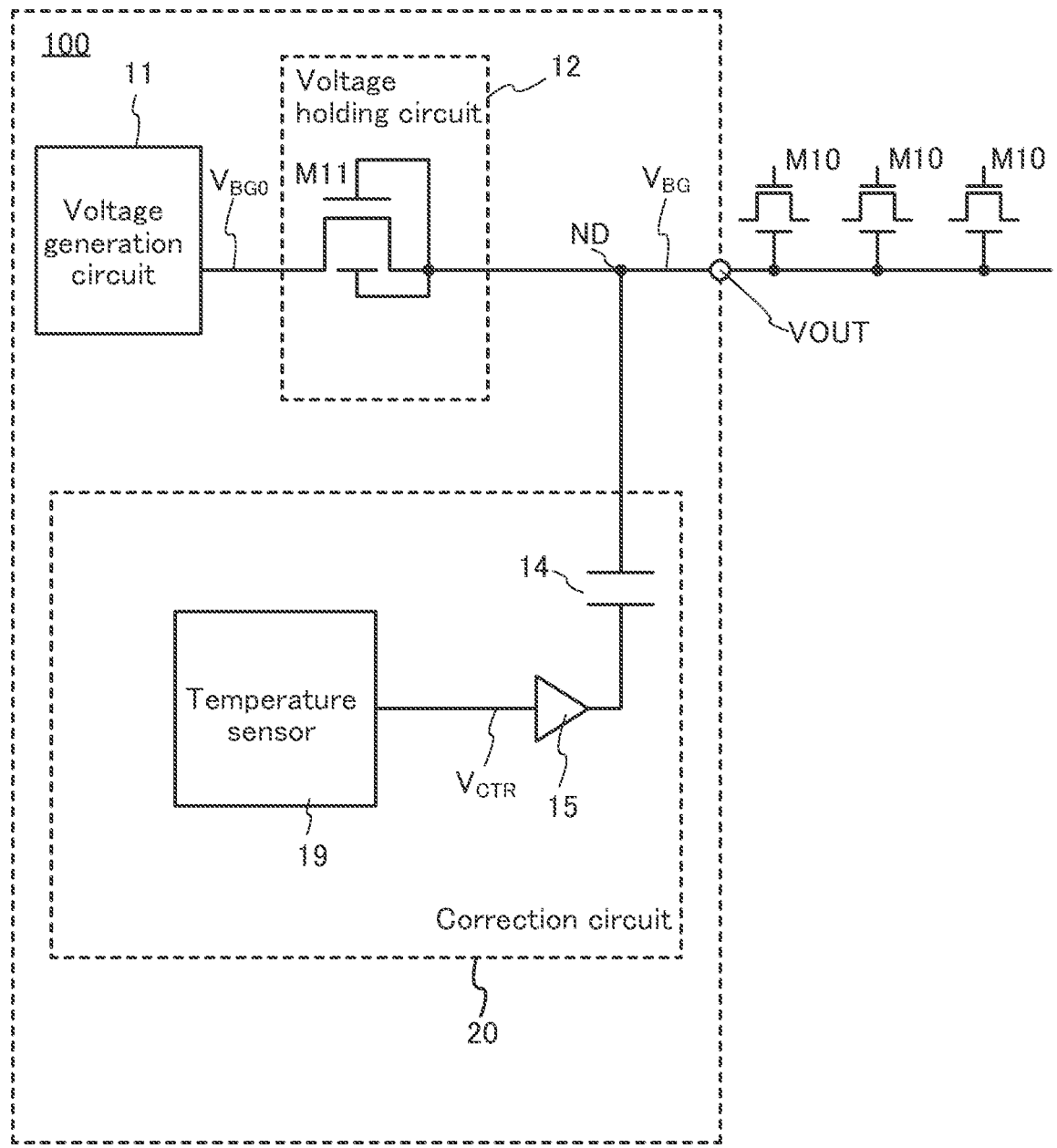
[FIG. 7] A block diagram illustrating a structure example of a semiconductor device.

The temperature sensor 17 may include the voltage control circuit 18. A circuit diagram in that case is illustrated in FIG. 7. In FIG. 7, a temperature sensor 19 includes a power supply control circuit (not illustrated) and can directly output $V_{CTR}$.

As above, with the use of the semiconductor device 100 described in this embodiment, a semiconductor device with a high on-state current can be provided. A semiconductor device with high operating speed can be provided. A semiconductor device capable of retaining data for a long time can be provided. A semiconductor device with low power consumption can be provided.

This embodiment can be implemented in an appropriate combination with the structures described in the other embodiments and the like.

Embodiment 2

Figure 8:
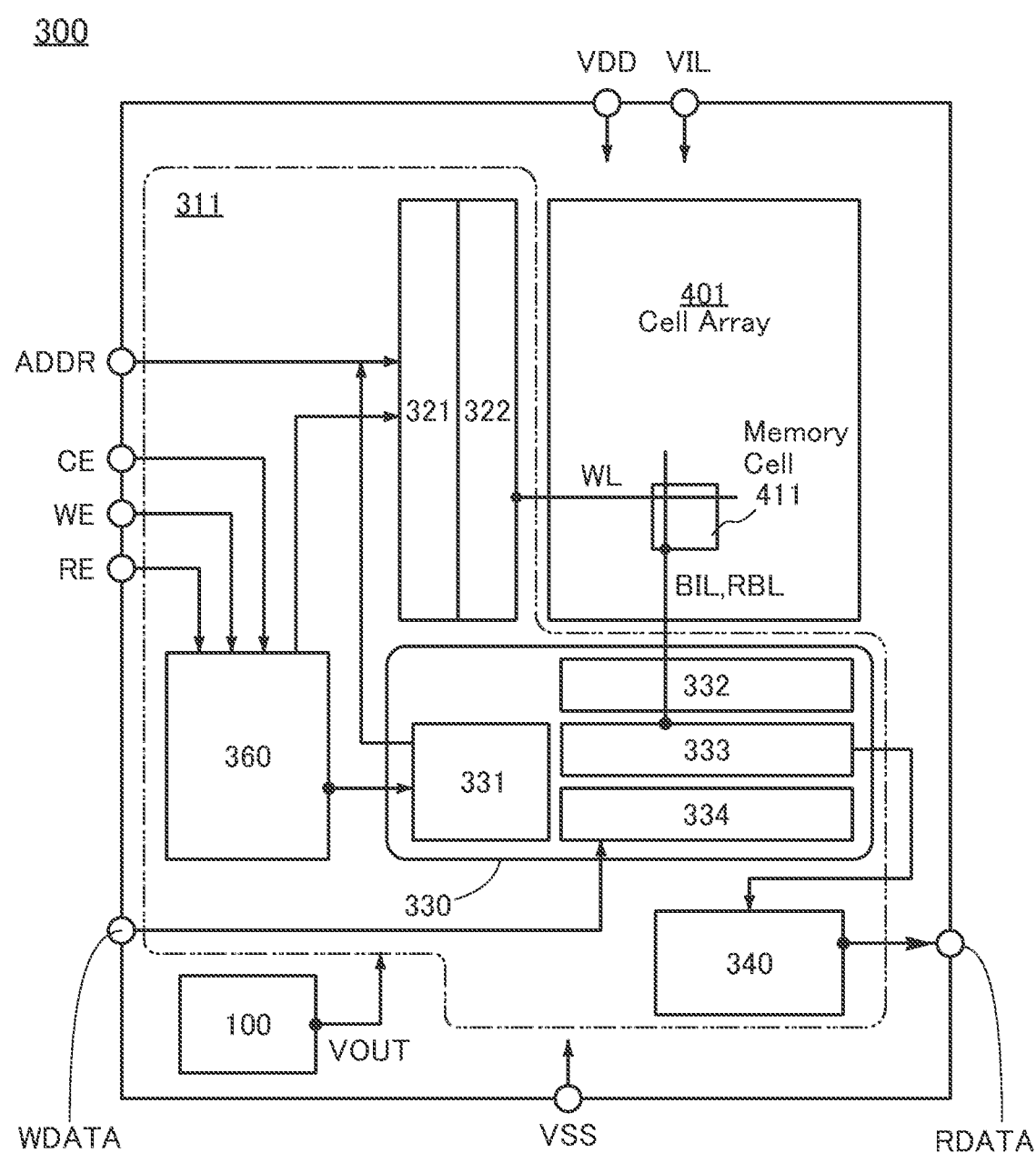
[FIG. 8] A diagram illustrating a structure example of a memory device.

In this embodiment, a memory device using the semiconductor device 100 described in Embodiment 1 will be described.
<Memory Device>
FIG. 8 is a block diagram illustrating a structure example of a memory device. A memory device 300 includes a peripheral circuit 311, a cell array 401, and the semiconductor device 100. The peripheral circuit 311 includes a row decoder 321, a word line driver circuit 322, a bit line driver circuit 330, an output circuit 340, and a control logic circuit 360.

The word line driver circuit 322 has a function of supplying a potential to a wiring WL. The bit line driver circuit 330 includes a column decoder 331, a precharge circuit 332, an amplifier circuit 333, and a write circuit 334. The precharge circuit 332 has a function of precharging a wiring SL (not illustrated) and the like. The amplifier circuit 333 has a function of amplifying a data signal read from a wiring BIL or a wiring RBL. Note that the wiring WL, the wiring SL, the wiring BIL, and the wiring RBL are wirings connected to a memory cell 411 included in the cell array 401 and will be described later in detail. The amplified data signal is output to the outside of the memory device 300 as a digital data signal RDATA through the output circuit 340.

As power supply voltages, a low power supply voltage (VSS), a high power supply voltage (VDD) for the peripheral circuit 311, and a high power supply voltage (VIL) for the cell array 401 are supplied to the memory device 300 from the outside.

Control signals (CE, WE, RE), an address signal ADDR, and a data signal WDATA are input to the memory device 300 from the outside. The address signal ADDR is input to the row decoder 321 and the column decoder 331, and WDATA is input to the write circuit 334.

The control logic circuit 360 processes the signals (CE, WE, RE) input from the outside, and generates control signals for the row decoder 321 and the column decoder 331. CE denotes a chip enable signal, WE denotes a write enable signal, and RE denotes a read enable signal. Signals processed by the control logic circuit 360 are not limited to the above, and other control signals may be input as necessary.

Note that whether each circuit or each signal described above is provided or not can be appropriately determined as needed.

Figure 9:
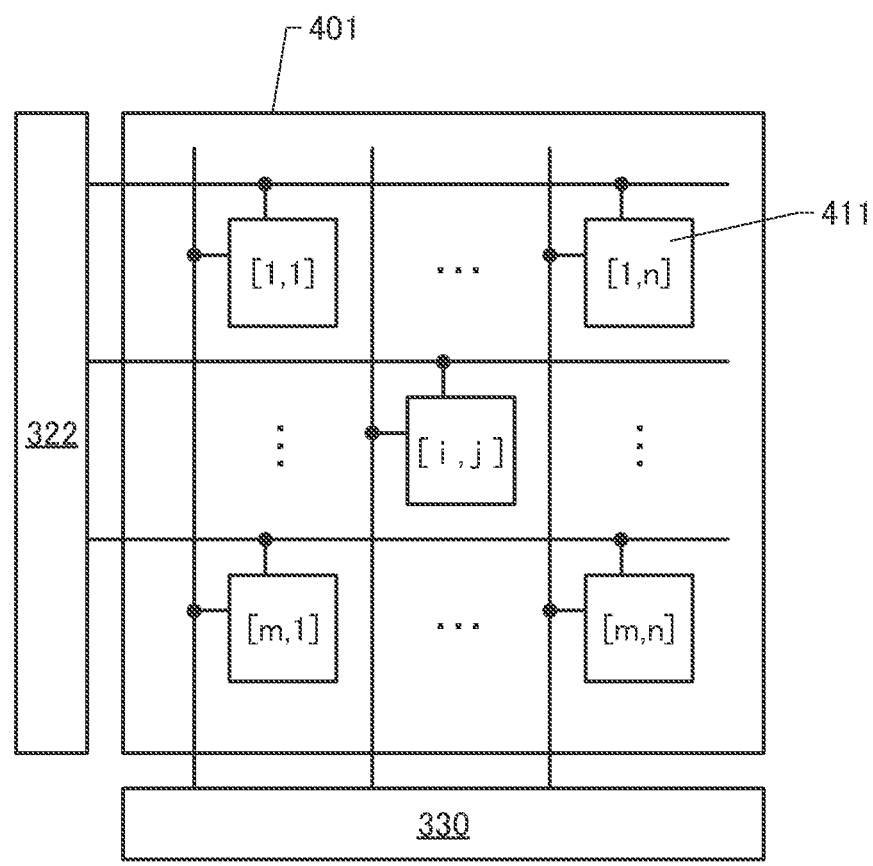
[FIG. 9] A diagram illustrating a structure example of a memory cell array.
Figure 10A:
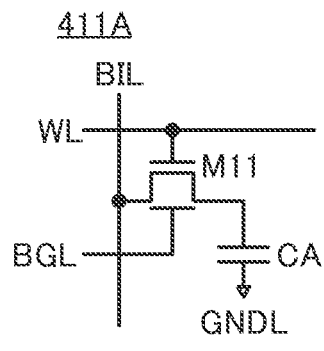
[FIGS. 10A to 10E] Circuit diagrams each illustrating a configuration example of a memory cell.

OS transistors can be used as transistors included in the cell array 401. Moreover, OS transistors can be used as transistors included in the peripheral circuit 311. When the cell array 401 and the peripheral circuit 311 are formed using OS transistors, the cell array 401 and the peripheral circuit 311 can be formed in the same manufacturing process, and the manufacturing cost can be kept low.
[Structure Example of Cell Array]
FIG. 9 illustrates the details of the cell array 401. The cell array 401 includes a total of m×n memory cells 411 of m cells (m is an integer of 1 or more) in one column and n cells (n is an integer of 1 or more) in one row, and the memory cells 411 are arranged in a matrix. FIG. 9 also illustrates addresses of the memory cells 411 and shows memory cells 411 positioned at addresses of [1, 1], [m, 1], [i, j], [1, n], and [m, n] (i is an integer of 1 to m, and j is an integer of 1 to n). The number of wirings connecting the cell array 401 and the word line driver circuit 322 is determined by the configuration of the memory cell 411, the number of memory cells 411 included in one column, or the like. The number of wirings connecting the cell array 401 and the bit line driver circuit 330 is determined by the configuration of the memory cell 411, the number of memory cells 411 included in one row, or the like.
[Configuration Example of Memory Cell]
FIG. 10 illustrates a configuration example of a memory cell 411A to a memory cell 411E that can be used as the above memory cell 411.
[DOSRAM]
FIG. 10(A) illustrates a circuit configuration example of the memory cell 411A of DRAM type. In this specification and the like, a DRAM using an OS transistor is referred to as a DOSRAM (Dynamic Oxide Semiconductor Random Access Memory). The memory cell 411A includes the transistor M11 and a capacitor CA.

The first terminal of the transistor M11 is connected to a first terminal of the capacitor CA, the second terminal of the transistor M11 is connected to the wiring BIL, the gate of the transistor M11 is connected to the wiring WL, and the back gate of the transistor M11 is connected to a wiring BGL. A second terminal of the capacitor CA is connected to a wiring GNDL. The wiring GNDL is a wiring that supplies a low-level potential (sometimes referred to as a reference potential).

The wiring BIL functions as a bit line, and the wiring WL functions as a word line. The wiring BGL functions as a wiring for applying a potential to the back gate of the transistor M11. The wiring BGL is electrically connected to the output terminal VOUT of the semiconductor device 100. By applying a given potential to the wiring BGL, the threshold voltage of the transistor M11 can be increased or decreased.

Data writing and reading are performed in such a manner that a high-level potential is applied to the wiring WL to turn on the transistor M1 so that the wiring BIL is electrically connected to the first terminal of the capacitor CA.

The memory cell included in the memory device 300 is not limited to the memory cell 411A, and the circuit configuration can be changed.

In the case where the transistor M11 is used in the memory cell, an OS transistor is preferably used as the transistor M11. For a semiconductor layer of the OS transistor, an oxide semiconductor containing one of indium, an element M (the element M is aluminum, gallium, yttrium, or tin), and zinc is preferably used. In particular, an oxide semiconductor made of indium, gallium, and zinc is preferably used.

The OS transistor using the oxide semiconductor containing indium, gallium, and zinc has a feature of an extremely low off-state current. The use of the OS transistor as the transistor M11 enables the leakage current of the transistor M11 to be extremely low. That is, written data can be held for a long time by the transistor M11; thus, the frequency of refresh of the memory cell can be reduced. Alternatively, the refresh operation of the memory cell can be omitted. In addition, the extremely low leakage current allows multi-level data or analog data to be held in the memory cell 411A, a memory cell 420, and a memory cell 430.

A DOSRAM can be formed by using the OS transistor as the transistor M11.

[NOSRAM]

Figure 10B:
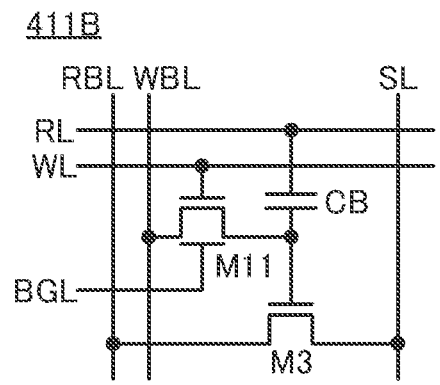

FIG. 10(B) illustrates a circuit configuration example of the memory cell 411B of gain cell type including two transistors and one capacitor (also referred to as "2Tr1C type"). The memory cell 411B includes the transistor M11, a transistor M3, and a capacitor CB.

The first terminal of the transistor M11 is connected to a first terminal of the capacitor CB, the second terminal of the transistor M11 is connected to a wiring WBL, the gate of the transistor M11 is connected to the wiring WL, and the back gate of the transistor M11 is connected to the wiring BGL. A second terminal of the capacitor CB is connected to a wiring RL. A first terminal of the transistor M3 is connected to the wiring RBL, a second terminal of the transistor M3 is connected to the wiring SL, and a gate of the transistor M3 is connected to the first terminal of the capacitor CB.

The wiring WBL functions as a write bit line, the wiring RBL functions as a read bit line, and the wiring WL functions as a word line. The wiring RL functions as a wiring for applying a predetermined potential to the second terminal of the capacitor CB. The reference potential is preferably applied to the wiring RL at the time of data writing and during data holding.

The wiring BGL functions as a wiring for applying a potential to the back gate of the transistor M11. The wiring BGL is electrically connected to the output terminal VOUT of the semiconductor device 100. By applying a given potential to the wiring BGL, the threshold voltage of the transistor M11 can be increased or decreased.

Data writing is performed in such a manner that a high-level potential is applied to the wiring WL to turn on the transistor M11 so that the wiring WBL is electrically connected to the first terminal of the capacitor CB. Specifically, when the transistor M11 is in an on state, a potential corresponding to information to be stored is applied to the wiring WBL, whereby the potential is written to the first terminal of the capacitor CB and the gate of the transistor M3. After that, a low-level potential is applied to the wiring WL to turn off the transistor M11, whereby the potential of the first terminal of the capacitor CB and the potential of the gate of the transistor M3 are held.

Data reading is performed by applying a predetermined potential to the wiring RL and the wiring SL. A current flowing between the source and the drain of the transistor M3 and the potential of the first terminal of the transistor M3 are determined by the potential of the gate of the transistor M3 and the potential of the second terminal of the transistor M3; thus, by reading out the potential of the wiring RBL connected to the first terminal of the transistor M3, the potential held at the first terminal of the capacitor CB (or the gate of the transistor M3) can be read out. In other words, information written into this memory cell can be read out from the potential held at the first terminal of the capacitor CB (or the gate of the transistor M3). Alternatively, existence or absence of information written into this memory cell can be found.

The memory cell included in the memory device 300 is not limited to the memory cell 411B, and the circuit configuration can be changed.

Figure 10C:
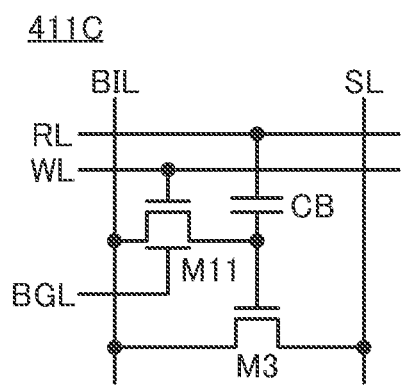

For example, the wiring WBL and the wiring RBL may be combined into one wiring BIL. FIG. 10(C) illustrates a circuit configuration example of this memory cell. In the memory cell 411C, one wiring BIL corresponds to the wiring WBL and the wiring RBL in the memory cell 411B, and the second terminal of the transistor M11 and the first terminal of the transistor M3 are connected to the wiring BIL. In other words, the memory cell 411C operates with one wiring BIL serving as a write bit line and a read bit line.

Note that also in the memory cell 411B and the memory cell 411C, an OS transistor is preferably used as the transistor M11. A memory device using a 2Tr1C-type memory cell using an OS transistor as the transistor M11, such as the memory cell 411B and the memory cell 411C, is referred to as a NOSRAM (Non-volatile Oxide Semiconductor Random Access Memory).

Note that a channel formation region of the transistor M3 preferably contains silicon. In particular, the silicon can be amorphous silicon, polycrystalline silicon, or low temperature polysilicon (LTPS) (hereinafter referred to as a Si transistor). Since a Si transistor has higher field-effect mobility than an OS transistor in some cases, the use of the Si transistor as a reading transistor is suitable.

In the case where an OS transistor is used as the transistor M3, the memory cell can be composed of a single-polarity circuit.

Figure 10D:
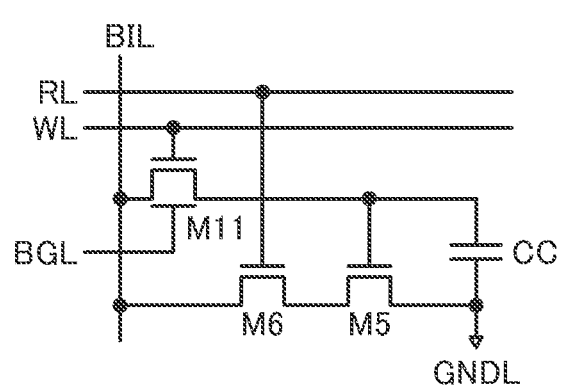

FIG. 10(D) illustrates a circuit configuration example of the memory cell 411D of gain cell type including three transistors and one capacitor (also referred to as "3Tr1C type"). The memory cell 411D includes the transistor M11, a transistor M5, a transistor M6, and a capacitor CC.

The first terminal of the transistor M11 is connected to a first terminal of the capacitor CC, the second terminal of the transistor M11 is connected to the wiring BIL, the gate of the transistor M11 is connected to the wiring WL, and the back gate of the transistor M11 is electrically connected to the wiring BGL. A second terminal of the capacitor CC is electrically connected to a first terminal of the transistor M5 and the wiring GNDL. A second terminal of the transistor M5 is connected to a first terminal of the transistor M6, and a gate of the transistor M5 is connected to the first terminal of the capacitor CC. A second terminal of the transistor M6 is connected to the wiring BIL, and a gate of the transistor M6 is connected to the wiring RL.

The wiring BIL functions as a bit line, the wiring WL functions as a write word line, and the wiring RL functions as a read word line.

The wiring BGL functions as a wiring for applying a potential to the back gate of the transistor M11. The wiring BGL is electrically connected to the output terminal VOUT of the semiconductor device 100. By applying a given potential to the wiring BGL, the threshold voltage of the transistor M11 can be increased or decreased.

Data writing is performed in such a manner that a high-level potential is applied to the wiring WL to turn on the transistor M11 so that the wiring BIL is connected to the first terminal of the capacitor CC. Specifically, when the transistor M11 is in an on state, a potential corresponding to information to be stored is applied to the wiring BIL, whereby the potential is written to the first terminal of the capacitor CC and the gate of the transistor M5. After that, a low-level potential is applied to the wiring WL to turn off the transistor M11, whereby the potential of the first terminal of the capacitor CC and the potential of the gate of the transistor M5 are held.

Data reading is performed in such a manner that after a predetermined potential is precharged to the wiring BIL, the wiring BIL is made in an electrically floating state, and a high-level potential is applied to the wiring RL. Since the wiring RL has the high-level potential, the transistor M6 is turned on, which electrically connects the wiring BIL and the second terminal of the transistor M5. At this time, the potential of the wiring BIL is applied to the second terminal of the transistor M5; the potential of the second terminal of the transistor M5 and the potential of the wiring BIL are changed in accordance with the potential held at the first terminal of the capacitor CC (or the gate of the transistor M5). Here, by reading out the potential of the wiring BIL, the potential held at the first terminal of the capacitor CC (or the gate of the transistor M5) can be read out. In other words, information written into the memory cell can be read out from the potential held at the first terminal of the capacitor CC (or the gate of the transistor M5). Alternatively, existence or absence of information written into this memory cell can be found.

The circuit configuration of the memory cell included in the memory device 300 can be changed as appropriate.

Note that also in the memory cell 411D, an OS transistor is preferably used as the transistor M11. The 3Tr1C-type memory cell 411D using an OS transistor as the transistor M11 is one embodiment of the NOSRAM.

Note that channel formation regions of the transistors M5 and M6 described in this embodiment preferably contain silicon. In particular, the silicon can be amorphous silicon, polycrystalline silicon, or low-temperature polysilicon. Since a Si transistor has higher field-effect mobility than an OS transistor in some cases, the use of the Si transistor as a reading transistor is suitable.

In the case where OS transistors used as the transistors M5 and M6, the memory cell can be composed of a single-polarity circuit.

[oxSRAM]

Figure 10E:
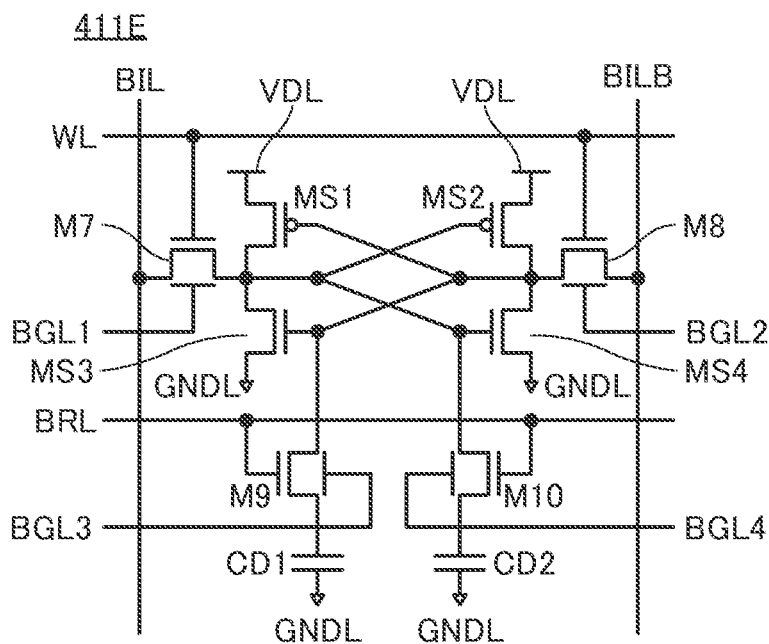

FIG. 10(E) illustrates a circuit configuration example of the memory cell 411E of SRAM (Static Random Access Memory) type using an OS transistor. In this specification and the like, an SRAM using an OS transistor is referred to as an oxSRAM. Note that the memory cell 411E illustrated in FIG. 10(E) is an SRAM-type memory cell capable of backup.

The memory cell 411E includes a transistor M7 to the transistor M10, a transistor MS1 to a transistor MS4, a capacitor CD1, and a capacitor CD2. The transistor M7 and the transistor M8 each correspond to the transistor M11. The transistor M7 to the transistor M10 are each a transistor including a back gate. Note that the transistor MS1 and the transistor MS2 are p-channel transistors, and the transistor MS3 and the transistor MS4 are n-channel transistors.

A first terminal of the transistor M7 is connected to the wiring BIL, and a second terminal of the transistor M7 is connected to a first terminal of the transistor MS1, a first terminal of the transistor MS3, a gate of the transistor MS2, a gate of the transistor MS4, and the first terminal of the transistor M10. A gate of the transistor M7 is connected to the wiring WL, and the back gate of the transistor M7 is connected to a wiring BGL1.

A first terminal of the transistor M8 is connected to a wiring BILB, and a second terminal of the transistor M8 is connected to a first terminal of the transistor MS2, a first terminal of the transistor MS4, a gate of the transistor MS1, a gate of the transistor MS3, and a first terminal of a transistor M9. A gate of the transistor M8 is connected to the wiring WL, and the back gate of the transistor M8 is connected to a wiring BGL2.

A second terminal of the transistor MS1 is electrically connected to a wiring VDL. A second terminal of the transistor MS2 is electrically connected to the wiring VDL. A second terminal of the transistor MS3 is electrically connected to the wiring GNDL. A second terminal of the transistor MS4 is connected to the wiring GNDL.

A second terminal of the transistor M9 is connected to a first terminal of the capacitor CD1, a gate of the transistor M9 is connected to the wiring BRL, and the back gate of the transistor M9 is connected to a wiring BGL3. The second terminal of the transistor M10 is connected to a first terminal of the capacitor CD2, the gate of the transistor M10 is connected to the wiring BRL, and the back gate of the transistor M10 is connected to a wiring BGL4.

A second terminal of the capacitor CD1 is connected to the wiring GNDL, and a second terminal of the capacitor CD2 is connected to the wiring GNDL.

The wiring BIL and the wiring BILB each function as a bit line, the wiring WL functions as a word line, and the wiring BRL is a wiring that controls the on state and the off state of the transistor M9 and the transistor M10.

The wiring BGL1 to the wiring BGL4 function as wirings for applying a potential to the back gates of the transistor M7 to the transistor M10, respectively.

The wiring BGL1 to the wiring BGL4 are electrically connected to the output terminal VOUT of the semiconductor device 100. Note that a plurality of semiconducdevices 100 may be provided in the memory device 300, and the wiring BGL1 to the wiring BGL4 may be electrically connected to different semiconductor devices 100. By applying a given potential to the wiring BGL1 to the wiring BGL4, the threshold voltages of the respective transistors M7 to M10 can be increased or decreased.

The wiring VDL is a wiring supplying a high-level potential, and the wiring GNDL is a wiring supplying a low-level potential.

Data writing is performed by applying a high-level potential to the wiring WL and applying a high-level potential to the wiring BRL. Specifically, when the transistor M10 is in an on state, a potential corresponding to information to be stored is applied to the wiring BIL, whereby the potential is written to the second terminal side of the transistor M10.

In the memory cell 411E, the transistor MS1 to the transistor MS4 form an inverter loop; thus, an inverted signal of a data signal corresponding to the potential is input to the second terminal side of the transistor M8. Since the transistor M8 is in an on state, an inverted signal of the potential applied to the wiring BIL, that is, the signal input to the wiring BIL is output to the wiring BILB. Since the transistor M9 and the transistor M10 are in an on state, the potential of the second terminal of the transistor M7 and the potential of the second terminal of the transistor M8 are respectively held at the first terminal of the capacitor CD2 and the first terminal of the capacitor CD1. Then, a low-level potential is applied to the wiring WL and a low-level potential is applied to the wiring BRL to turn off the transistor M7 to the transistor M10, so that the first terminal of the capacitor CD1 and the first terminal of the capacitor CD2 are held.

Data reading is performed in such a manner that after the wiring BIL and the wiring BILB are precharged at a predetermined potential in advance, a high-level potential is applied to the wiring WL and a high-level potential is applied to the wiring BRL, whereby the potential of the first terminal of the capacitor CD1 is refreshed by the inverter loop in the memory cell 411E and is output to the wiring BILB. Moreover, the potential of the first terminal of the capacitor CD2 is refreshed by the inverter loop in the memory cell 411E and is output to the wiring BIL. Since the potentials of the wiring BIL and the wiring BILB are changed from the precharged potentials to the potential of the first terminal of the capacitor CD2 and the potential of the first terminal of the capacitor CD1, respectively, the potential held in the memory cell can be read out from the potential of the wiring BIL or the wiring BILB.

Note that OS transistors are preferably used as the transistor M7 to the transistor M10. The use of OS transistors as the transistor M7 to the transistor M10 allows data written into the memory cell 411E to be held for a long time, so that the frequency of refresh of the memory cell 411E can be reduced. Alternatively, the refresh operation of the memory cell 411E can be omitted. In addition, extremely low leakage current allows multi-level data or analog data to be held in the memory cell 411E.

Note that channel formation regions of the transistor MS1 to the transistor MS4 preferably contain silicon. In particular, the silicon can be amorphous silicon, polycrystalline silicon, or low-temperature polysilicon. Since a Si transistor has higher field-effect mobility than an OS transistor in some cases, the use of Si transistors as the transistors included in the inverter is suitable.

When an OS transistor is used in the memory cell, information written into the memory cell can be held for a long time even when power supply to the memory cell is stopped. Accordingly, power supply to part or the whole of the peripheral circuit 311 can be stopped in a period during which it is not necessary to write and read information.

One semiconductor device 100 may be electrically connected to all memory cells. Alternatively, a plurality of semiconductor devices 100 may be provided in the memory device 300, and a plurality of memory cells in one column or a plurality of columns may be electrically connected to one semiconductor device 100. Alternatively, a plurality of memory cells in one row or a plurality of rows may be electrically connected to one semiconductor device 100. Alternatively, a plurality of memory cells included in the cell array may be divided into a plurality of blocks, and one semiconductor device 100 may be provided for one block or a plurality of blocks.

The memory cell described in this embodiment can be used for a memory element of a register, a cache, and the like included in a CPU, a GPU, and the like.

This embodiment can be implemented in an appropriate combination with the structures described in the other embodiments and the like.

Embodiment 3

In this embodiment, a cross-sectional structure example of a memory device will be described with reference to drawings.

<Structure Example of Memory Device>

Figure 11:
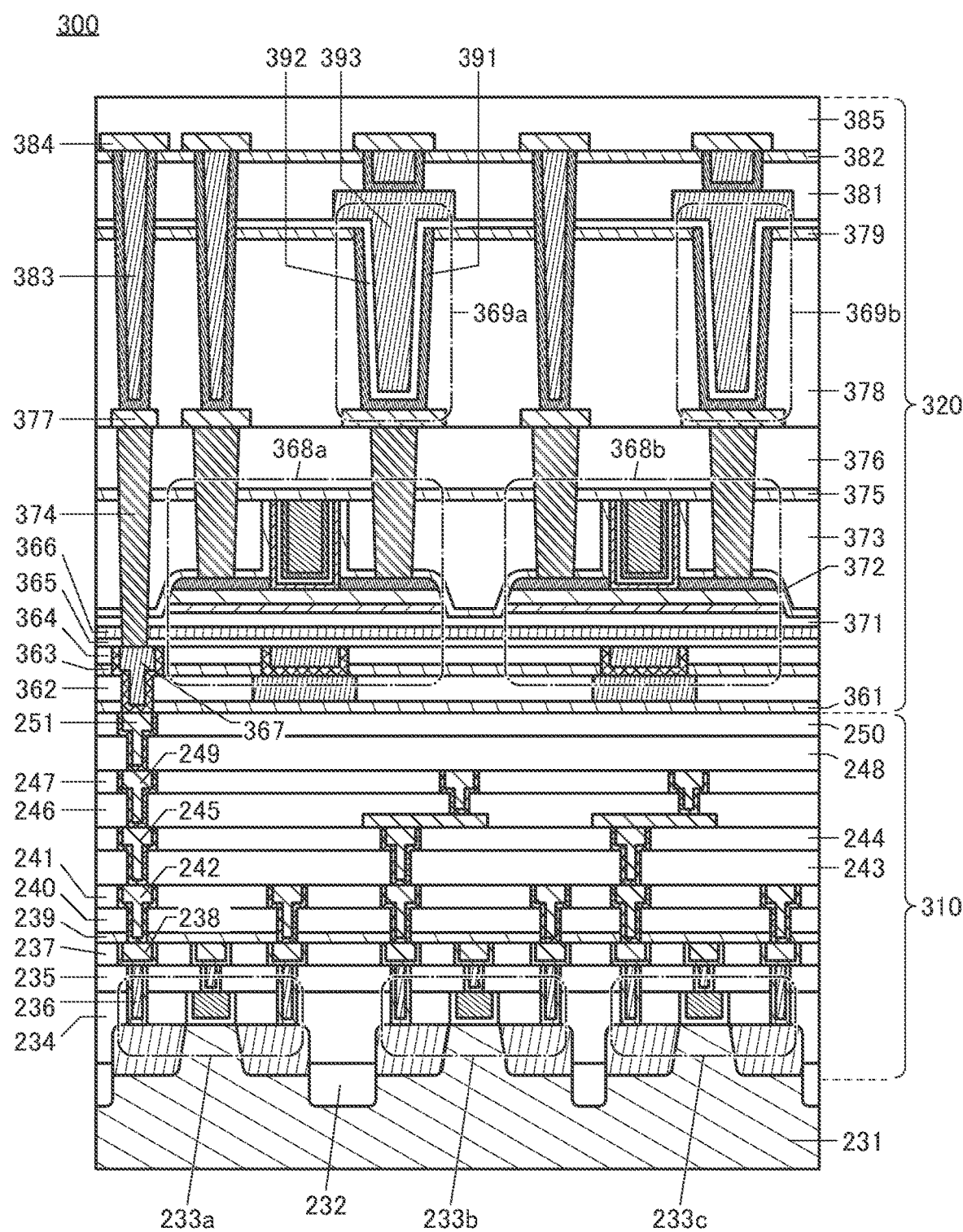
[FIG. 11] A diagram illustrating a structure example of a memory device.

FIG. 11 illustrates a cross section of part of the memory device 300. In the memory device 300 illustrated in FIG. 11, a layer 310 and a layer 320 are stacked over a substrate 231. FIG. 11 illustrates the case where a single crystal semiconductor substrate (e.g., a single crystal silicon substrate) is used as the substrate 231.

[Layer 310]

In FIG. 11, the layer 310 includes a transistor 233a, a transistor 233b, and a transistor 233c on the substrate 231. FIG. 11 illustrates cross sections of the transistor 233a, the transistor 233b, and the transistor 233c in the channel length direction.

Channels of the transistor 233a, the transistor 233b, and the transistor 233c are formed in part of the substrate 231. When an integrated circuit is required to operate at high speed, a single crystal semiconductor substrate is preferably used as the substrate 231.

The transistor 233a, the transistor 233b, and the transistor 233c are electrically isolated from each other by an element isolation layer 232. The element isolation layer can be formed by a LOCOS (Local Oxidation of Silicon) method, a STI (Shallow Trench Isolation) method, or the like.

An insulating layer 234 is provided over the substrate 231; an insulating layer 235 and an insulating layer 237 are provided over the transistor 233a, the transistor 233b, and the transistor 233c; and an electrode 238 is embedded in the insulating layer 237. The electrode 238 is electrically connected to one of a source and a drain of the transistor 233a through a contact plug 236.

An insulating layer 239, an insulating layer 240, and an insulating layer 241 are provided over the electrode 238 and the insulating layer 237, and an electrode 242 is embedded in the insulating layer 239, the insulating layer 240, and the insulating layer 241. The electrode 242 is electrically connected to the electrode 238.

An insulating layer 243 and an insulating layer 244 are provided over the electrode 242 and the insulating layer 241, and an electrode 245 is embedded in the insulating layer 243 and the insulating layer 244. The electrode 245 is electrically connected to the electrode 242.

An insulating layer 246 and an insulating layer 247 are provided over the electrode 245 and the insulating layer 244, and an electrode 249 is embedded in the insulating layer 246 and the insulating layer 247. The electrode 249 is electrically connected to the electrode 245.

An insulating layer 248 and an insulating layer 250 are provided over the electrode 249 and the insulating layer 247, and an electrode 251 is embedded in the insulating layer 248 and the insulating layer 250. The electrode 251 is electrically connected to the electrode 249.

[Layer 320]

The layer 320 is provided over the layer 310. The layer 320 includes a transistor 368a, a transistor 368b, a capacitor 369a, and a capacitor 369b. FIG. 11 illustrates cross sections of the transistor 368a and the transistor 368b in the channel length direction. The transistor 368a and the transistor 368b are each a transistor including a back gate.

The transistor 368a and the transistor 368b each correspond to the transistor M11 described in the above embodiment. Therefore, an oxide semiconductor, which is one kind of metal oxide, is preferably used for semiconductor layers of the transistor 368a and the transistor 368b. That is, OS transistors are preferably used as the transistor 368a and the transistor 368b.

The transistor 368a and the transistor 368b are provided over an insulating layer 361 and an insulating layer 362. An insulating layer 363 and an insulating layer 364 are provided over the insulating layer 362. The back gates of the transistor 368a and the transistor 368b are embedded in the insulating layer 363 and the insulating layer 364. An electrode 367 is embedded in the insulating layer 361 to the insulating layer 364. The electrode 367 is electrically connected to the electrode 251. An insulating layer 365, an insulating layer 366, an insulating layer 371, an insulating layer 372, an insulating layer 373, an insulating layer 375, and an insulating layer 376 are provided over the insulating layer 364.

The insulating layer 375 and the insulating layer 376 are provided over the transistor 368a and the transistor 368b. An electrode 374 is embedded in the insulating layer 365, the insulating layer 366, the insulating layer 371, the insulating layer 372, the insulating layer 373, the insulating layer 375, and the insulating layer 376. The electrode 374 functions as a contact plug.

An electrode 377 is provided over the insulating layer 376, and the electrode 377 is electrically connected to the electrode 367 through the electrode 374.

An insulating layer 378 and an insulating layer 379 are provided over the electrode 377. The capacitor 369a and the capacitor 369b each include an electrode 391 positioned in an opening formed in the insulating layer 378 and the insulating layer 379, an insulating layer 392 over the electrode 391 and the insulating layer 379, and an electrode 393 over the insulating layer 392. In the opening formed in the insulating layer 378 and the insulating layer 379, at least part of the electrode 391, at least part of the insulating layer 392, and at least part of the electrode 393 are positioned.

The electrode 391 functions as a lower electrode of the capacitor, the electrode 393 functions as an upper electrode of the capacitor, and the insulating layer 392 functions as a dielectric of the capacitor. In the capacitor, the upper electrode and the lower electrode face each other with the dielectric positioned therebetween on the side surface as well as the bottom surface of the opening in the insulating layer 378 and the insulating layer 379; thus, the capacitance per unit area can be increased. Accordingly, the deeper the opening is, the larger the capacitance of the capacitor can be. Increasing the capacitance per unit area of the capacitor in this manner can promote miniaturization or higher integration of a semiconductor device.

The shape of the opening formed in the insulating layer 378 and the insulating layer 379 when seen from above may be a quadrangular shape, a polygonal shape other than a quadrangular shape, a polygonal shape with rounded corners, or a circular shape such as an elliptical shape.

An insulating layer 381 and an insulating layer 382 are provided over the insulating layer 392 and the electrode 393. An electrode 383 is embedded in the insulating layer 378, the insulating layer 379, the insulating layer 392, the insulating layer 381, and the insulating layer 382. The electrode 383 is electrically connected to the electrode 377. The electrode 383 can function as a contact plug. An electrode 384 is provided over the insulating layer 382. The electrode 384 is electrically connected to the electrode 383. An insulating layer 385 is provided over the electrode 384.

<Variation Example>

Figure 12:
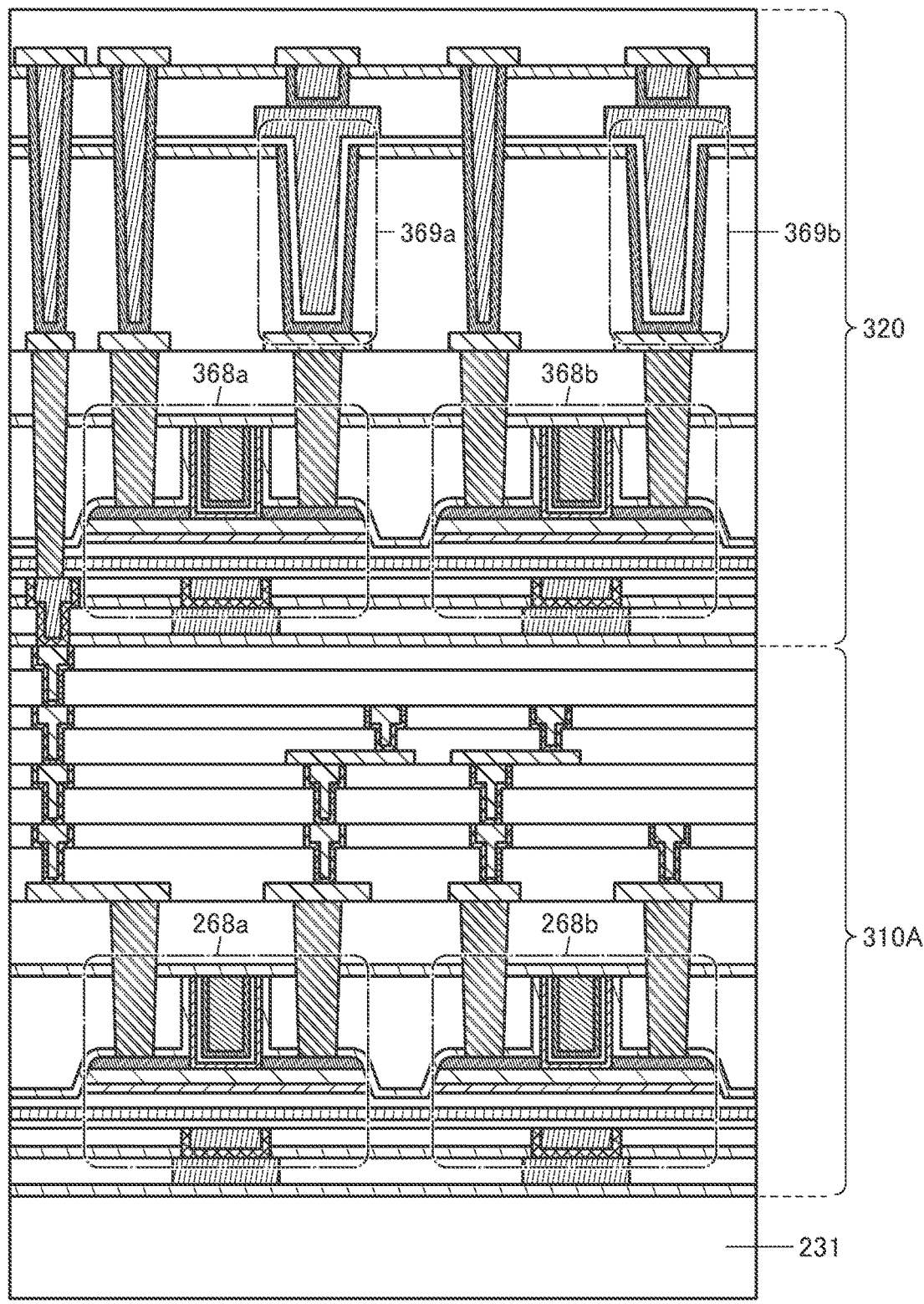
[FIG. 12] A diagram illustrating a structure example of a memory device.

FIG. 12 illustrates a cross section of part of a memory device 300A. The memory device 300A is a variation example of the memory device 300. The memory device 300A includes a layer 310A and the layer 320. An insulating substrate (e.g., a glass substrate) is used as the substrate 231 of the memory device 300A.

The layer 310A includes a transistor 268a, a transistor 268b, the capacitor 369a, and the capacitor 369b. Thin film transistors (e.g., OS transistors) are used as the transistors included in the layer 310A. Using OS transistors as all the transistors included in the layer 310A enables the layer 310A to be a single-polarity integrated circuit. Using OS transistors as all the transistors included in the memory device 300A enables the memory device 300A to be a single-polarity memory device.

<Materials>

[Substrate]

Although there is no particular limitation on a material used for a substrate, it is required to have heat resistance high enough to withstand at least heat treatment performed later. For example, a single crystal semiconductor substrate or a polycrystalline semiconductor substrate using silicon, silicon carbide, or the like as a material or a compound semiconductor substrate using silicon germanium or the like as a material can be used as the substrate. Furthermore, an SOI substrate, a semiconductor substrate on which a semiconductor element such as a strained transistor or a FIN-type transistor is provided, or the like can be used. Alternatively, gallium arsenide, aluminum gallium arsenide, indium gallium arsenide, gallium nitride, indium phosphide, silicon germanium, or the like that can be used for a high electron mobility transistor (HEMT) may be used. That is, the substrate is not limited to a simple supporting substrate and may be a substrate where a device such as another transistor is formed.

Furthermore, a glass substrate of barium borosilicate glass, aluminoborosilicate glass, or the like, a ceramic substrate, a quartz substrate, a sapphire substrate, or the like can be used as the substrate. Note that a flexible substrate may be used as the substrate. In the case where a flexible substrate is used, a transistor, a capacitor, or the like may be directly fabricated over the flexible substrate, or a transistor, a capacitor, or the like may be fabricated over another fabrication substrate and then separated therefrom and transferred onto the flexible substrate. Note that to perform separation from the fabrication substrate and transfer to the flexible substrate, a separation layer is preferably provided between the fabrication substrate and the transistor, the capacitor, or the like.

For the flexible substrate, for example, a metal, an alloy, a resin, glass, or fiber thereof can be used. The flexible substrate used as the substrate preferably has a lower coefficient of linear expansion because deformation due to an environment is inhibited. For the flexible substrate used as the substrate, for example, a material whose coefficient of linear expansion is lower than or equal to $1 \times 10^{-3}$/K, lower than or equal to $5 \times 10^{-5}$/K, or lower than or equal to $1 \times 10^{-5}$/K is used. Examples of the resin include polyester, polyolefin, polyamide (e.g., nylon and aramid), polyimide, polycarbonate, and acrylic. In particular, aramid is suitable for the flexible substrate because of its low coefficient of linear expansion.

[Insulating Layer]

For the insulating layer, a single layer or a stack of a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like is used. A material in which a plurality of materials selected from an oxide material, a nitride material, an oxynitride material, and a nitride oxide material are mixed may be used.

Note that in this specification and the like, a nitride oxide refers to a compound in which the nitrogen content is higher than the oxygen content. An oxynitride refers to a compound in which the oxygen content is higher than the than nitrogen content. The content of each element can be measured by Rutherford backscattering spectrometry (RBS), for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$ in secondary ion mass spectrometry (SIMS). It is particularly preferable to lower the hydrogen concentration in the insulating layer in contact with the semiconductor layer.

Furthermore, the nitrogen concentration in the insulating layer is preferably lowered in order to prevent an increase in the nitrogen concentration in the semiconductor layer. Specifically, the nitrogen concentration in the insulating layer is lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$ in SIMS.

It is preferred that at least a region of the insulating layer in contact with the semiconductor layer have few defects and typically have as few signals observed by electron spin resonance (ESR) spectroscopy as possible. An example of the signals is an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3 \times 10^{17}$ spins/cm$^3$, preferably lower than or equal to $5 \times 10^{16}$ spins/cm$^3$ is used.

In addition to the above-described signal, a signal due to nitrogen dioxide (NO$_2$) may be observed. The signal is divided into the following three signals according to the N nuclear spin: a signal observed at a g-factor of greater than or equal to 2.037 and less than or equal to 2.039 (referred to as a first signal), a signal observed at a g-factor of greater than or equal to 2.001 and less than or equal to 2.003 (referred to as a second signal), and a signal observed at a g-factor of greater than or equal to 1.964 and less than or equal to 1.966 (referred to as a third signal).

For example, as the insulating layer, it is suitable to use an insulating layer whose spin density of a signal due to nitrogen dioxide (NO$_2$) is higher than or equal to $1 \times 10^{17}$ spins/cm$^3$ and lower than $1 \times 10^{18}$ spins/cm$^3$.

Note that nitrogen oxide (NO$_x$) including nitrogen dioxide (NO$_2$) forms a state in the insulating layer. The state is positioned in the energy gap of the oxide semiconductor layer. Thus, when nitrogen oxide (NO$_x$) diffuses to the interface between the insulating layer and the oxide semiconductor layer, an electron may be trapped by the state on the insulating layer side. As a result, the trapped electron remains in the vicinity of the interface between the insulating layer and the oxide semiconductor layer; hence, the threshold voltage of the transistor is shifted in the positive direction. Accordingly, the use of a film with a low nitrogen oxide content as the insulating layer and the insulating layer can reduce a shift in the threshold voltage of the transistor.

As an insulating layer that releases a small amount of nitrogen oxide (NO$_x$), for example, a silicon oxynitride layer can be used. The silicon oxynitride layer is a film that releases more ammonia than nitrogen oxide (NO$_x$) in thermal desorption spectroscopy (TDS); the typical released amount of ammonia is greater than or equal to $1 \times 10^{18}$ molecules/cm$^3$ and less than or equal to $5 \times 10^{19}$ molecules/cm$^3$. Note that the released amount of ammonia is the total amount in the range of the heat treatment temperature in TDS from 50° C. to 650° C. or from 50° C. to 550° C.

Since nitrogen oxide (NO$_x$) reacts with ammonia and oxygen in heat treatment, the use of an insulating layer that releases a large amount of ammonia reduces nitrogen oxide (NO$_x$).

At least one of the insulating layers in contact with the oxide semiconductor layer is preferably formed using an insulating layer from which oxygen is released by heating. Specifically, it is preferable to use an insulating layer in which the amount of released oxygen converted into oxygen atoms is $1.0 \times 10^{18}$ atoms/cm$^3$ or more, $1.0 \times 10^{19}$ atoms/cm$^3$ or more, or $1.0 \times 10^{20}$ atoms/cm$^3$ or more in TDS performed with heat treatment where the surface temperature of the insulating layer is higher than or equal to 100° C. and lower than or equal to 700° C., preferably higher than or equal to 100° C. and lower than or equal to 500° C. Note that in this specification and the like, oxygen released by heating is also referred to as "excess oxygen".

Furthermore, an insulating layer containing excess oxygen can also be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used in the treatment for adding oxygen include an oxygen gas such as $^{16}$O$_2$ or $^{18}$O$_2$ and a gas containing oxygen, such as a nitrous oxide gas or an ozone gas. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic-based resin, a benzocyclobutene-based resin, polyamide, or an epoxy-based resin can be used. Other than the above organic materials, it is also possible to use a low-dielectric constant material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

[Electrode]

As a conductive material for forming the electrode, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. A semiconductor having high electrical conductivity, typified by polycrystalline silicon containing an impurity element such as phosphorus, or silicide such as nickel silicide may be used.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added may be used. Furthermore, indium gallium zinc oxide containing nitrogen may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed. A stacked-layer structure combining a conductive material containing nitrogen and a conductive material containing oxygen may be employed.

Note that in the case where an oxide semiconductor is used for the semiconductor layer and the gate electrode employs a stacked-layer structure combining a material containing the above metal element and a conductive material containing oxygen, the conductive material containing oxygen is preferably provided on the semiconductor layer side. By providing the conductive material containing oxygen on the semiconductor layer side, oxygen released from the conductive material is easily supplied to the semiconductor layer.

For the electrode, a conductive material with high embeddability, such as tungsten or polysilicon, can be used, for example. A conductive material with high embeddability and a barrier layer (a diffusion prevention layer) such as a titanium layer, a titanium nitride layer, or a tantalum nitride layer may be used in combination. Note that the electrode may be referred to as a "contact plug".

In particular, the electrode in contact with the gate insulating layer is preferably formed using a conductive material through which impurities are less likely to pass. An example of the conductive material through which impurities are less likely to pass is tantalum nitride.

When an insulating material through which impurities are less likely to pass is used for the insulating layer and a conductive material through which impurities are less likely to pass is used for the electrode, diffusion of impurities to the transistor can be further inhibited. Thus, the reliability of the transistor can be further increased. That is, the reliability of the memory device can be further increased.

[Semiconductor Layer]

For the semiconductor layer, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Furthermore, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

Note that semiconductor layers may be stacked. In the case of stacking semiconductor layers, semiconductor materials having different crystal states may be used or different semiconductor materials may be used.

The bandgap of an oxide semiconductor, which is one kind of metal oxide, is greater than or equal to 2 eV; thus, the use of the oxide semiconductor for the semiconductor layer can achieve a transistor with an extremely low off-state current. Specifically, the off-state current per micrometer of channel width at room temperature (typically 25° C.) at a voltage between a source and a drain of 3.5 V can be lower than $1 \times 10^{-20}$ A, lower than $1 \times 10^{-22}$ A, or lower than $1 \times 10^{-24}$ A. That is, the on/off ratio can be greater than or equal to 20 digits. In addition, a transistor using an oxide semiconductor for the semiconductor layer (an OS transistor) has high withstand voltage between its source and drain. Thus, a transistor with high reliability can be provided. A transistor with high output voltage and high withstand voltage can be provided. A memory device or the like with high reliability can be provided. A memory device or the like with high output voltage and high withstand voltage can be provided.

In this specification and the like, a transistor in which silicon having crystallinity is used for a semiconductor layer where a channel is formed is also referred to as a "crystalline Si transistor".

The crystalline Si transistor tends to have relatively high mobility compared with the OS transistor. On the other hand, the crystalline Si transistor has difficulty in achieving an extremely low off-state current such as one in the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. When the oxide semiconductor layer is formed by a sputtering method, a rare gas (typically argon), oxygen, or a mixed gas of a rare gas and oxygen is used as a sputtering gas. In addition, increasing the purity of a sputtering gas is necessary. For example, as an oxygen gas or a rare gas used as a sputtering gas, a gas that is highly purified to have a dew point of −60° C. or lower, preferably −100° C. or lower is used. When the highly purified sputtering gas is used for the deposition, entry of moisture or the like into the oxide semiconductor layer can be prevented as much as possible.

Furthermore, in the case where the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5 \times 10^{-7}$ Pa to $1 \times 10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1 \times 10^{-4}$ Pa, further preferably lower than or equal to $5 \times 10^{-5}$ Pa.

[Metal Oxide]

An oxide semiconductor, which is one kind of metal oxide, preferably contains at least indium or zinc. In particular, indium and zinc are preferably contained. Furthermore, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Composition of Metal Oxide]

The composition of a CAC (Cloud-Aligned Composite)-OS that can be used in a transistor disclosed in one embodiment of the present invention will be described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, in some cases, the conductive regions and the insulating regions each have a size greater than or equal to 0.5 nm and less than or equal to 10 nm, preferably greater than or equal to 0.5 nm and less than or equal to 3 nm, and are dispersed in the material.

The CAC-OS or the CAC-metal oxide includes components having different bandgaps. For example, the CAC-OS or the CAC-metal oxide includes a component having a wide gap due to the insulating region and a component having a narrow gap due to the conductive region. In this structure, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

[Structure of Metal Oxide]

An oxide semiconductor, which is one kind of metal oxide, is classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear grain boundary even in the vicinity of distortion in the CAAC-OS. That is, formation of a grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. On the other hand, in the CAAC-OS, a reduction in electron mobility due to a grain boundary is less likely to occur because it is difficult to observe a clear grain boundary. Furthermore, entry of impurities, formation of defects, or the like might decrease the crystallinity of a metal oxide, which means that the CAAC-OS is a metal oxide having small amounts of impurities and defects (e.g., oxygen vacancies). Thus, a metal oxide including the CAAC-OS is physically stable. Therefore, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (a metal oxide) can have various structures with different properties. The oxide semiconductor may include two or more of an amorphous oxide semiconductor, a polycrystalline oxide semiconductor, an a-like OS, a nc-OS, and a CAAC-OS.

[Transistor Including Metal Oxide]

Next, the case where the above metal oxide is used in a channel formation region of a transistor will be described.

Note that when the above metal oxide is used in a channel formation region of a transistor, a transistor having high field-effect mobility can be achieved. In addition, a transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, further preferably lower than $1\times10^{10}/cm^3$, and higher than or equal to $1\times10^{-9}/cm^3$.

A highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When silicon or carbon, which is a Group 14 element, is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS)) are set lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

When containing nitrogen, the metal oxide easily becomes n-type by generation of electrons serving as carriers and an increase in carrier density. As a result, a transistor using a metal oxide that contains nitrogen for its channel formation region is likely to have normally-on characteristics. Thus, nitrogen in the channel formation region in the metal oxide is preferably reduced as much as possible. For example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen for its channel formation region is likely to have normally-on characteristics. Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide in which the impurity concentration is sufficiently reduced is used in a channel formation region of a transistor, stable electrical characteristics can be given.

<Film Formation Method>

An insulating material for forming the insulating layer, a conductive material for forming the electrode, or a semiconductor material for forming the semiconductor layer can be formed by a sputtering method, a spin coating method, a CVD (Chemical Vapor Deposition) method (including a thermal CVD method, an MOCVD (Metal Organic Chemical Vapor Deposition) method, a PECVD (Plasma Enhanced CVD) method, a high density plasma CVD method, an LPCVD (low pressure CVD) method, an APCVD (atmospheric pressure CVD) method, and the like), an ALD (Atomic Layer Deposition) method, or an MBE (Molecular Beam Epitaxy) method, or a PLD (Pulsed Laser Deposition) method, a dipping method, a spray coating method, a droplet discharging method (e.g., an inkjet method), or a printing method (e.g., screen printing or offset printing).

By a plasma CVD method, a high-quality film can be obtained at a relatively low temperature. With the use of a film formation method that does not use plasma at the time of film formation, such as an MOCVD method, an ALD method, or a thermal CVD method, damage is not easily caused on a surface where the film is formed. For example, a wiring, an electrode, an element (e.g., a transistor or a capacitor), or the like included in a memory device might be charged up by receiving charges from plasma. In that case, accumulated charges might break the wiring, electrode, element, or the like included in the memory device. By contrast, in the case of a film formation method not using plasma, such plasma damage is not caused; thus, the yield of memory devices can be increased. Moreover, since plasma damage during film formation is not caused, a film with few defects can be obtained.

Unlike a film formation method in which particles ejected from a target or the like are deposited, a CVD method and an ALD method are film formation methods in which a film is formed by reaction at a surface of an object. Thus, a CVD method and an ALD method are film formation methods that enable favorable step coverage almost regardless of the shape of an object. In particular, an ALD method enables excellent step coverage and excellent thickness uniformity and can be favorably used to cover a surface of an opening with a high aspect ratio, for example. On the other hand, an ALD method has a relatively low deposition rate, and thus is preferably used in combination with another film formation method with a high deposition rate, such as a CVD method, in some cases.

When a CVD method or an ALD method is used, the composition of a film to be formed can be controlled with a flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases while forming the film, a film whose composition is continuously changed can be formed. In the case of forming a film while changing the flow rate ratio of the source gases, as compared with the case of forming a film with the use of a plurality of deposition chambers, the time taken for the film formation can be shortened because the time taken for transfer and pressure adjustment is omitted. Thus, memory devices can be manufactured with improved productivity in some cases.

Note that in the case of forming a film by an ALD method, a gas that does not contain chlorine is preferably used as a material gas.

This embodiment can be implemented in an appropriate combination with the structures described in the other embodiments and the like.

Embodiment 4

In this embodiment, a structure example of a transistor that can be used in the semiconductor device and the like described in the above embodiment will be described.

TRANSISTOR STRUCTURE EXAMPLE 1

Figure 13A:
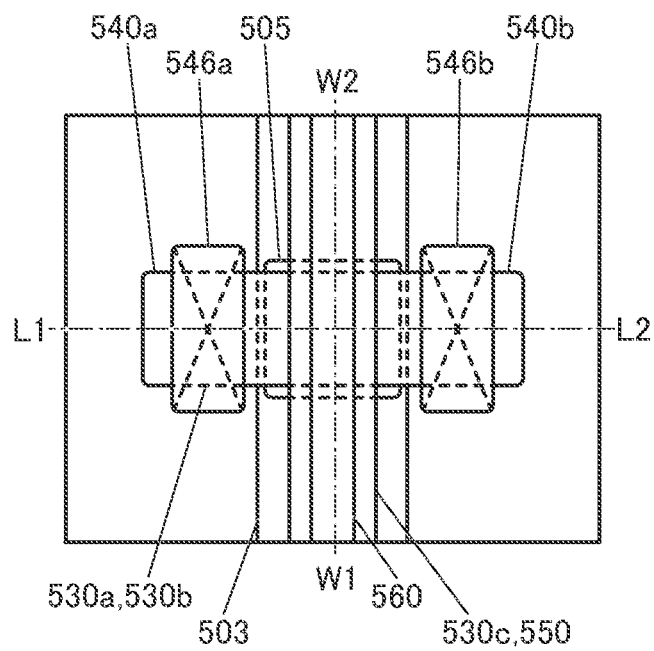
[FIGS. 13A to 13C] Diagrams illustrating a structure example of a transistor.
Figure 13C:
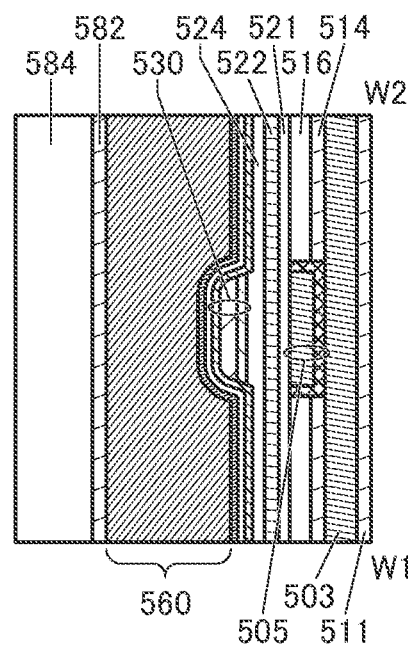
Figure 13B:
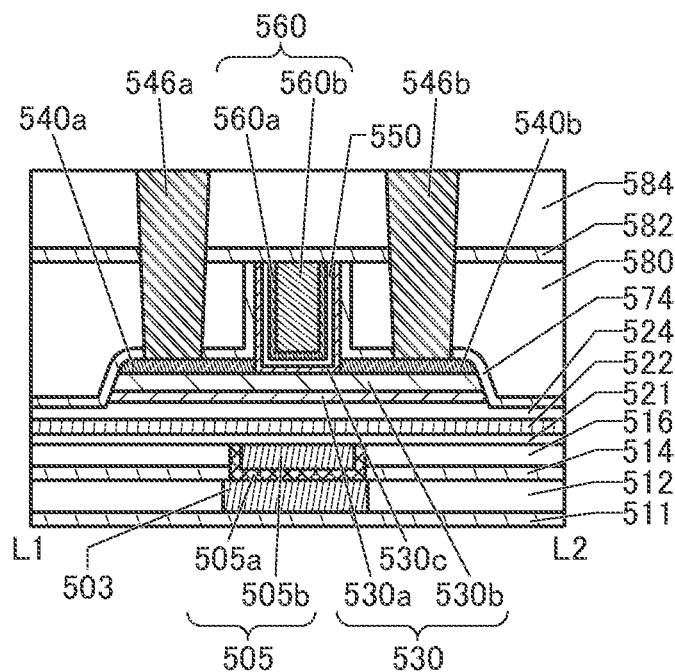

A structure example of a transistor 500A is described with reference to FIGS. 13(A), 13(B), and 13(C). FIG. 13(A) is a top view of the transistor 500A. FIG. 13(B) is a cross-sectional view of a portion indicated by a dashed-dotted line L1-L2 in FIG. 13(A). FIG. 13(C) is a cross-sectional view of a portion indicated by a dashed-dotted line W1-W2 in FIG. 13(A). For clarity of the drawing, some components are not illustrated in the top view of FIG. 13(A).

FIGS. 13(A), 13(B), and 13(C) illustrate the transistor 500A and an insulating layer 511, an insulating layer 512, an insulating layer 514, an insulating layer 516, an insulating layer 580, an insulating layer 582, and an insulating layer 584 that function as interlayer films. In addition, a conductive layer 546 (a conductive layer 546a and a conductive layer 546b) that is electrically connected to the transistor 500A and functions as a contact plug, and a conductive layer 503 functioning as a wiring are illustrated.

The transistor 500A includes a conductive layer 560 (a conductive layer 560a and a conductive layer 560b) functioning as a first gate electrode; a conductive layer 505 (a conductive layer 505a and a conductive layer 505b) functioning as a second gate electrode; an insulating layer 550 functioning as a first gate insulating layer; an insulating layer 521, an insulating layer 522, and an insulating layer 524 that function as a second gate insulating layer; an oxide 530 (an oxide 530a, an oxide 530b, and an oxide 530c) including a region where a channel is formed; a conductive layer 540a functioning as one of a source and a drain; a conductive layer 540b functioning as the other of the source and the drain; and an insulating layer 574.

In the transistor 500A illustrated in FIG. 13, the oxide 530c, the insulating layer 550, and the conductive layer 560 are positioned in an opening provided in the insulating layer 580 with the insulating layer 574 positioned therebetween. Moreover, the oxide 530c, the insulating layer 550, and the conductive layer 560 are positioned between the conductive layer 540a and the conductive layer 540b.

The insulating layer 511 and the insulating layer 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulating layer 511 preferably functions as a barrier film that inhibits entry of impurities such as water or hydrogen into the transistor 500A from the substrate side. Accordingly, for the insulating layer 511, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of oxygen atoms, oxygen molecules, and the like) (through which the above oxygen does not easily pass). Moreover, aluminum oxide or silicon nitride, for example, may be used for the insulating layer 511. This structure can inhibit diffusion of impurities such as hydrogen and water to the transistor 500A side from the substrate side of the insulating layer 511.

For example, the dielectric constant of the insulating layer 512 is preferably lower than that of the insulating layer 511. When a material with a low dielectric constant is used for the interlayer film, the parasitic capacitance generated between wirings can be reduced.

The conductive layer 503 is formed to be embedded in the insulating layer 512. Here, the level of the top surface of the conductive layer 503 and the level of the top surface of the insulating layer 512 can be substantially the same. Note that although a structure in which the conductive layer 503 is a single layer is illustrated, the present invention is not limited thereto. For example, the conductive layer 503 may have a multilayer structure of two or more layers. Note that for the conductive layer 503, a conductive material that has high conductivity and contains tungsten, copper, or aluminum as its main component is preferably used.

In the transistor 500A, the conductive layer 560 sometimes functions as a first gate (also referred to as top gate) electrode. In the transistor 500A, the conductive layer 560 is formed in a self-aligned manner so as to fill the opening formed in the insulating layer 580 and the like. Forming the conductive layer 560 in this manner allows the conductive layer 560 to be surely positioned in a region between the conductive layer 540a and the conductive layer 540b without alignment.

The conductive layer 505 sometimes functions as a second gate (also referred to as bottom gate) electrode. In that case, the threshold voltage of the transistor 500A can be controlled by changing a potential applied to the conductive layer 505 not in conjunction with but independently of a potential applied to the conductive layer 560. In particular, the threshold voltage of the transistor 500A can be higher than 0 V and the off-state current can be reduced by applying a negative potential to the conductive layer 505. Thus, a drain current at the time when a potential applied to the conductive layer 560 is 0 V can be lower in the case where a negative potential is applied to the conductive layer 505 than in the case where a negative potential is not applied to the conductive layer 505.

For example, when the conductive layer 505 and the conductive layer 560 overlap each other, in the case where a potential is applied to the conductive layer 560 and the conductive layer 505, an electric field generated from the conductive layer 560 and an electric field generated from the conductive layer 505 are connected and can cover a channel formation region formed in the oxide 530.

That is, the channel formation region can be electrically surrounded by the electric field of the conductive layer 560 having a function of the first gate electrode and the electric field of the conductive layer 505 having a function of the second gate electrode. In this specification, a transistor structure in which a channel formation region is electrically surrounded by electric fields of a first gate electrode and a second gate electrode is referred to as a surrounded channel (S-channel) structure.

Like the insulating layer 511 or the insulating layer 512, the insulating layer 514 and the insulating layer 516 function as interlayer films. For example, the insulating layer 514 preferably functions as a barrier film that inhibits entry of impurities such as water or hydrogen into the transistor 500A from the substrate side. This structure can inhibit diffusion of impurities such as hydrogen and water to the transistor 500A side from the substrate side of the insulating layer 514. Moreover, for example, the insulating layer 516 preferably has a lower dielectric constant than the insulating layer 514. When a material with a low dielectric constant is used for the interlayer film, the parasitic capacitance generated between wirings can be reduced.

In the conductive layer 505 functioning as the second gate, the conductive layer 505a is formed in contact with an inner wall of an opening in the insulating layer 514 and the insulating layer 516, and the conductive layer 505b is formed further inside. Here, the top surfaces of the conductive layer 505a and the conductive layer 505b and the top surface of the insulating layer 516 can be substantially level with each other. Although the transistor 500A having a structure in which the conductive layer 505a and the conductive layer 505b are stacked is illustrated, the present invention is not limited thereto. For example, the conductive layer 505 may have a single-layer structure or a stacked-layer structure of three or more layers.

Here, for the conductive layer 505a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of oxygen atoms, oxygen molecules, and the like) (through which the above oxygen is less likely to pass). Note that in this specification, a function of inhibiting diffusion of impurities or oxygen means a function of inhibiting diffusion of any one or all of the above impurities and the above oxygen.

For example, when the conductive layer 505a has a function of inhibiting diffusion of oxygen, a reduction in conductivity of the conductive layer 505b due to oxidation can be inhibited.

In the case where the conductive layer 505 doubles as a wiring, the conductive layer 505b is preferably formed using a conductive material that has high conductivity and contains tungsten, copper, or aluminum as its main component. In that case, the conductive layer 503 is not necessarily provided. Note that the conductive layer 505b is illustrated as a single layer but may have a stacked-layer structure, for example, a stack of any of the above conductive materials and titanium or titanium nitride.

The insulating layer 521, the insulating layer 522, and the insulating layer 524 function as a second gate insulating layer.

The insulating layer 522 preferably has a barrier property. The insulating layer 522 having a barrier property functions as a layer that inhibits entry of impurities such as hydrogen into the transistor 500A from the surroundings of the transistor 500A.

For the insulating layer 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulating layer. When a high-k material is used for an insulator functioning as the gate insulating layer, a gate potential during operation of the transistor can be reduced while the physical thickness of the gate insulating layer is maintained.

For example, it is preferable that the insulating layer 521 be thermally stable. For example, silicon oxide and silicon oxynitride, which have thermal stability, are preferable. In addition, a combination of an insulator of a high-k material and silicon oxide or silicon oxynitride allows the insulating layer 521 to have a stacked-layer structure with thermal stability and a high dielectric constant.

Note that the second gate insulating layer is shown to have a three-layer stacked structure in FIG. 13, but may have a single-layer structure or a stacked-layer structure of two or more layers. In that case, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the oxide semiconductor described in the above embodiment, which is one kind of metal oxide, can be used.

A transistor in which the oxide semiconductor is used as the oxide where the channel is formed exhibits an extremely low leakage current (off-state current) in the off state. Thus, a semiconductor device with reduced power consumption can be achieved. Since the oxide semiconductor can be formed by a sputtering method or the like, a highly integrated semiconductor device can be easily achieved.

For example, as the oxide 530, a metal oxide such as an In-M-Zn oxide (the element M is one or more kinds selected from gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, gallium, yttrium, or tin is preferably used as the element M. Alternatively, an In-M oxide, an In—Zn oxide, or an M-Zn oxide may be used as the semiconductor layer 530.

Note that the oxide 530c is preferably provided in the opening in the insulating layer 580 with the insulating layer 574 positioned therebetween. When the insulating layer 574 has a barrier property, diffusion of impurities from the insulating layer 580 into the oxide 530 can be inhibited.

One of conductive layers 540 functions as a source electrode and the other functions as a drain electrode.

For the conductive layer 540a and the conductive layer 540b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is shown in FIG. 13, a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductive layer 540. The barrier layer is preferably formed using a material having a barrier property against oxygen or hydrogen. This structure can inhibit oxidation of the conductive layer 540 at the time of forming the insulating layer 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductive layer 540 can be expanded. For example, a material having a low oxidation resistance and high conductivity, such as tungsten or aluminum, can be used for the conductive layer 540. Moreover, for example, a conductor that can be easily deposited or processed can be used.

The insulating layer 550 functions as a first gate insulating layer. The insulating layer 550 is preferably provided in the opening in the insulating layer 580 with the oxide 530c and the insulating layer 574 positioned therebetween.

As miniaturization and high integration of transistors progress, a problem such as leakage current may arise because of a thinner gate insulating layer. In that case, the insulating layer 550 may have a stacked-layer structure like the second gate insulating layer. When the insulator functioning as the gate insulating layer has a stacked-layer structure of a high-k material and a thermally stable material, a gate potential during operation of the transistor can be reduced while the physical thickness of the gate insulating layer is maintained. Furthermore, the stacked-layer structure can be thermally stable and have a high dielectric constant.

The conductive layer 560 functioning as the first gate electrode includes the conductive layer 560a and the conductive layer 560b over the conductive layer 560a. Like the conductive layer 505a, the conductive layer 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 560a has a function of inhibiting oxygen diffusion, the range of choices for the material of the conductive layer 560b can be expanded. That is, the conductive layer 560a inhibits oxidation of the conductive layer 560b, thereby preventing the decrease in conductivity of the conductive layer 560b.

As a conductive material having a function of inhibiting diffusion of oxygen, for example, tantalum, tantalum nitride, ruthenium, or ruthenium oxide is preferably used. For the conductive layer 560a, the oxide semiconductor that can be used as the oxide 530 can be used. In that case, when the conductive layer 560b is formed by a sputtering method, the electric resistance of the conductive layer 560a is lowered so that the conductive layer 560a can become a conductor. This can be referred to as an OC (Oxide Conductor) electrode.

The conductive layer 560b is preferably formed using a conductive material containing tungsten, copper, or aluminum as its main component. The conductive layer 560 functions as a wiring and thus is preferably formed using a conductor having high conductivity. For example, a conductive material containing tungsten, copper, or aluminum as its main component can be used. The conductive layer 560b may have a stacked-layer structure, for example, a stack of any of the above conductive materials and titanium or titanium nitride.

The insulating layer 574 is positioned between the insulating layer 580 and the transistor 500A. For the insulating layer 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 574 can inhibit diffusion of impurities such as water and hydrogen contained in the insulating layer 580 into the oxide 530b through the oxide 530c and the insulating layer 550. The insulating layer 574 can also inhibit oxidation of the conductive layer 560 due to excess oxygen contained in the insulating layer 580.

The insulating layer 580, the insulating layer 582, and the insulating layer 584 function as interlayer films.

Like the insulating layer 514, the insulating layer 582 preferably functions as a barrier insulating film that inhibits entry of impurities such as water or hydrogen into the transistor 500A from the outside.

Like the insulating layer 516, the insulating layer 580 and the insulating layer 584 preferably have a lower dielectric constant than the insulating layer 582. When a material with a low dielectric constant is used for the interlayer films, the parasitic capacitance generated between wirings can be reduced.

The transistor 500A may be electrically connected to another component through a plug or a wiring such as the conductive layer 546 embedded in the insulating layer 580, the insulating layer 582, and the insulating layer 584.

As a material for the conductive layer 546, a conductive material such as a metal material, an alloy material, a metal nitride material, or a metal oxide material can be used as a single layer or stacked layers, as in the conductive layer 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductive layer 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and has a high on-state current can be provided. Alternatively, a semiconductor device including a transistor that contains an oxide semiconductor and has a low off-state current can be provided. Alternatively, a semiconductor device that has small variations in electrical characteristics, stable electrical characteristics, and high reliability can be provided.

TRANSISTOR STRUCTURE EXAMPLE 2

Figure 14A:
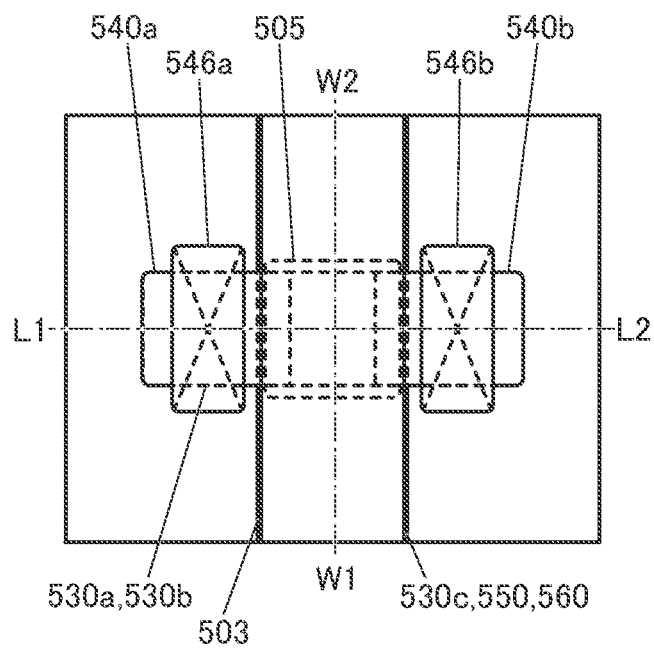
[FIGS. 14A to 14C] Diagrams illustrating a structure example of a transistor.
Figure 14C:
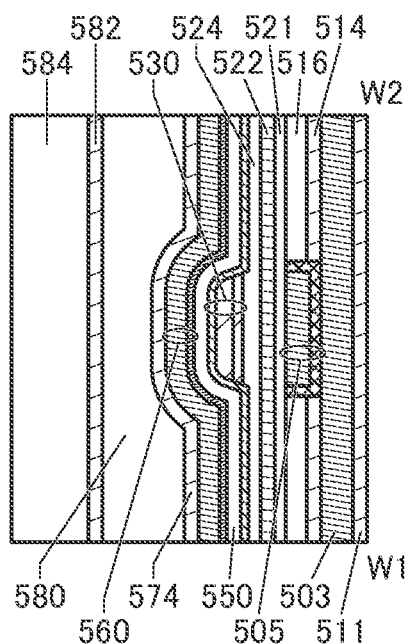
Figure 14B:
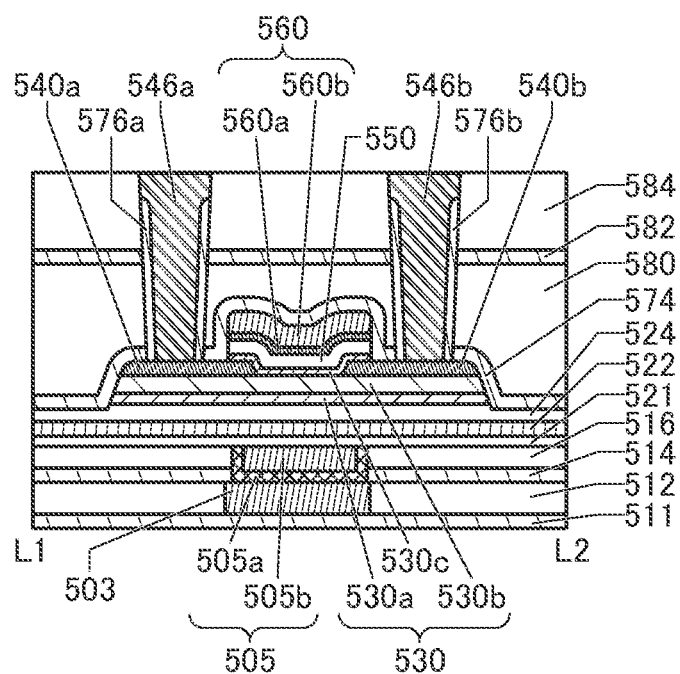

A structure example of a transistor 500B is described with reference to FIGS. 14(A), 14(B), and 14(C). FIG. 14(A) is a top view of the transistor 500B. FIG. 14(B) is a cross-sectional view of a portion indicated by a dashed-dotted line L1-L2 in FIG. 14(A). FIG. 14(C) is a cross-sectional view of a portion indicated by a dashed-dotted line W1-W2 in FIG. 14(A). Note that for clarification of the drawing, some components are not illustrated in the top view of FIG. 14(A).

The transistor 500B is a variation example of the transistor 500A. Therefore, differences from the transistor 500A will be mainly described to avoid repeated description.

The transistor 500B includes a region where the conductive layer 540 (the conductive layer 540a and the conductive layer 540b), the oxide 530c, the insulating layer 550, and the conductive layer 560 overlap each other. With this structure, a transistor having a high on-state current can be provided. Moreover, a transistor having high controllability can be provided.

The conductive layer 560 functioning as a first gate electrode includes the conductive layer 560a and the conductive layer 560b over the conductive layer 560a. Like the conductive layer 505a, the conductive layer 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 560a has a function of inhibiting oxygen diffusion, the range of choices for the material of the conductive layer 560b can be expanded. That is, the conductive layer 560a inhibits oxidation of the conductive layer 560b, thereby preventing the decrease in conductivity of the conductive layer 560b.

The insulating layer 574 is preferably provided to cover the top surface and the side surface of the conductive layer 560, the side surface of the insulating layer 550, and the side surface of the oxide 530c. For the insulating layer 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 574 can inhibit oxidation of the conductive layer 560. Moreover, the insulating layer 574 can inhibit diffusion of impurities such as water and hydrogen contained in the insulating layer 580 into the transistor 500B.

An insulating layer 576 (an insulating layer 576a and an insulating layer 576b) having a barrier property may be provided between the conductive layer 546 and the insulating layer 580. Providing the insulating layer 576 can prevent oxygen in the insulating layer 580 from reacting with the conductive layer 546 and oxidizing the conductive layer 546.

Furthermore, with the insulating layer 576 having a barrier property, the range of choices for the material of the conductor used as the plug or the wiring can be expanded. The use of a metal material having an oxygen absorbing property and high conductivity for the conductive layer 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

TRANSISTOR STRUCTURE EXAMPLE 3

Figure 15A:
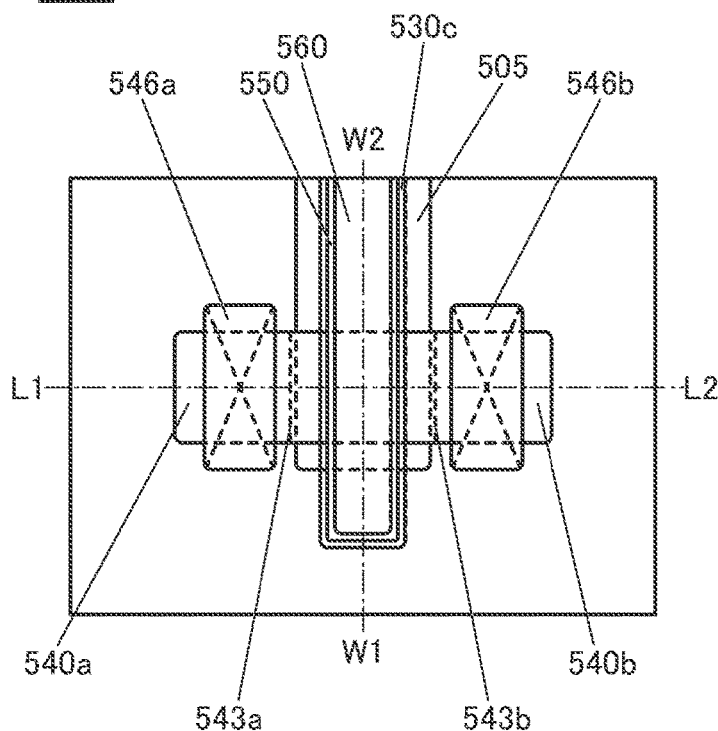
[FIGS. 15A to 15C] Diagrams illustrating a structure example of a transistor.
Figure 15C:
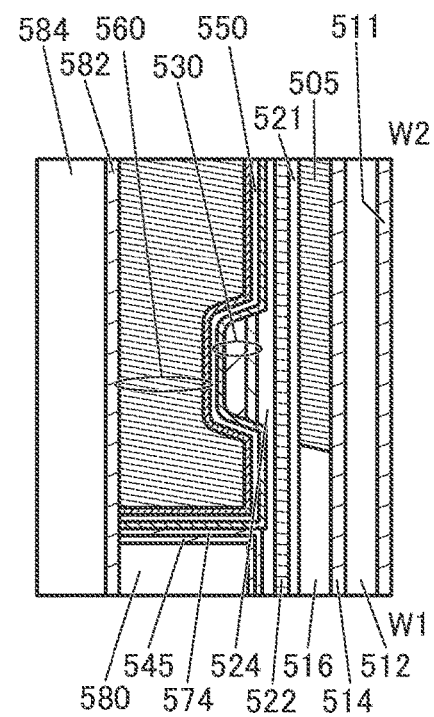
Figure 15B:
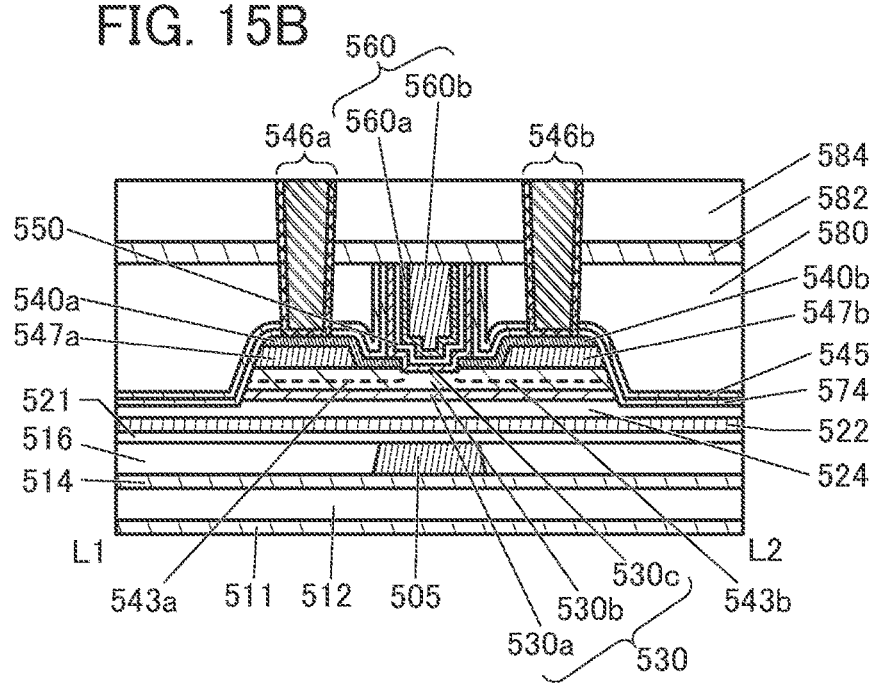

A structure example of a transistor 500C is described with reference to FIG. 15(A), FIG. 15(B), and FIG. 15(C). FIG. 15(A) is a top view of the transistor 500C. FIG. 15(B) is a cross-sectional view of the transistor 500C in the channel length direction and is a cross-sectional view of a portion indicated by a dashed-dotted line L1-L2 in FIG. 15(A). FIG. 15(C) is a cross-sectional view of the transistor 500C in the channel width direction and is a cross-sectional view of a portion indicated by a dashed-dotted line W1-W2 in FIG. 15(A). Note that for clarification of the drawing, some components are not illustrated in the top view of FIG. 15(A). In the transistor 500C illustrated in FIG. 15, a component having the same function as that in the transistor 500A illustrated in FIG. 13 is denoted by the same reference numeral, and the description of the transistor 500A illustrated in FIG. 13 can be referred to for the details.

The transistor 500C illustrated in FIG. 15 is different from the transistor 500A illustrated in FIG. 13 in that a conductive layer 547a is positioned between the conductive layer 540a and the oxide 530b and a conductive layer 547b is positioned between the conductive layer 540b and the oxide 530b. Here, the conductive layer 540a (the conductive layer 540b) is provided in contact with a top surface and a side surface on the conductive layer 560 side of the conductive layer 547a (the conductive layer 547b) and a top surface of the oxide 530b. For the conductive layer 547, a conductor that can be used for the conductive layer 540 is used. It is preferred that the thickness of the conductive layer 547 be at least greater than that of the conductive layer 540.

Moreover, the transistor 500C illustrated in FIG. 15 is different from the transistor 500A illustrated in FIG. 13 in that the distance between the conductive layer 540a and the conductive layer 540b is shorter than the length in the channel length direction of the opening formed in the insulating layer 580, the insulating layer 574, and an insulating layer 545.

In the transistor 500C illustrated in FIG. 15, having the structure as above allows an electric field of the conductive layer 560 to contribute largely also to a region of the oxide 530 in the vicinity of the conductive layer 540a and the conductive layer 540b. Accordingly, the effective channel length of the transistor 500C can be shortened, and the on-state current and the frequency characteristics can be improved.

The conductive layer 547a (the conductive layer 547b) is preferably provided to be overlapped by the conductive layer 546a (the conductive layer 546b). With such a structure, in etching for forming an opening in which the conductive layer 546a (the conductive layer 546b) is to be embedded, the conductive layer 547a (the conductive layer 547b) is provided at a bottom portion of the opening, thereby preventing over-etching of the oxide 530b.

In the transistor 500C illustrated in FIG. 15, the insulating layer 545 may be positioned on and in contact with the insulating layer 574. The insulating layer 574 preferably functions as a barrier insulating film that inhibits entry of impurities such as water or hydrogen and excess oxygen into the transistor 500C from the insulating layer 580 side. The insulating layer 574 can be formed using an insulator that can be used for the insulating layer 545. In addition, the insulating layer 574 may be formed using a nitride insulator such as aluminum nitride, aluminum titanium nitride, titanium nitride, silicon nitride, or silicon nitride oxide, for example.

Unlike in the transistor 500A illustrated in FIG. 13, in the transistor 500C illustrated in FIG. 15, the conductive layer 505 may be provided to have a single-layer structure. In this case, an insulating film to be the insulating layer 516 is formed over the patterned conductive layer 505, and an upper portion of the insulating film is removed by a CMP method or the like until the top surface of the conductive layer 505 is exposed. Preferably, the planarity of the top surface of the conductive layer 505 is made favorable. For example, the average surface roughness (Ra) of the top surface of the conductive layer 505 is less than or equal to 1 nm, preferably less than or equal to 0.5 nm, further preferably less than or equal to 0.3 nm. This allows the improvement in planarity of the insulating layer 524 formed over the conductive layer 505 and the increase in crystallinity of the oxide 530b and the oxide 530c.

The conductive layer 546a, the conductive layer 546b, a conductive layer 548a, and a conductive layer 548b have a function of a plug or a wiring that is connected to a capacitor or a transistor. As a material for the conductive layer 546a, the conductive layer 546b, the conductive layer 548a, and the conductive layer 548b, a conductive material such as a metal material, an alloy material, a metal nitride material, or a metal oxide material can be used as a single layer or stacked layers. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

TRANSISTOR STRUCTURE EXAMPLE 4>

Figure 16A:
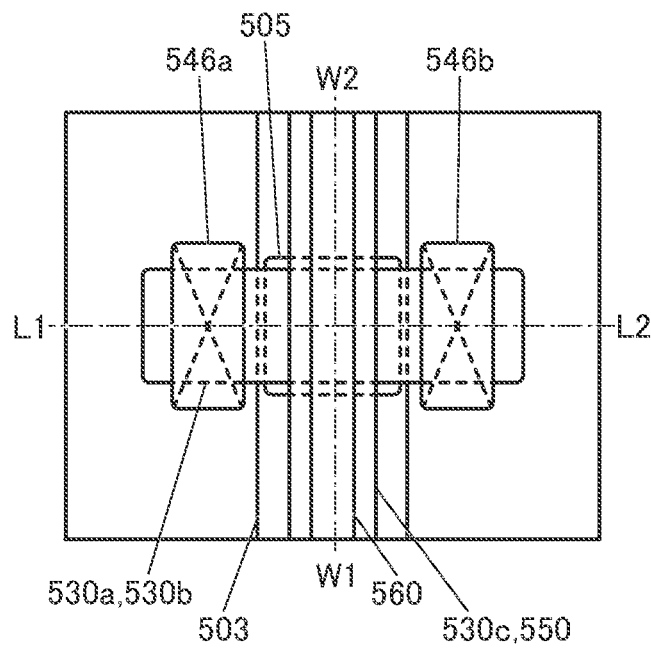
[FIGS. 16A to 16C] Diagrams illustrating a structure example of a transistor.
Figure 16C:
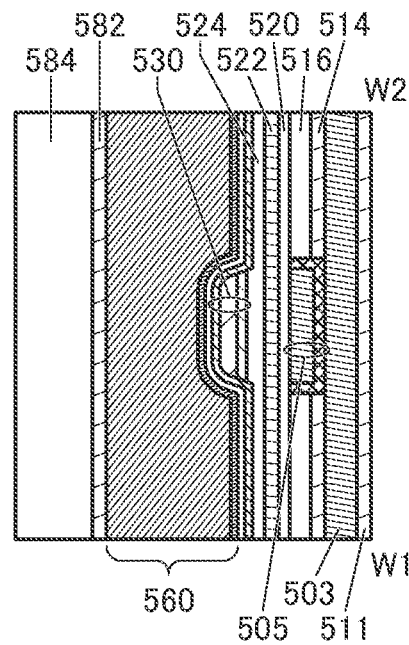
Figure 16B:
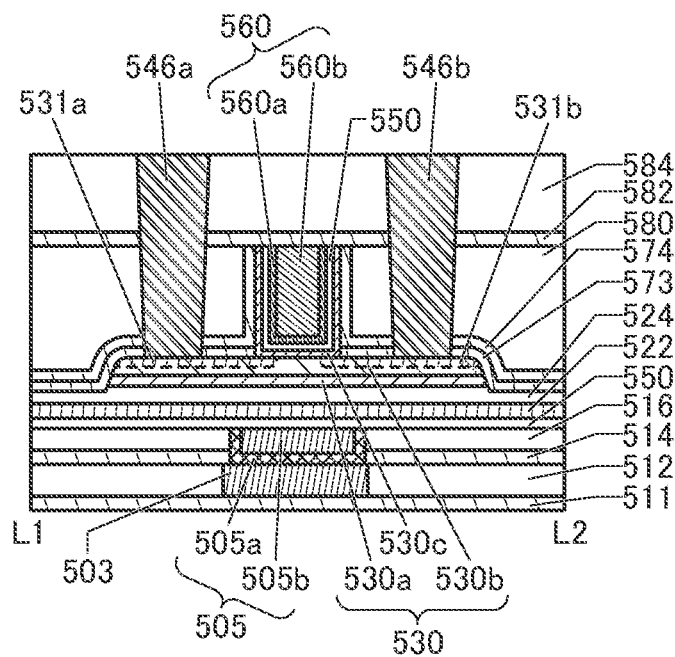

A structure example of a transistor 500D is described with reference to FIGS. 16(A), 16(B), and 16(C). FIG. 16(A) is a top view of the transistor 500D. FIG. 16(B) is a cross-sectional view of a portion indicated by a dashed-dotted line L1-L2 in FIG. 16(A). FIG. 16(C) is a cross-sectional view of a portion indicated by a dashed-dotted line W1-W2 in FIG. 16(A). Note that for clarification of the drawing, some components are not illustrated in the top view of FIG. 16(A).

The transistor 500D is a variation example of the above transistors. Therefore, differences from the above transistors will be mainly described to avoid repeated description.

In FIGS. 16(A) to 16(C), the conductive layer 540 and the conductive layer 547 are not provided, and part of the exposed surface of the oxide 530b includes a region 531a and a region 531b. One of the region 531a and the region 531b functions as a source region, and the other functions as a drain region. Moreover, an insulating layer 573 is included between the oxide 530b and the insulating layer 574. For the insulating layer 573, a material that can be used for the insulating layer 574 can be used.

A region 531 (the region 531a and the region 531b) illustrated in FIG. 16 is a region where the above element is added to the oxide 530b. The region 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the region 531 is formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas element, or the like may be used. Typical examples of the rare gas element include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulating layer 573 and an insulating film to be the insulating layer 574 may be formed over the oxide 530b and the dummy gate. Stacking the insulating film to be the insulating layer 573 and the insulating layer 574 can provide a region where the region 531, the oxide 530c, and the insulating layer 550 overlap each other.

Specifically, after an insulating film to be the insulating layer 580 is provided over the insulating film to be the insulating layer 574, the insulating film to be the insulating layer 580 is subjected to CMP (Chemical Mechanical Polishing) treatment, whereby part of the insulating film to be the insulating layer 580 is removed and the dummy gate is exposed. Then, when the dummy gate is removed, part of the insulating layer 573 in contact with the dummy gate is preferably also removed. Thus, the insulating layer 574 and the insulating layer 573 are exposed at the side surface of the opening provided in the insulating layer 580, and the region 531 provided in the oxide 530b is partly exposed at the bottom surface of the opening. Next, an oxide film to be the oxide 530c, an insulating film to be the insulating layer 550, and a conductive film to be the conductive layer 560 are formed in this order in the opening, and then, the oxide film to be the oxide 530c, the insulating film to be the insulating layer 550, and the conductive film to be the conductive layer 560 are partly removed by CMP treatment or the like until the insulating layer 580 is exposed; thus, the transistor illustrated in FIG. 16 can be formed.

Note that the insulating layer 573 and the insulating layer 574 are not essential components. Design is appropriately set in consideration of required transistor characteristics.

The cost of the transistor illustrated in FIG. 16 can be reduced because an existing apparatus can be used and the conductive layer 542 and the conductive layer 547 are not provided.

TRANSISTOR STRUCTURE EXAMPLE 5

Figure 17A:
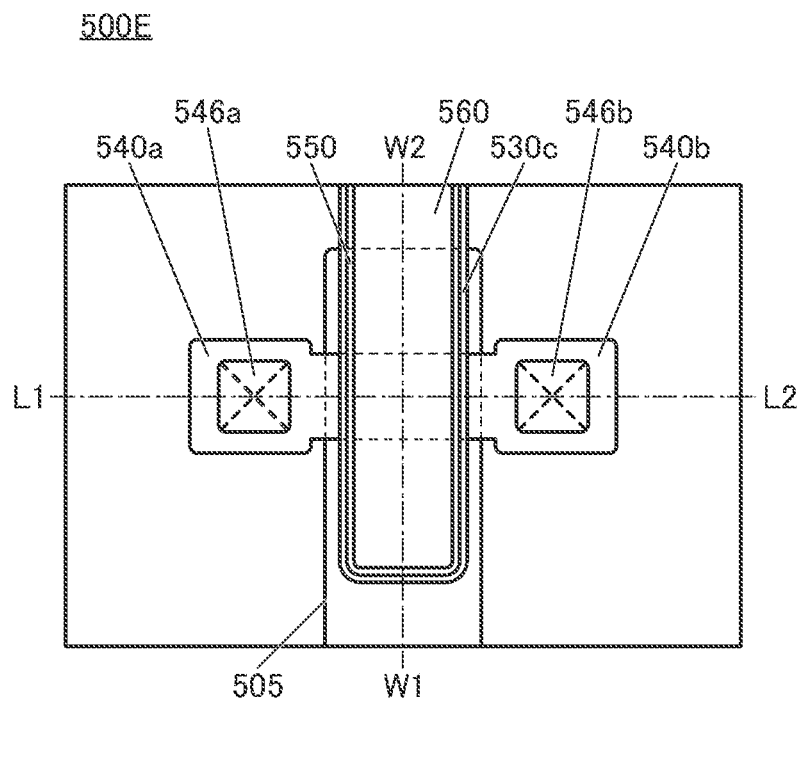
[FIGS. 17A to 17C] Diagrams illustrating a structure example of a transistor.
Figure 17C:
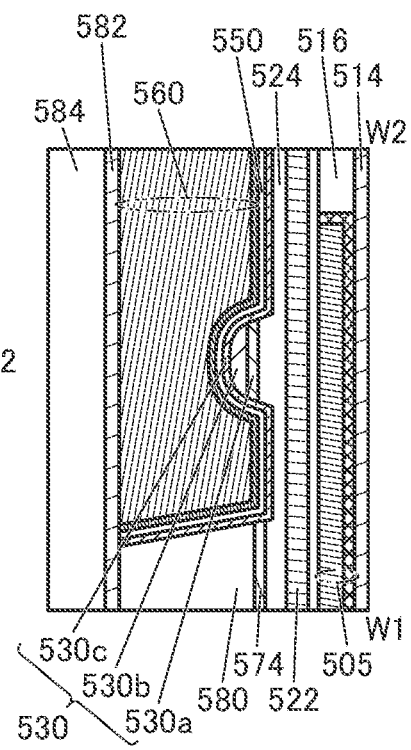
Figure 17B:
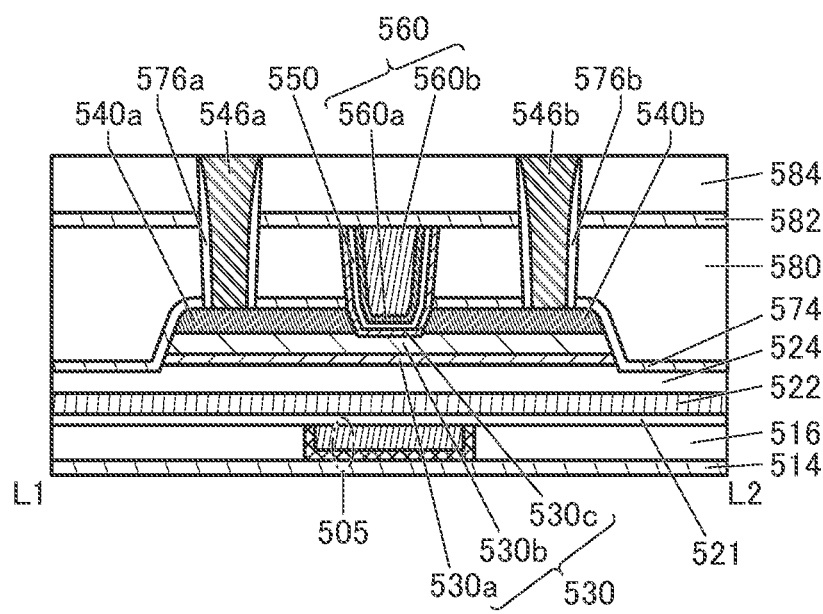

A structure example of a transistor 500E is described with reference to FIGS. 17(A), 17(B), and 17(C). FIG. 17(A) is a top view of the transistor 500E. FIG. 17(B) is a cross-sectional view of a portion indicated by a dashed-dotted line L1-L2 in FIG. 17(A). FIG. 17(C) is a cross-sectional view of a portion indicated by a dashed-dotted line W1-W2 in FIG. 17(A). Note that for clarification of the drawing, some components are not illustrated in the top view of FIG. 17(A).

The transistor 500E is a variation example of the transistor 500A. Therefore, differences from the transistor 500A will be mainly described to avoid repeated description.

In the transistor 500A, part of the insulating layer 574 is provided in the opening provided in the insulating layer 580 and covers a side surface of the conductive layer 560. Meanwhile, in the transistor 500E, an opening is formed by partly removing the insulating layer 580 and the insulating layer 574.

The insulating layer 576 (the insulating layer 576a and the insulating layer 576b) having a barrier property may be provided between the conductive layer 546 and the insulating layer 580. Providing the insulating layer 576 can prevent oxygen in the insulating layer 580 from reacting with the conductive layer 546 and oxidizing the conductive layer 546.

Note that when an oxide semiconductor is used as the oxide 530, the oxide 530 preferably has a stacked-layer structure of oxides that differ in the atomic ratio of metal atoms. Specifically, the atomic ratio of the element M to the constituent elements in the metal oxide used as the oxide 530a is preferably greater than the atomic ratio of the element M to the constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a. A metal oxide that can be used as the oxide 530a or the oxide 530b can be used as the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 500E is stable against high temperatures in the manufacturing process (what is called thermal budget).

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic ratio of the element M to the constituent elements in the metal oxide used as the oxide 530c is preferably greater than the atomic ratio of the element M to the constituent elements in the metal oxide used as the oxide 530b. Moreover, the atomic ratio of the element M to In in the metal oxide used as the oxide 530c is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530c.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like may be used as the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, a stacked-layer structure of an In—Ga—Zn oxide and an oxide that does not contain In may be employed as the oxide 530c.

Specifically, as the oxide 530a, a metal oxide having In:Ga:Zn=1:3:4 [atomic ratio] or In:Ga:Zn=1:1:0.5 [atomic ratio] is used. As the oxide 530b, a metal oxide having In:Ga:Zn=4:2:3 [atomic ratio] or In:Ga:Zn=3:1:2 [atomic ratio] is used. As the oxide 530c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Furthermore, specific examples of the case where the oxide 530c has a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500E can have a high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulating layer 550 side is expected. More specifically, the oxide 530c has a stacked-layer structure and the oxide that does not contain In is positioned at the upper part of the stacked-layer structure, whereby the amount of In that would diffuse to the insulating layer 550 side can be reduced. Since the insulating layer 550 functions as a gate insulating layer, In diffusion into the insulating layer 550 would cause poor characteristics of the transistor. Thus, when the oxide 530c has a stacked-layer structure, a highly reliable display device can be provided.

A metal oxide functioning as an oxide semiconductor is preferably used as the oxide 530. For example, as the metal oxide to be the channel formation region in the oxide 530, a metal oxide having a bandgap of 2 eV or more, preferably 2.5 eV or more is preferably used. With the use of a metal oxide having such a wide bandgap, the off-state current of the transistor can be reduced. With the use of such a transistor, a semiconductor device with low power consumption can be provided.

This embodiment can be implemented in an appropriate combination with the structures described in the other embodiments and the like.

Embodiment 5

In this embodiment, examples of electronic components and electronic devices in which the memory device or the like described in the above embodiment is incorporated will be described.

<Electronic Components>

First, examples of electronic components in which the memory device 300 is incorporated will be described with reference to FIGS. 18(A) and 18(B).

Figure 18A:
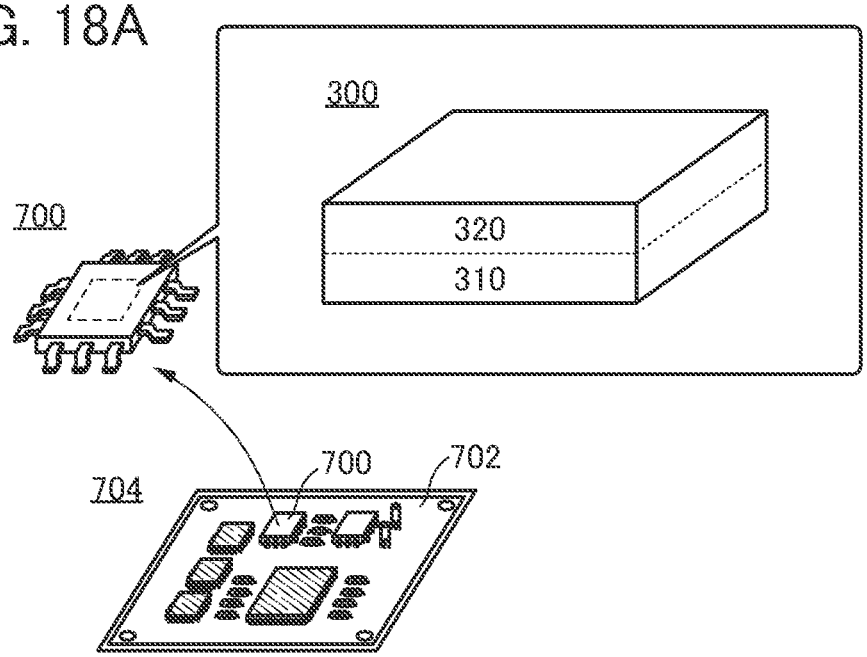
[FIGS. 18A and 18B] Diagrams each illustrating an example of an electronic component.

FIG. 18(A) is a perspective view of an electronic component 700 and a substrate on which the electronic component 700 is mounted (a mounting board 704). The electronic component 700 illustrated in FIG. 18(A) is an IC chip and includes a lead and a circuit portion. The electronic component 700 is mounted on a printed circuit board 702, for example. A plurality of such IC chips are combined and electrically connected to each other on the printed circuit board 702, whereby the mounting board 704 is completed.

The memory device 300 described in the above embodiment is provided as the circuit portion of the electronic component 700. Although a QFP (Quad Flat Package) is used as a package of the electronic component 700 in FIG. 18(A), the embodiment of the package is not limited thereto.

Figure 18B:
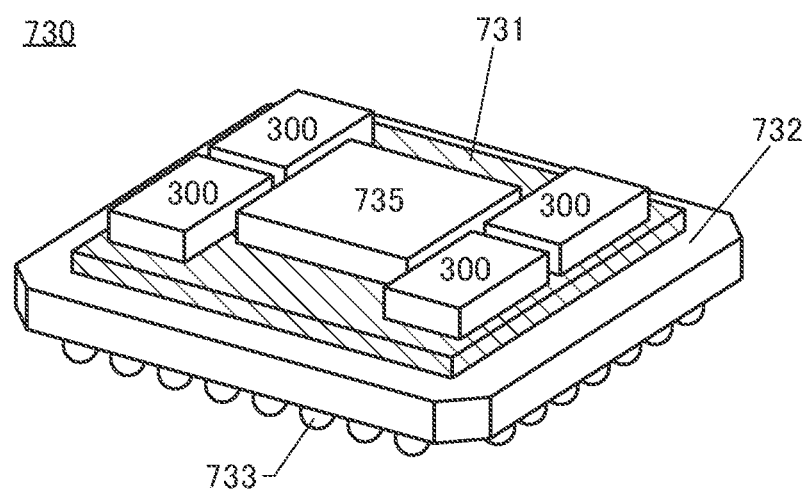

FIG. 18(B) is a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of memory devices 300 are provided on the interposer 731.

The electronic component 730 using the memory devices 300 as high bandwidth memory (HBM) is shown as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases. A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer does not easily occur. Furthermore, the surface of a silicon interposer has high planarity, so that a poor connection between the silicon interposer and an integrated circuit provided on the silicon interposer does not easily occur. It is particularly preferable to use a silicon interposer for a 2.5D package (2.5D mounting) in which a plurality of integrated circuits are arranged side by side on an interposer.

A heat sink (a radiator plate) may be provided to overlap the electronic component 730. In the case of providing a heat sink, the heights of integrated circuits provided on the interposer 731 are preferably equal to each other. For example, in the electronic component 730 described in this embodiment, the heights of the memory devices 300 and the semiconductor device 735 are preferably equal to each other.

To mount the electronic component 730 on another substrate, an electrode 733 may be provided on the bottom portion of the package substrate 732. FIG. 18(B) illustrates an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Devices>

Figure 19:
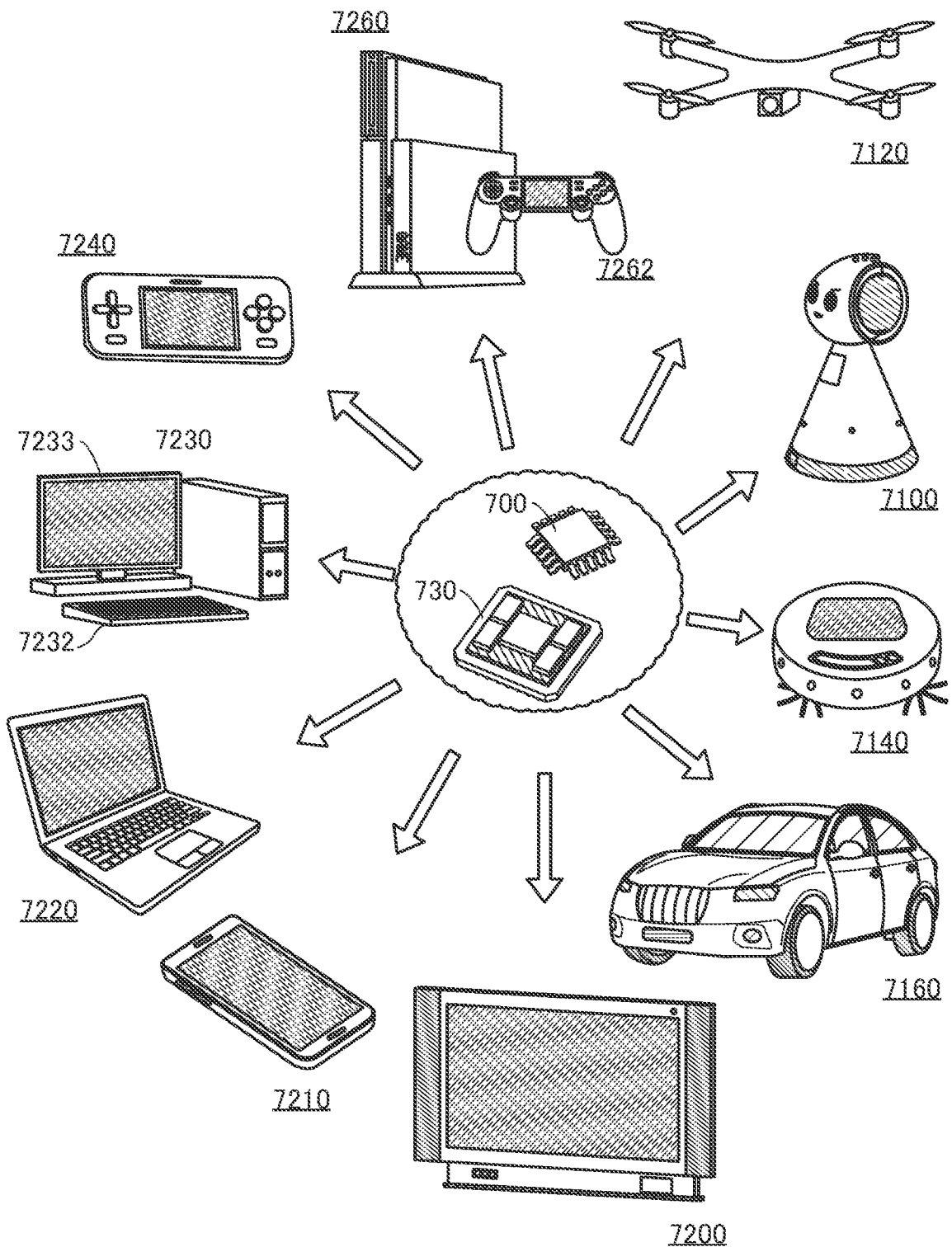
[FIG. 19] A diagram illustrating examples of electronic devices.

Next, examples of electronic devices including the above electronic component will be described with reference to FIG. 19.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. Furthermore, the robot 7100 has a function of moving with the use of the moving mechanism. The robot 7100 can take images of the surroundings with the use of the camera, and can analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, a cleaning robot 7300 is provided with a tire, an inlet, and the like. The cleaning robot 7300 can run autonomously, detect dust, and vacuum the dust through the inlet provided on the bottom surface.

For example, the electronic component 730 can judge whether there is an obstacle such as a wall, furniture, or a step by analyzing an image taken by the cameras. In the case where an object that is likely to be caught in the brush, such as a wire, is detected by image analysis, the rotation of the brush can be stopped.

An automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, PCs (personal computers) 7220 and 7230, a game console 7240, a game console 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a notebook PC and a desktop PC. To the PC 7230, a keyboard 7232 and a monitor device 7233 can be connected with or without a wire. The game console 7240 is an example of a portable game console. The game console 7260 is an example of a stationary game console. To the game console 7260, a controller 7262 is connected with or without a wire. The electronic component 700 and/or the electronic component 730 can be incorporated in the controller 7262.

This embodiment can be implemented in an appropriate combination with the structures described in the other embodiments and the like.

Embodiment 6

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 20 schematically illustrates some structure examples of removable memory devices. The semiconductor device described in the above embodiment is processed into a packaged memory chip and used in a variety of storage devices and removable memories, for example.

FIG. 20(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

FIG. 20(B) is a schematic external diagram of an SD card, and FIG. 20(C) is a schematic diagram of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113, in which case data can be read from and written in the memory chip 1114 by radio communication between a host device and the SD card 1110. The semiconductor device described in the above embodiment can be incorporated in the memory chip 1114 or the like on the substrate 1113.

FIG. 20(D) is a schematic external diagram of an SSD, and FIG. 20(E) is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments and the like.

Unless otherwise specified, an on-state current in this specification refers to a drain current of a transistor in an on state. Unless otherwise specified, the on state (sometimes abbreviated as on) refers to a state where the voltage between its gate and source ($V_G$) is higher than or equal to the threshold voltage ($V_{th}$) in an n-channel transistor, and a state where $V_G$ is lower than or equal to $V_{th}$ in a p-channel transistor. For example, the on-state current of an n-channel transistor refers to a drain current when $V_G$ is higher than or equal to $V_{th}$. Furthermore, the on-state current of a transistor depends on a voltage between a drain and a source ($V_D$) in some cases.

Unless otherwise specified, an off-state current in this specification refers to a drain current of a transistor in an off state. Unless otherwise specified, the off state (sometimes abbreviated as off) refers to a state where $V_G$ is lower than $V_{th}$ in an n-channel transistor, and a state where $V_G$ is higher than $V_{th}$ in a p-channel transistor. For example, the off-state current of an n-channel transistor refers to a drain current when $V_G$ is lower than $V_{th}$. The off-state current of a transistor depends on $V_G$ in some cases. Thus, "the off-state current of a transistor is lower than $10^{-21}$ A" may mean that there is $V_G$ at which the off-state current of the transistor is lower than $10^{-21}$ A.

Furthermore, the off-state current of a transistor depends on $V_D$ in some cases. Unless otherwise specified, the off-state current in this specification may refer to an off-state current at $V_D$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may refer to an off-state current at $V_D$ used in a semiconductor device or the like including the transistor.

In this specification and the like, when there is a description which explicitly states that X and Y are connected, the case where X and Y are electrically connected and the case where X and Y are directly connected are regarded as being disclosed in this specification and the like.

Here, X and Y each denote an object (e.g., a device, an element, a circuit, a wiring, an electrode, a terminal, a conductive film, or a layer).

An example of the case where X and Y are directly connected is the case where X and Y are connected without an element that enables electrical connection between X and Y (e.g., a switch, a transistor, a capacitor, an inductor, a resistor, a diode, a display element, a light-emitting element, or a load).

In an example of the case where X and Y are electrically connected, at least one element that enables electrical connection between X and Y (e.g., a switch, a transistor, a capacitor, an inductor, a resistor, a diode, a display element, a light-emitting element, or a load) can be connected between X and Y. Note that a switch has a function of controlling whether current flows or not by being in a conduction state (an on state) or a non-conduction state (an off state). Alternatively, the switch has a function of selecting and changing a current path. Note that the case where X and Y are electrically connected includes the case where X and Y are directly connected.

EXAMPLE 1

In this example, the operating frequency of the DOSRAM described in Embodiment 2 was estimated. The structure of the DOSRAM was assumed to include a transistor having a channel length (L) of 60 nm and a channel width (W) of 60 nm, and a capacitor having a storage capacitance of 3.5 fF.

An "allowable voltage fluctuation", which is one of specifications required for a DOSRAM, is the allowable amount of fluctuation of a voltage applied to the capacitor of a DOSRAM after data writing. A "data retention time" of a DOSRAM can be said to be the time it takes for the fluctuation amount of a voltage applied to the capacitor included in the DOSRAM to reach the allowable voltage fluctuation. In this example, the "allowable voltage fluctuation" was 0.2 V, and the "data retention time" was the time taken for a voltage applied to the capacitor (a storage capacitance of 3.5 fF) to decrease by 0.2 V from the state after data writing. For example, in this example, DOSRAM data retention of one hour means that the time it takes for a potential applied to the capacitor included in the DOSRAM to decrease by 0.2 V after data writing is one hour.

The data retention time of a DOSRAM depends on the amount of cutoff current of the transistor included in the DOSRAM. As described above, the cutoff current (Icut) of the transistor is $I_D$ of the transistor at $V_G=0$ V. For example, in the case where the data retention characteristics of the DOSRAM depend on only the amount of Icut of the transistor included in the DOSRAM, the data retention time of the DOSRAM is inversely proportional to the amount of Icut of the transistor included in the DOSRAM.

In the case where Icut of the transistor included in the DOSRAM is known, the data retention time of the DOSRAM can be calculated by dividing the amount of charge lost from the capacitor during data retention (0.7 fC corresponding to the product of the capacitor's storage capacitance (3.5 fF) and the amount of decrease of the voltage applied to the capacitor (0.2 V)) by Icut. Furthermore, when a DOSRAM retention time target is set and the above charge amount 0.7 fC is divided by the retention time, a value of Icut required for the transistor included in the DOSRAM (hereinafter referred to as Icut0) can be estimated. When the retention time target is one hour, Icut required for the transistor was approximately 200 zA (200× $10^{-21}$ A). By adjusting the back gate voltage so that Icut0 illustrated in FIG. 5 becomes 200 zA, a NOSRAM having a high operating frequency in a wide temperature range can be achieved. In this example, the relation between the back gate voltage and the operating frequency of the DOSRAM was evaluated.

To estimate the operating frequency of the DOSRAM, the transistor 500A illustrated in FIG. 13 was fabricated, and parameters needed for the estimation were extracted from its electrical characteristics. In this example, the above transistor 500A was assumed as the transistor M11 illustrated in FIG. 10(A), and the operating frequency of the DOSRAM was estimated.

As for the size of the fabricated transistor 500A, L (channel length) was 0.38 μm and W (channel width) was 0.23 μm. Three kinds of samples were prepared: Sample A, Sample B, and Sample C.

In the fabricated transistor 500A, the oxide 530a is made of an In—Ga—Zn oxide having a thickness of 5 nm. The oxide 530a was formed by a DC sputtering method using an In—Ga—Zn oxide target with an atomic ratio of In:Ga:Zn=1:3:4. The sputtering method was performed at a substrate temperature of 200° C. in a mixed gas of argon and oxygen.

In the fabricated transistor 500A, the oxide 530b is made of an In—Ga—Zn oxide having a thickness of 20 nm. The oxide 530b was formed by a DC sputtering method using an In—Ga—Zn oxide target with an atomic ratio of In:Ga:Zn=4:2:4.1. The sputtering method was performed at a substrate temperature of 200° C. in a mixed gas of argon and oxygen.

In the fabricated transistor 500A, the oxide 530c is made of an In—Ga—Zn oxide having a thickness of 5 nm. The oxide 530c was formed by a DC sputtering method using an In—Ga—Zn oxide target with an atomic ratio of In:Ga:Zn=4:2:4.1. The sputtering method was performed at a substrate temperature of 130° C. in a mixed gas of argon and oxygen.

After the transistor 500A was fabricated, Sample A and Sample B were subjected to heat treatment at 400° C. for four hours in a nitrogen gas atmosphere. Sample C was subjected to heat treatment at 400° C. for eight hours in a nitrogen gas atmosphere.

Next, $I_D$-$V_G$ measurement of the transistor 500A was performed in Sample A, Sample B, and Sample C. The $I_D$-$V_G$ measurement was performed under conditions where a drain voltage $V_D$ of the transistor was +1.08 V, a source voltage $V_S$ was 0 V, and the gate voltage $V_G$ was swept from −1.0 V to +3.3 V. The back gate voltages $V_{BG}$ were four levels of −2 V, −3 V, −4 V, and −5 V. Measurement temperatures were three levels of −40° C., 27° C., and 85° C. Specifically, $I_D$-$V_G$ measurement of the transistor was performed in a state in which a 5-inch-square substrate where the transistor subjected to the measurement was formed was fixed on a thermochuck set at each of the above temperatures. In addition, three elements were measured for each of the back gate voltages $V_{BG}$ and the measurement temperatures.

A shift voltage (Vsh) and a subthreshold swing value (Svalue) of the transistor were calculated from the obtained $I_D$-$V_G$ curve. The shift voltage (Vsh) is defined as, in the $I_D$-$V_G$ curve of the transistor, $V_G$ at which the tangent at a point where the slope of the curve is the steepest intersects the straight line of $I_D$=1 pA.

In the transistor 500A, a metal oxide is used in a channel formation region as described in <Manufacturing method of semiconductor device> in Embodiment 1. The transistor using a metal oxide in the channel formation region has an extremely low leakage current in an off state, compared with a transistor using Si in a channel formation region, for example. For that reason, in the transistor using a metal oxide in the channel formation region, it is sometimes difficult to detect Icut by actual measurement. Since it was difficult to actually measure Icut of the transistor 500A, Icut was estimated from Vsh and Svalue, which were obtained from the above $I_D$-$V_G$ curve, by extrapolation using Formula (1). Note that as shown in Formula (1), $I_D$ was assumed to decrease monotonically according to Svalue until the off-state current of the transistor reaches $V_G$=0 V.

[Formula 1]

$$I_{cut} = 1 \times 10^{\left(-12 - \frac{V_{sh}}{S_{value}}\right)} \quad (1)$$

Here, a method of estimating the DOSRAM operating frequency is described. The DOSRAM operating frequency is the inverse of a data write cycle of the DOSRAM. The data write cycle of the DOSRAM is a parameter set by a charging time of the capacitor included in the DOSRAM, for example. In this example, the time corresponding to 40% of the data write cycle of the DOSRAM (the inverse of the DOSRAM operating frequency) is set as the charging time of the capacitor included in the DOSRAM.

The DOSRAM operating frequency depends on the charging time of the capacitor included in the DOSRAM. Therefore, when estimating the DOSRAM operating frequency, first, it is necessary to know the charging time of the capacitor included in the DOSRAM in advance. In this example, a state where a potential of 0.55 V or higher is applied to the capacitor (a storage capacitance of 3.5 fF) included in the DOSRAM was defined as "a charged state" of the capacitor. Accordingly, in this example, the time from when DOSRAM data write operation starts until when the potential applied to the capacitor reaches 0.55 V corresponds to the charging time of the capacitor included in the DOSRAM.

Figure 21A:
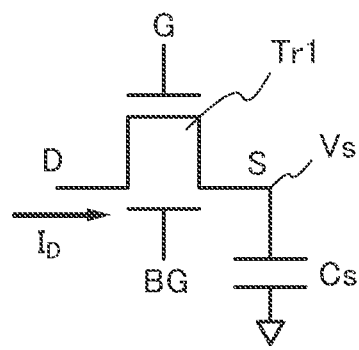
[FIGS. 21A to 21C] Diagrams illustrating a method for calculating operating frequency.

The charging time of the capacitor included in the DOSRAM depends on the amount of $I_D$ of the transistor included in the DOSRAM at the time of DOSRAM data writing. Hence, in this example, DOSRAM data write operation was reproduced by actual application of a potential assumed to be applied to the transistor included in the DOSRAM at the time of DOSRAM data writing (see FIG. 21(A)) to the transistor (L/W=0.34/0.22 μm) according to one embodiment of the present invention, and $I_D$ of the transistor at that time was measured. In FIG. 21(A), the case where data is written to a capacitor $C_S$ through a transistor Tr1 is assumed. D, G, and S represent a drain, a gate, and a source, respectively. The potential of the source of the transistor Tr1 (a voltage applied to the capacitor $C_S$) is represented by $V_S$. By turning on the transistor Tr1, the current $I_D$ flows and the capacitor $C_S$ is charged. Specifically, $I_D$ of the transistor was measured under conditions where the gate voltage $V_G$ of the transistor was +2.97 V, the drain voltage $V_D$ was +1.08 V, and the source voltage $V_S$ was swept from 0 V to +0.55 V. The back gate voltages $V_{BG}$ were four levels of −2 V, −3 V, −4 V, and −5 V. Measurement temperatures were three levels of −40° C., 27° C., and 85° C.

The value of $I_D$ obtained from the transistor 500A (L/W=0.34/0.22 μm) was corrected to correspond to the size of a transistor (L/W=60/60 nm) that was assumed to be included in the DOSRAM.

Figure 21B:
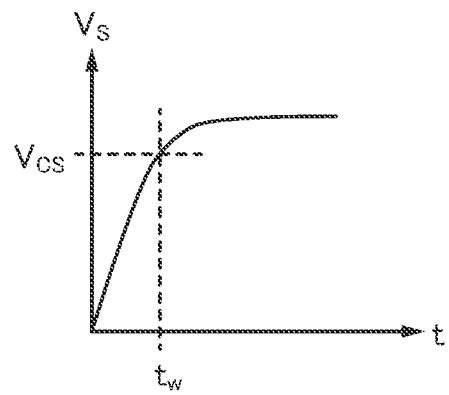

Charging is regarded as being complete when $V_S$ reaches a write judgement voltage $V_{CS}$ after DOSRAM charging is started. The time in that moment is denoted as a charging time tw (see FIG. 21(B)). When a charge stored in a capacitor that is included in the DOSRAM and has a storage capacitance $C_S$ [F] is Q [C], the charging time is tw [sec], a potential applied to the capacitor by charging is Vcs (=$V_S$) [V], and the drain current of the transistor included in the DOSRAM is $I_D$ [A], the relation of Formula (2) shown below is established between the parameters.

[Formula 2]

$$Q = \int_0^{tw} I_D dt = C_S \times V_{cs} \quad (2)$$

Figure 21C:
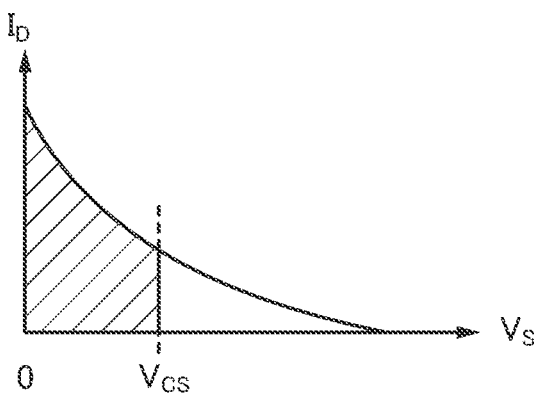

By modification of Formula (2), the charging time tw of the capacitor included in the DOSRAM can be represented by Formula (3) shown below (see FIG. 21(C)).

[Formula 3]

$$t_W = \int_0^{V_{CS}} \frac{C_S}{I_D} dV_S \quad (3)$$

In this example, 3.5 fF was substituted for $C_S$ in Formula (3), +0.55 V was substituted for Vcs, and $I_D$ obtained from the above $I_D$-$V_S$ measurement was substituted, whereby the charging time tw of the capacitor included in the DOSRAM was calculated.

The relation between an operating frequency f of the DOSRAM and the charging time $t_w$ can be represented by Formula (4).

[Formula 4]

$$f = \frac{A}{t_W} \quad (4)$$

In Formula (4), A is a coefficient. In the DOSRAM, the time required for writing within the time of one operation is assumed to be 40%; hence, in this example, the operating frequency f was calculated with a coefficient A of 0.4.

Figure 22A:
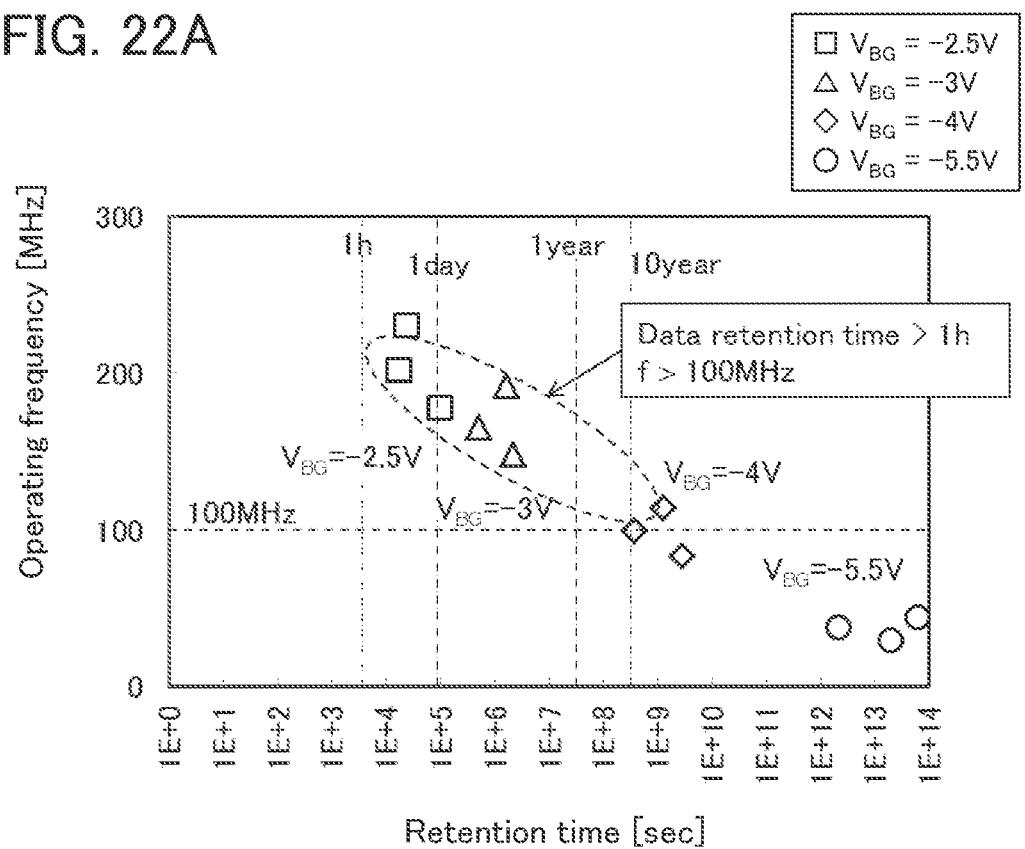
[FIGS. 22A and 22B] Diagrams illustrating calculation results of operating frequency.
Figure 22B:
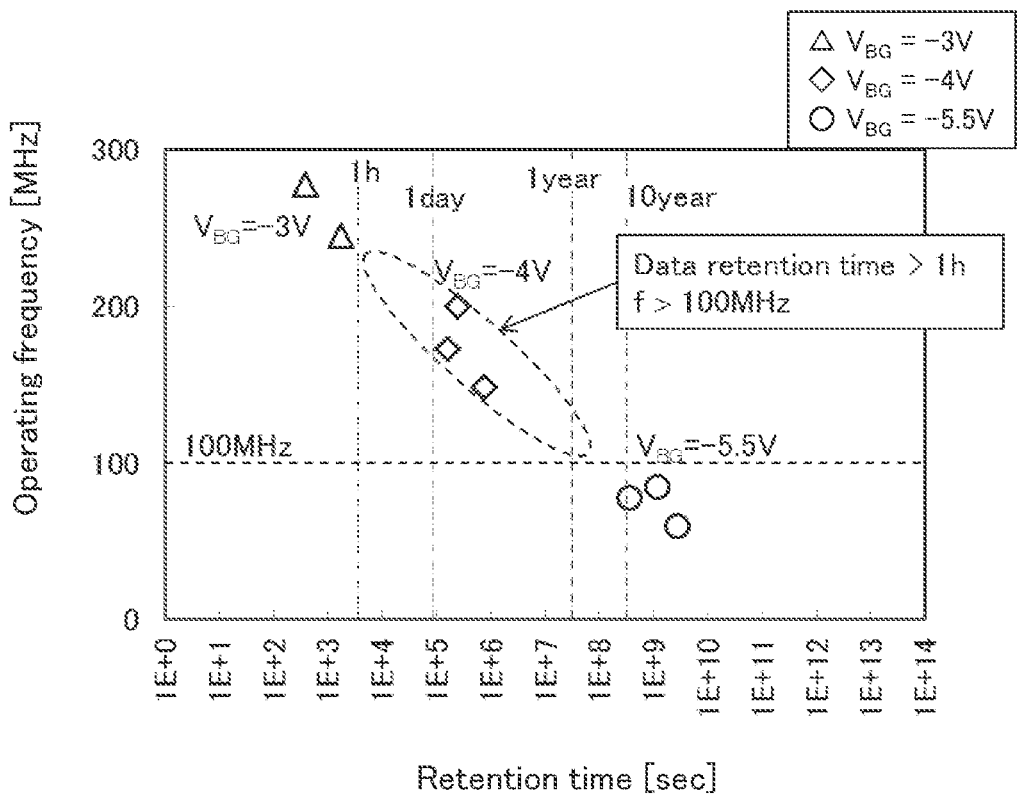
Figure 23:
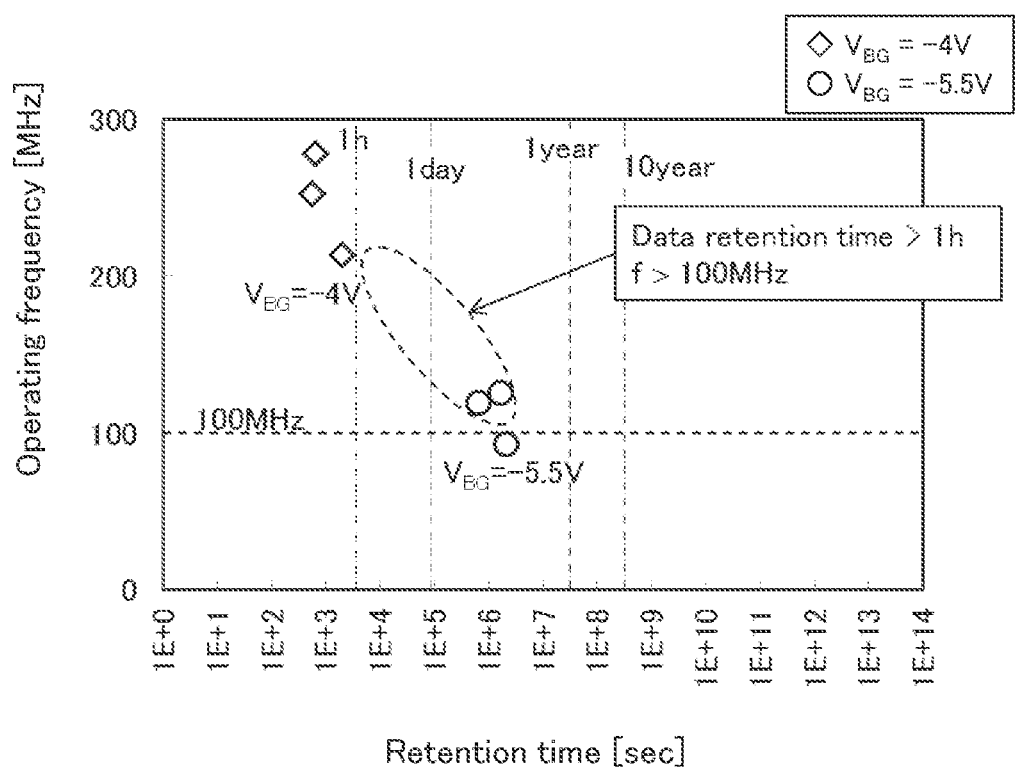
[FIG. 23] A diagram illustrating calculation results of operating frequency.

In the case of Sample A, FIG. 22(A), FIG. 22(B), and FIG. 23 show the operating frequency of the DOSRAM with a power supply voltage of 2.5 V. FIG. 22(A), FIG. 22(B), and FIG. 23 show the estimation results at −40° C., 27° C., and 85° C., respectively. FIG. 22(A), FIG. 22(B), and FIG. 23 show estimated operating frequencies at back gate voltages $V_{BG}$ of −2.5 V, −3 V, −4 V, and −5.5 V. In FIG. 22(A), FIG. 22(B), and FIG. 23, the horizontal axis represents the data retention time of the DOSRAM, and the vertical axis represents the operating frequency of the DOSRAM. As shown in FIG. 22(A), FIG. 22(B), and FIG. 23, it was demonstrated that the operating frequency tends to increase as the back gate voltage $V_{BG}$ becomes higher. It was also demonstrated that an operating frequency of 100 MHz or higher and a data retention time of one hour or longer are expected at a power supply voltage of 2.5 V. It was demonstrated that correcting the back gate voltage $V_{BG}$ by using the semiconductor device 100 enables operation at a high operating frequency in a wide temperature range.

Figure 24A:
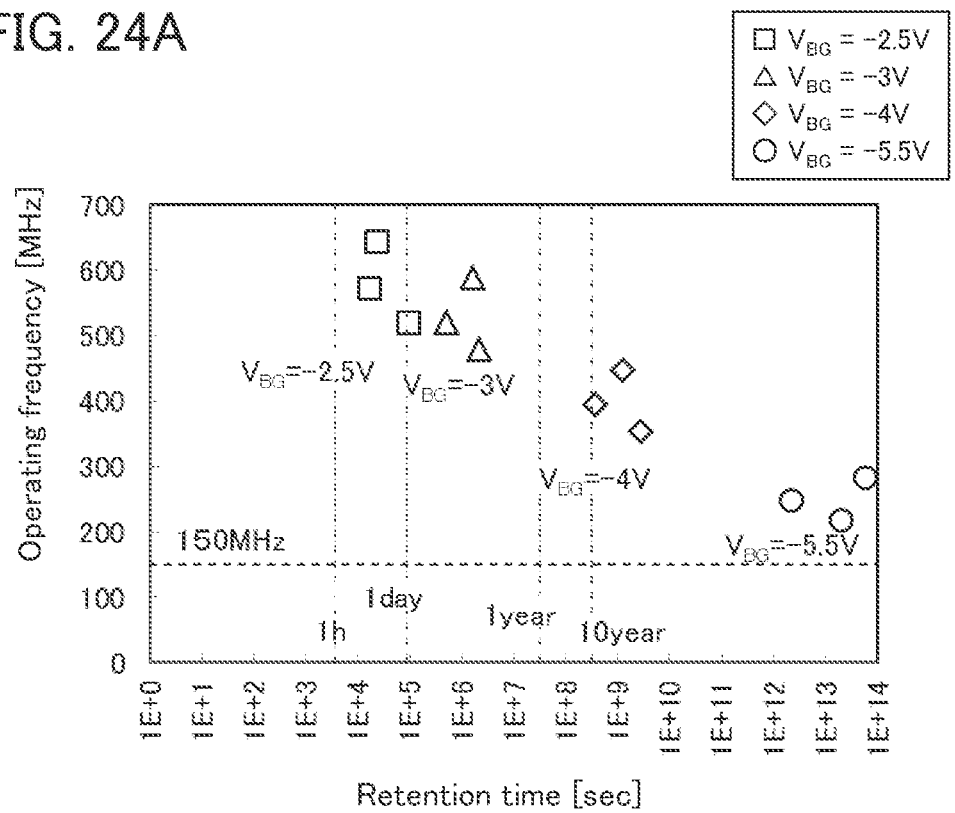
[FIGS. 24A and 24B] Diagrams illustrating calculation results of operating frequency.
Figure 24B:
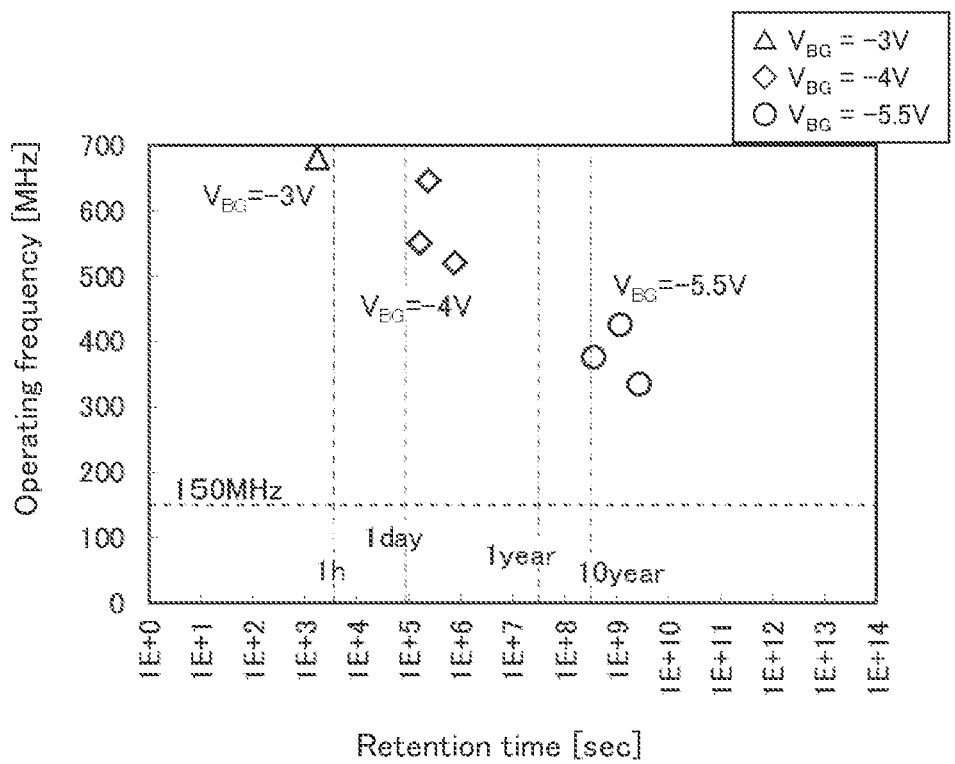
Figure 25:
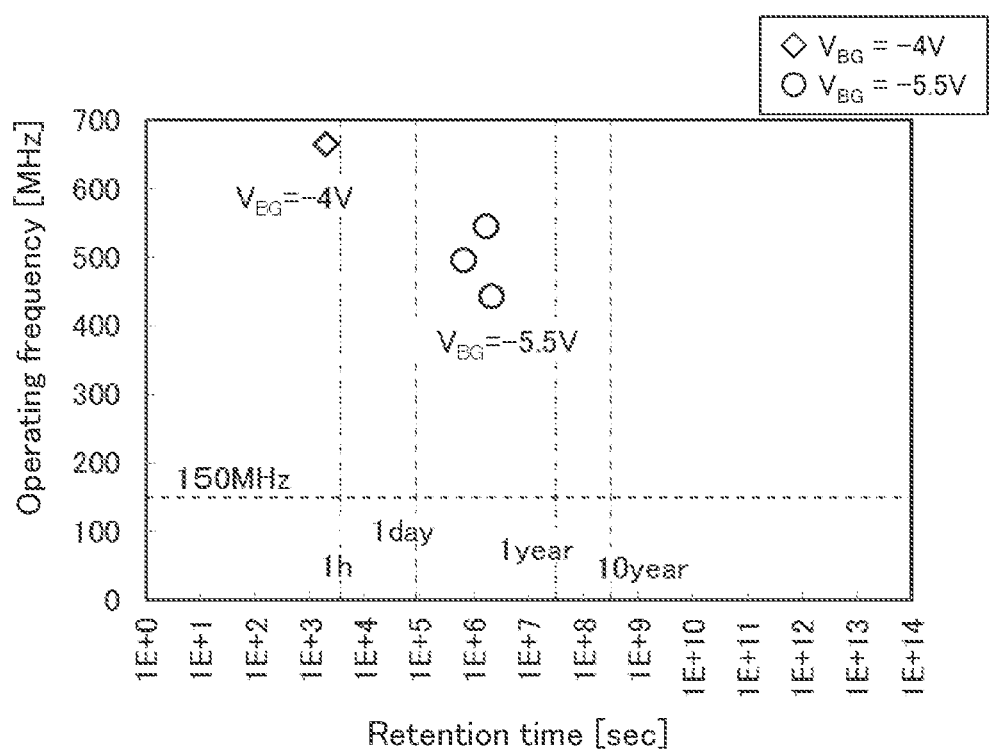
[FIG. 25] A diagram illustrating calculation results of operating frequency.

In the case of Sample A, FIG. 24(A), FIG. 24(B), and FIG. 25 show the operating frequency of the DOSRAM with a power supply voltage of 3.3 V. FIG. 24(A), FIG. 24(B), and FIG. 25 show the estimation results at −40° C., 27° C., and 85° C., respectively. FIG. 24(A), FIG. 24(B), and FIG. 25 show estimated operating frequencies at back gate voltages $V_{BG}$ of −2.5 V, −3 V, −4 V, and −5.5 V. In FIG. 24(A), FIG. 24(B), and FIG. 25, the horizontal axis represents the data retention time of the DOSRAM, and the vertical axis represents the operating frequency of the DOSRAM. As shown in FIG. 24(A), FIG. 24(B), and FIG. 25, it was demonstrated that the operating frequency tends to increase as the back gate voltage $V_{BG}$ becomes higher. It was also demonstrated that an operating frequency of 150 MHz or higher and a data retention time of one hour or longer are expected at a power supply voltage of 3.3 V. It was demonstrated that correcting the back gate voltage $V_{BG}$ by using the semiconductor device 100 enables operation at a high operating frequency in a wide temperature range.

Figure 26:
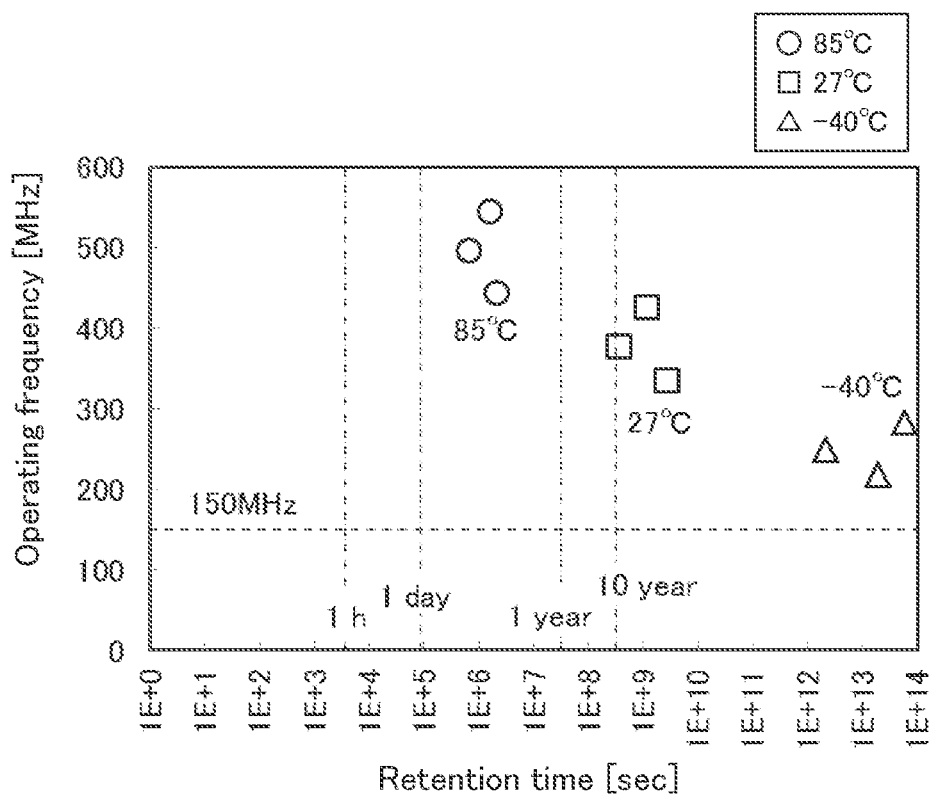
[FIG. 26] A diagram illustrating calculation results of operating frequency.

Next, data in the case where the back gate voltage $V_{BG}$ is not adjusted is described for comparison. FIG. 26 shows the operating frequency of the DOSRAM including Sample A when the power supply voltage was 3.3 V and the back gate voltage $V_{BG}$ was −5.5 V. In FIG. 26, the horizontal axis represents the data retention time of the DOSRAM, and the vertical axis represents the operating frequency of the DOSRAM. It was demonstrated that the operating frequency decreases as the temperature decreases.

Figure 27A:
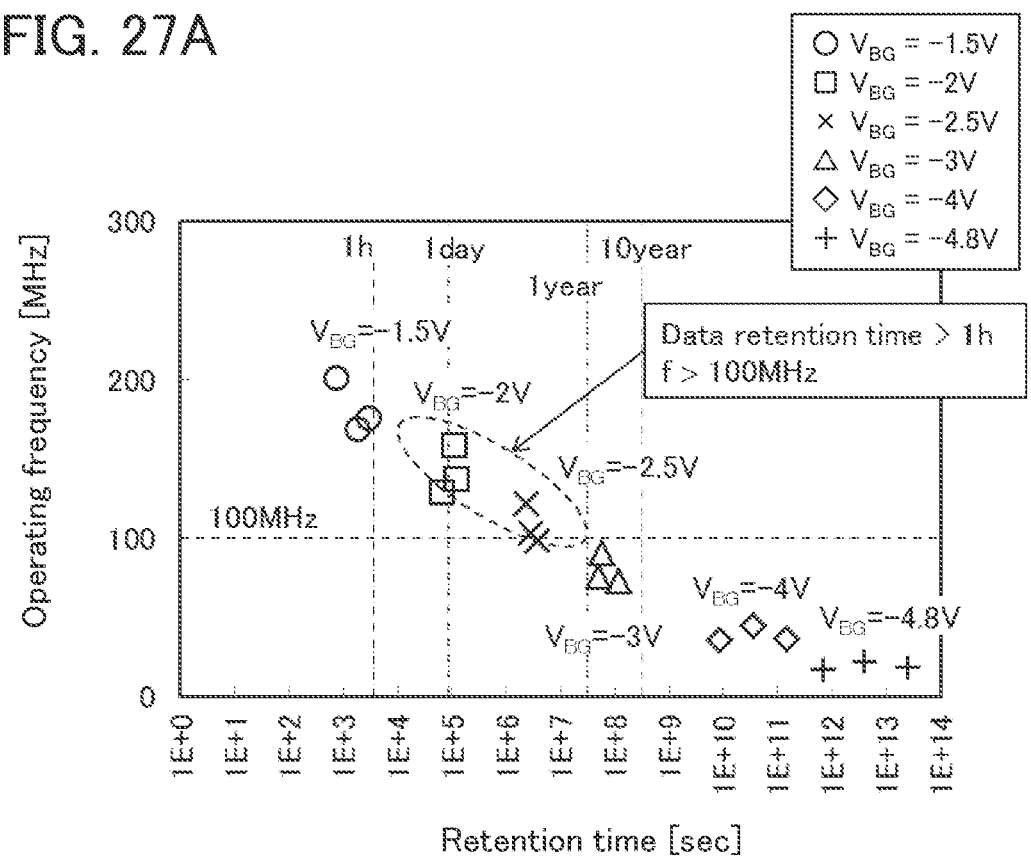
[FIGS. 27A and 27B] Diagrams illustrating calculation results of operating frequency.
Figure 27B:
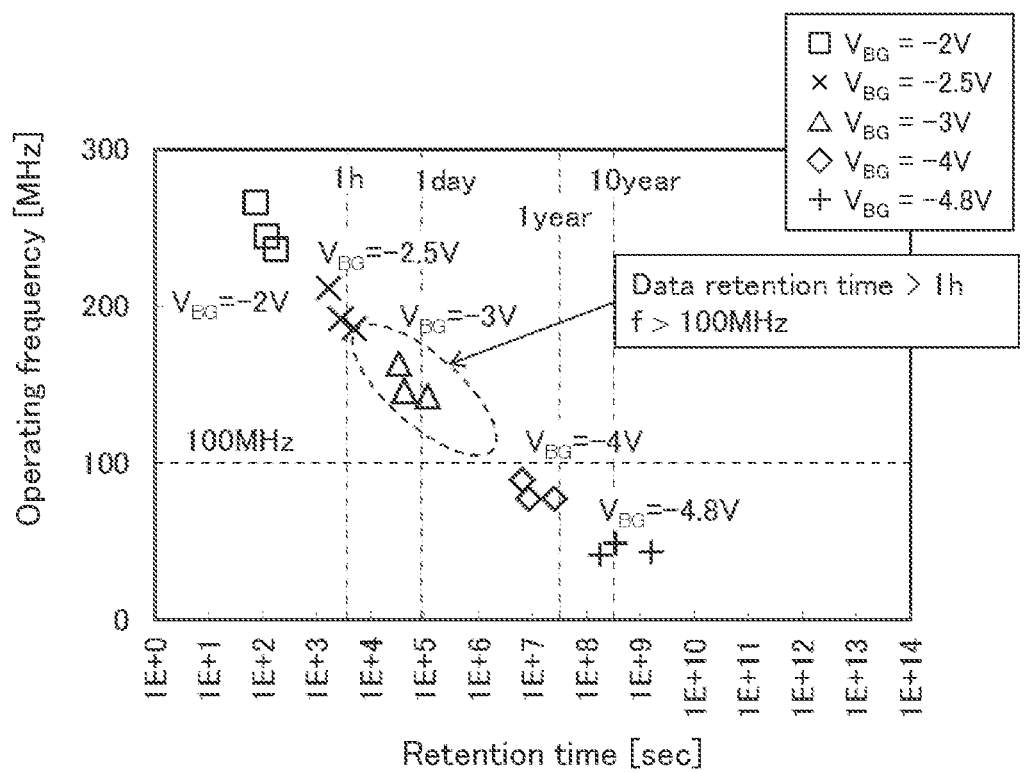
Figure 28:
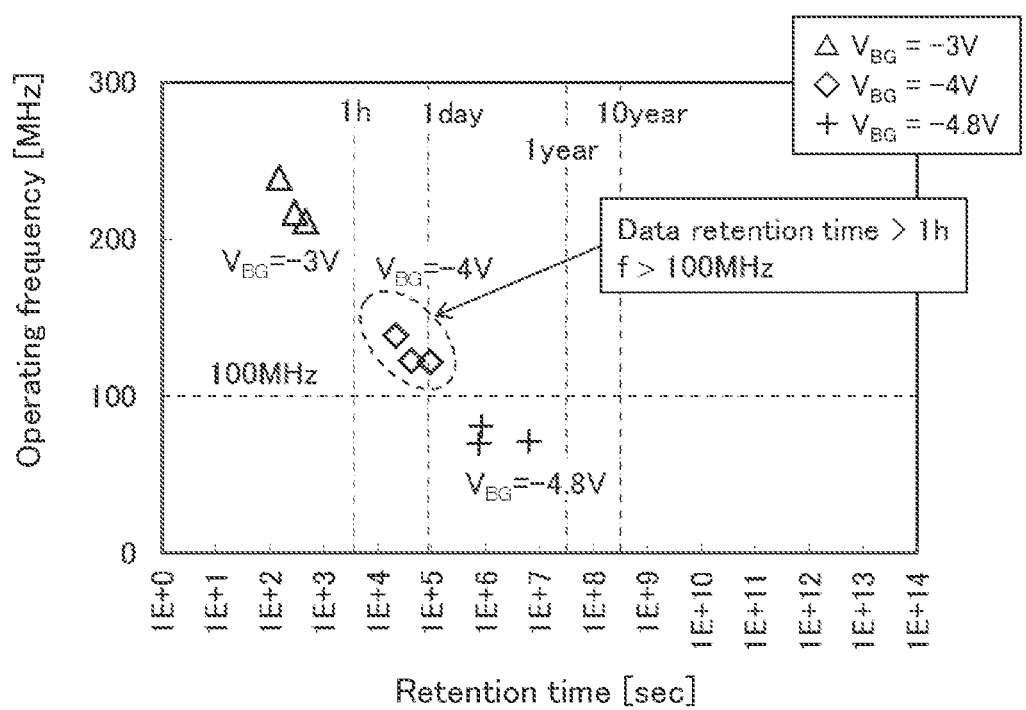
[FIG. 28] A diagram illustrating calculation results of operating frequency.

In the case of Sample B, FIG. 27(A), FIG. 27(B), and FIG. 28 show the operating frequency of the DOSRAM with a power supply voltage of 2.5 V. FIG. 27(A), FIG. 27(B), and FIG. 28 show the estimation results at −40° C., 27° C., and 85° C., respectively. FIG. 27(A), FIG. 27(B), and FIG. 28 show estimated operating frequencies at back gate voltages $V_{BG}$ of −1.5 V, −2 V, −2.5 V, −3 V, −4 V, and −4.8 V. In FIG. 27(A), FIG. 27(B), and FIG. 28, the horizontal axis represents the data retention time of the DOSRAM, and the vertical axis represents the operating frequency of the DOSRAM. It was demonstrated that with Sample B, an operating frequency of 100 MHz or higher and a data retention time of one hour or longer are expected at a power supply voltage of 2.5 V, as with Sample A.

Figure 29A:
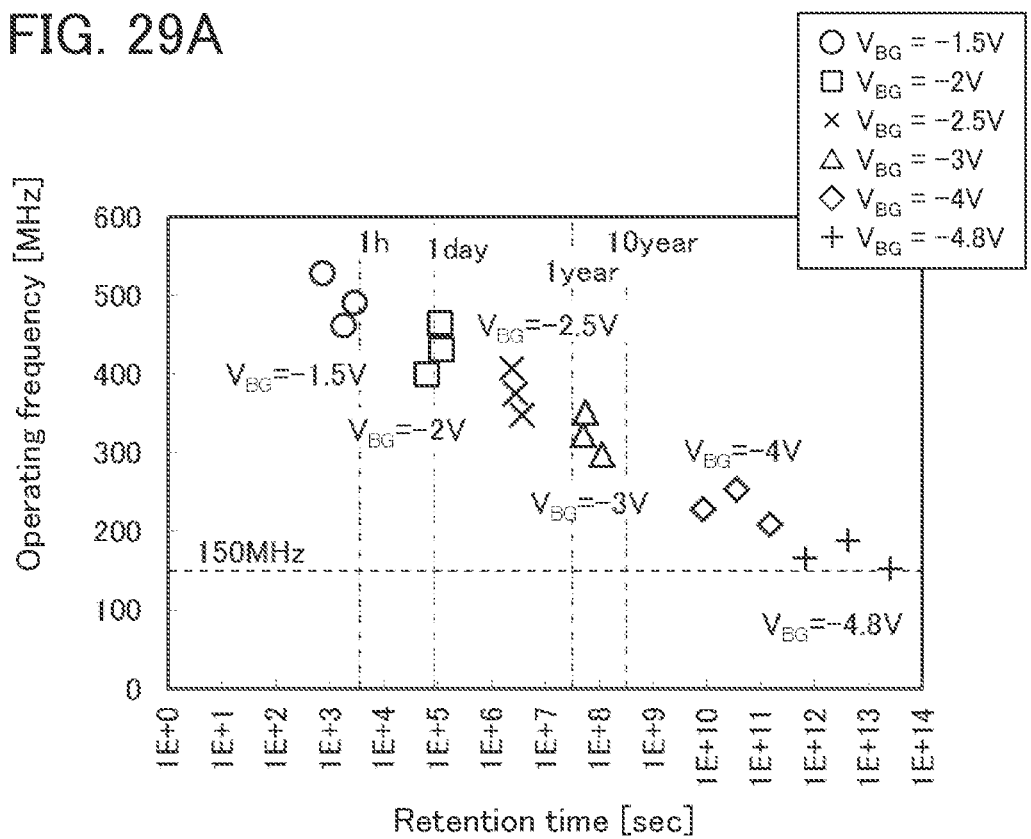
[FIGS. 29A and 29B] Diagrams illustrating calculation results of operating frequency.
Figure 29B:
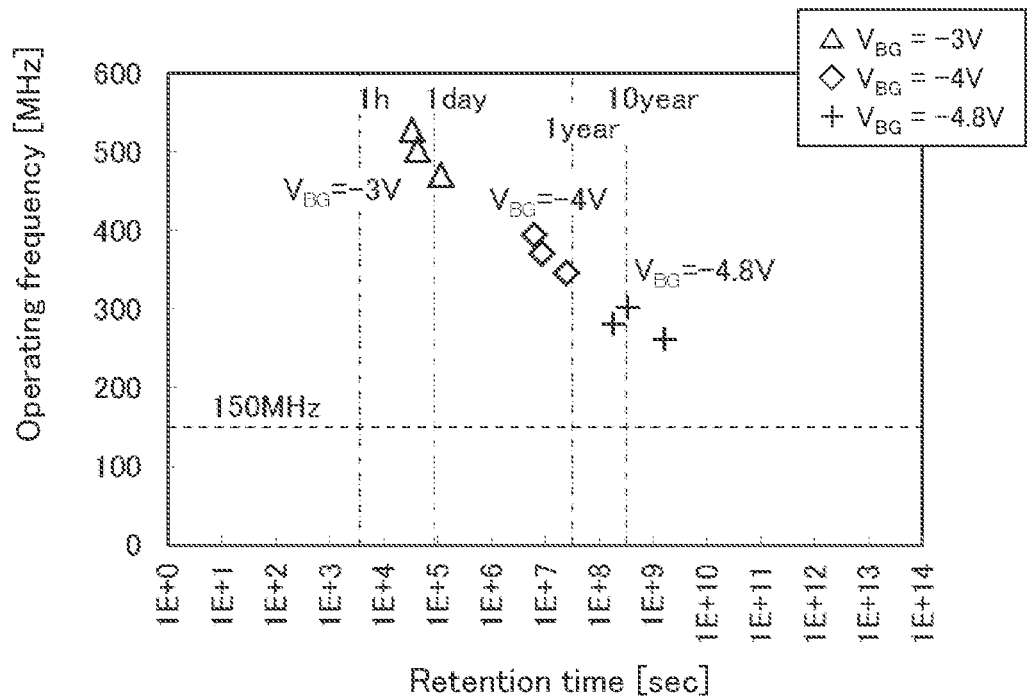
Figure 30:
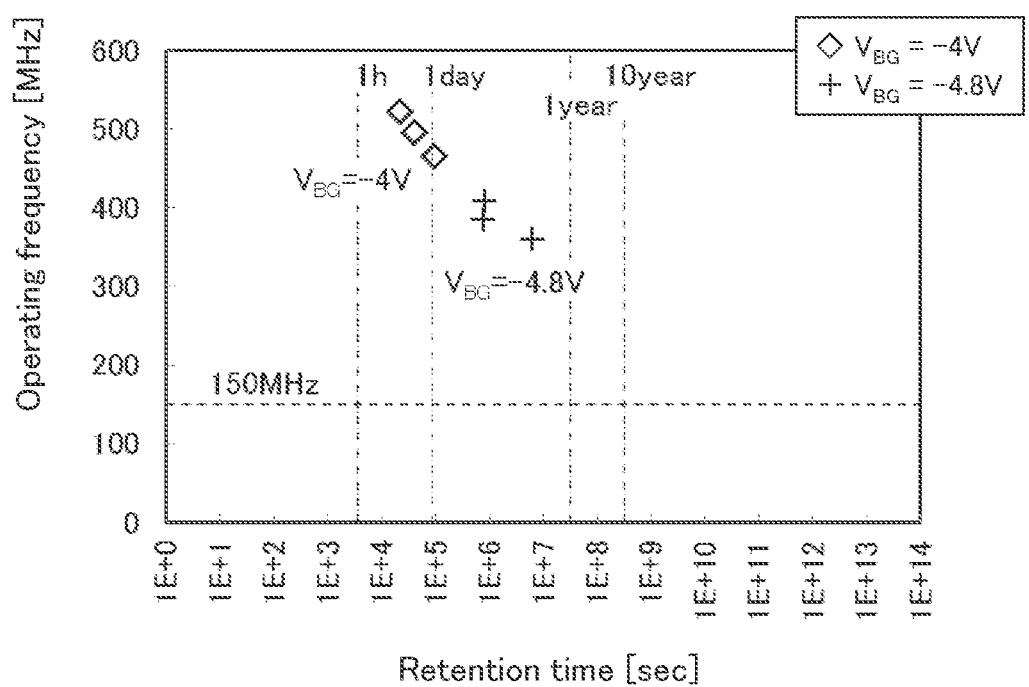
[FIG. 30] A diagram illustrating calculation results of operating frequency.

In the case of Sample B, FIG. 29(A), FIG. 29(B), and FIG. 30 show the operating frequency of the DOSRAM with a power supply voltage of 3.3 V. FIG. 29(A), FIG. 29(B), and FIG. 30 show the estimation results at −40° C., 27° C., and 85° C., respectively. FIG. 29(A), FIG. 29(B), and FIG. 30 show estimated operating frequencies at back gate voltages $V_{BG}$ of −1.5 V, −2 V, −2.5 V, −3 V, −4 V, and −4.8 V. In FIG. 29(A), FIG. 29(B), and FIG. 30, the horizontal axis represents the data retention time of the DOSRAM, and the vertical axis represents the operating frequency of the DOSRAM. It was demonstrated that with Sample B, an operating frequency of 150 MHz or higher and a data retention time of one hour or longer are expected at a power supply voltage of 3.3 V, as with Sample A.

Figure 31:
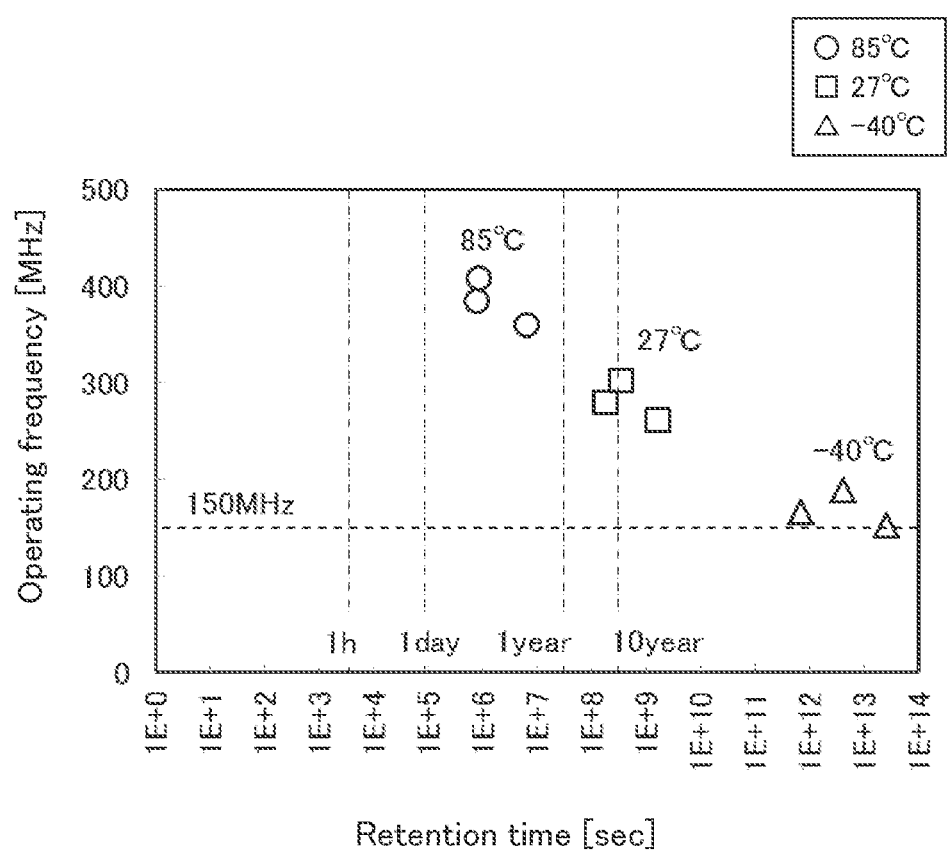
[FIG. 31] A diagram illustrating calculation results of operating frequency.

Next, data in the case where the back gate voltage $V_{BG}$ is not adjusted is described for comparison. FIG. 31 shows the operating frequency of the DOSRAM including Sample B when the power supply voltage was 3.3 V and the back gate voltage $V_{BG}$ was −4.8 V. In FIG. 31, the horizontal axis represents the data retention time of the DOSRAM, and the vertical axis represents the operating frequency of the DOSRAM. It was demonstrated that with Sample B, the operating frequency decreases as the temperature decreases, as with Sample A.

Figure 32:
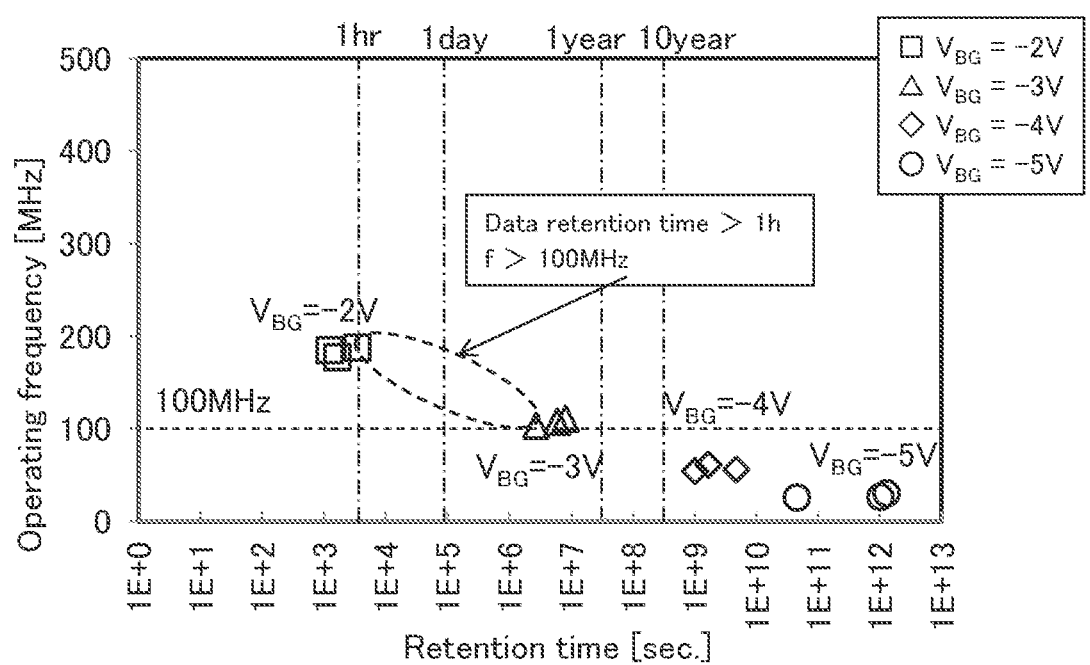
[FIG. 32] A diagram illustrating calculation results of operating frequency.

FIG. 32 shows the operating frequency of the DOSRAM including Sample C when the power supply voltage was 2.5 V and the temperature was −40° C. FIG. 32 show estimated operating frequencies at back gate voltages $V_{BG}$ of −2 V, −3 V, −4 V, and −5 V. In FIG. 32, the horizontal axis represents the data retention time of the DOSRAM, and the vertical axis represents the operating frequency of the DOSRAM. It was demonstrated that with Sample C, an operating frequency of 100 MHz or higher and a data retention time of one hour or longer are expected with a power supply voltage of 2.5 V at −40° C., as with Sample A and Sample B.

Figure 33A:
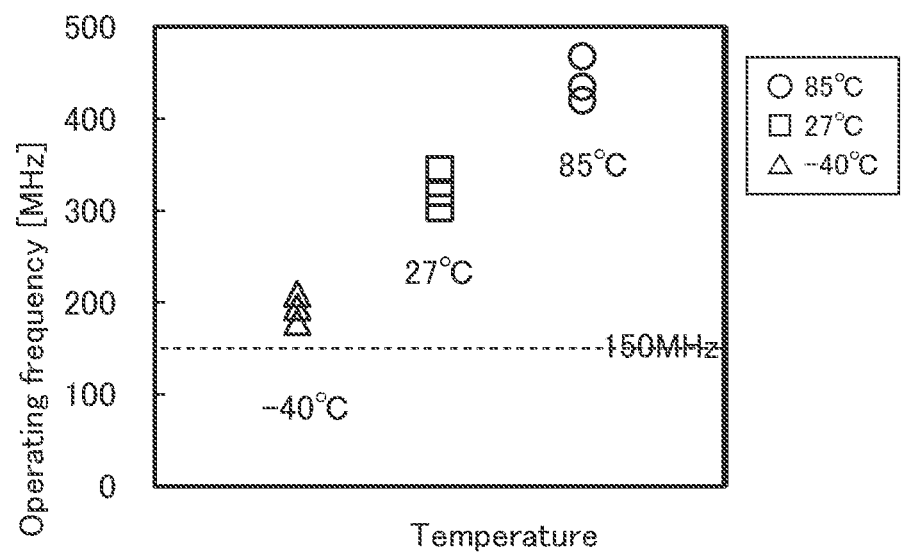
[FIGS. 33A and 33B] Diagrams illustrating calculation results of operating frequency.
Figure 33B:
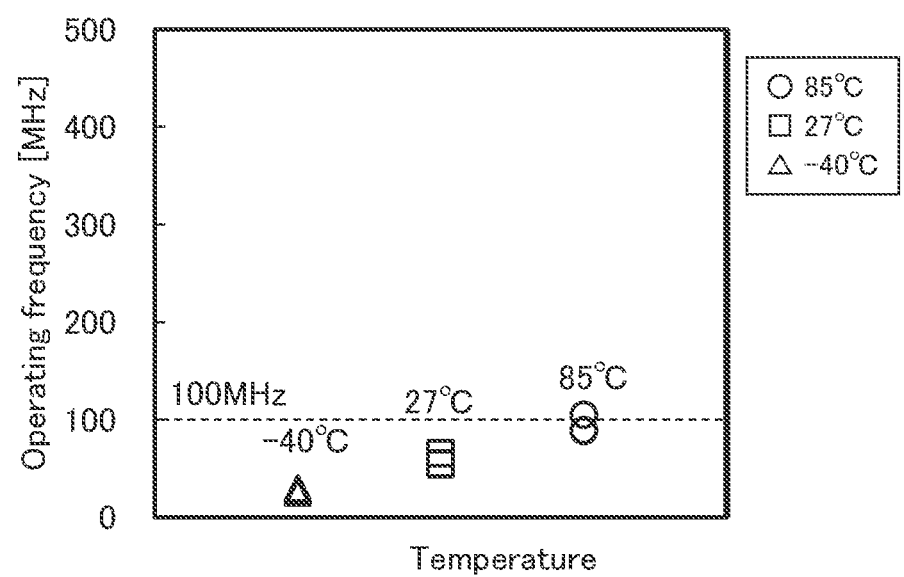

Next, data in the case where the back gate voltage $V_{BG}$ is not adjusted is described for comparison. FIG. 33(A) shows the operating frequency of the DOSRAM including Sample C when the power supply voltage was 3.3 V and the back gate voltage $V_{BG}$ was −5 V. FIG. 33(B) shows the operating frequency of the DOSRAM when the power supply voltage was 2.5 V and the back gate voltage $V_{BG}$ was −5 V. In FIG. 33(A) and FIG. 33(B), the horizontal axis represents the temperature, and the vertical axis represents the operating frequency of the DOSRAM. It was demonstrated that with Sample C, the operating frequency decreases as the temperature decreases, as with Sample A and Sample B.

At least part of the structure, the method, and the like described in this example can be implemented in appropriate combination with other embodiments described in this specification.

EXAMPLE 2

In this example, for the DOSRAM (see FIG. 10(A)) described in Embodiment 2, the data retention time and the operating frequency at different operating temperatures were estimated with a fixed back gate voltage $V_{BG}$.

To estimate the operating frequency of the DOSRAM, the transistor 500E illustrated in FIG. 17 was fabricated, and parameters needed for the estimation were extracted from its electrical characteristics. In this example, the above transistor 500E was assumed as the transistor M11 in FIG. 10(A), and the operating frequency of the DOSRAM was estimated.

As for the size of the transistor 500E fabricated in this example, the channel length (L) was 80 nm and the channel width (W) was 55 nm.

In the transistor 500E fabricated in this example, the oxide 530a is made of an In—Ga—Zn oxide having a thickness of 5 nm. The oxide 530a was formed by a DC sputtering method using an In—Ga—Zn oxide target with an atomic ratio of In:Ga:Zn=1:3:4. The sputtering was performed at a substrate temperature of 200° C. in a mixed gas of argon and oxygen.

The oxide 530b of the transistor 500E fabricated in this example is made of an In—Ga—Zn oxide having a thickness of 15 nm. The oxide 530b was formed by a DC sputtering method using an In—Ga—Zn oxide target with an atomic ratio of In:Ga:Zn=4:2:4.1. The sputtering method was performed at a substrate temperature of 200° C. in a mixed gas of argon and oxygen.

The oxide 530c of the transistor 500E fabricated in this example is made of an In—Ga—Zn oxide having a thickness of 3 nm. The oxide 530c was formed by a DC sputtering method using an In—Ga—Zn oxide target with an atomic ratio of In:Ga:Zn=4:2:4.1. The sputtering method was performed at a substrate temperature of 130° C. in a mixed gas of argon and oxygen.

After the transistor 500E was fabricated, heat treatment was performed at 400° C. for eight hours in a nitrogen gas atmosphere.

Next, $I_D$-$V_G$ measurement of the transistor 500E was performed. The $I_D$-$V_G$ measurement was performed under conditions where the drain voltage $V_D$ of the transistor 500E was +1.08 V, the source voltage $V_S$ was 0 V, and the gate voltage $V_G$ was swept from −1.0 V to +3.3 V. The back gate voltages $V_{BG}$ were two levels of −5.7 V and −10.5 V. Measurement temperatures were four levels of 125° C., 85° C., 27° C., and −40° C. Specifically, the $I_D$-$V_G$ measurement of the transistor 500E was performed in a state in which a 5-inch-square substrate where the transistor 500E was formed was fixed on a thermochuck set at each of the above temperatures. In addition, three elements were measured for each measurement temperature (n=3).

Next, as in Example 1, Vsh and Svalue of the transistor were calculated from the obtained $I_D$-$V_G$ curve. On the assumption of a DOSRAM with a memory capacity of 1 Mb, the data retention time and the DOSRAM operating frequency were estimated on the basis of the calculated data.

Figure 34:
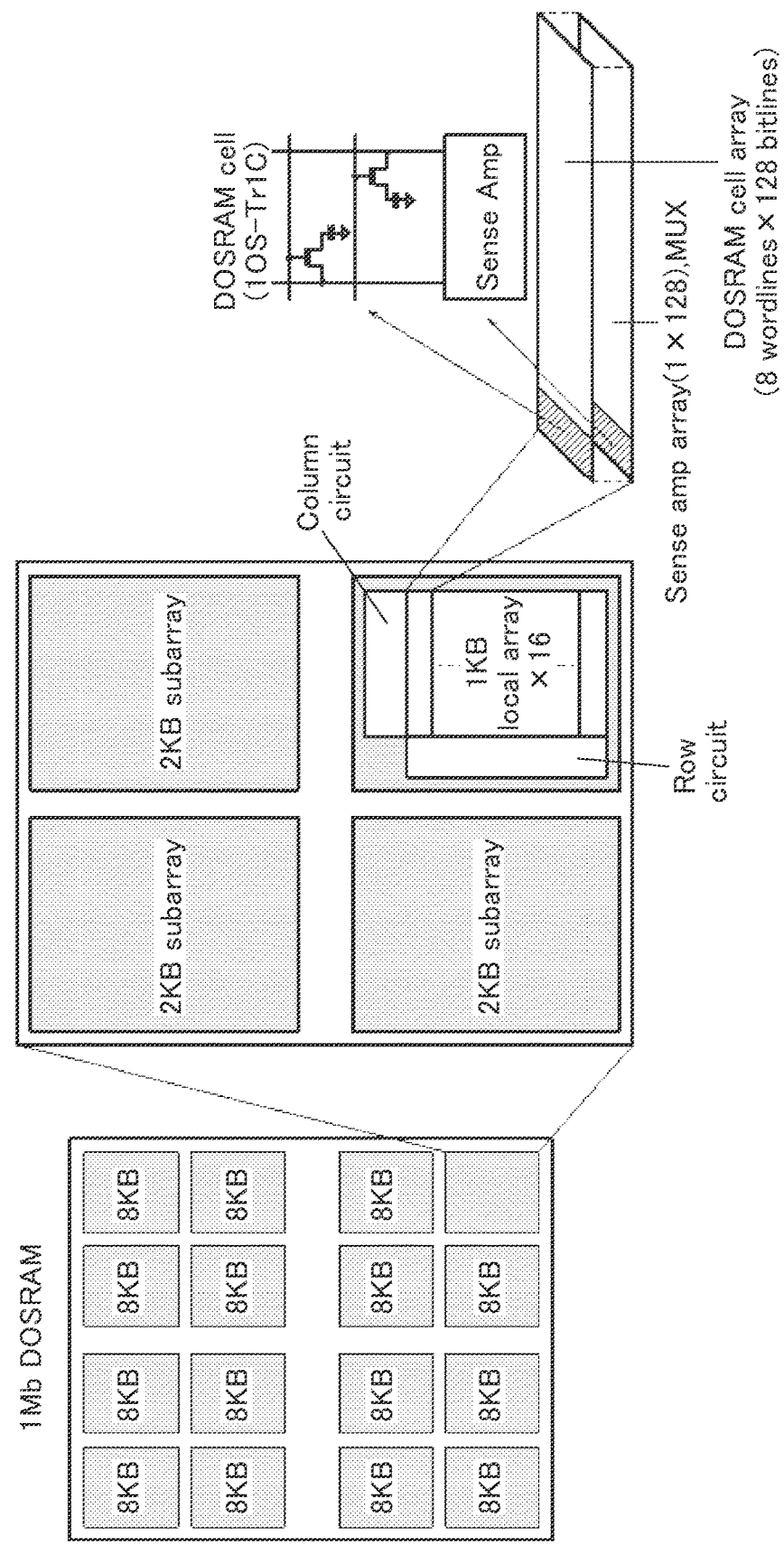
[FIG. 34] A schematic diagram of an assumed DOSRAM.

Table 1 shows specifications of the assumed DOSRAM. FIG. 34 is a schematic diagram of the assumed DOSRAM.

TABLE 1

| | |
|---|---|
| Cell size | 0.56 μm² |
| Storage capacitor | 3D-MIM 3.5 fF |
| Memory density | 1 Mb |
| Configuration | 8 wl × 128 bl × 16 blocks × 4 subarrays × 16 |
| Data bus | 32 b |
| Array type | open array |
| Supply voltage | VDD(bl) = 1.2 V |
| BL loading | 90 ohm, 8 fF |
| CLK | 2.5 GHz |

FIGS. 35(A) to 35(D) show estimates of the data retention time and the operating frequency when a voltage $V_{GON}$ that is supplied to the gate of the transistor 500E and turns on the transistor 500E was 2.25 V, a voltage $V_{GOFF}$ that turns off the transistor 500E was −0.72 V, and the back gate voltage $V_{BG}$ of the transistor 500E was −5.7 V.

Figure 35A:
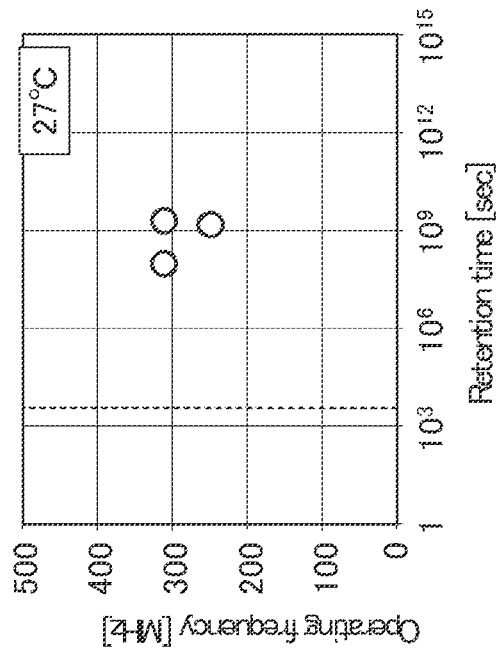
[FIGS. 35A to 35D] Diagrams illustrating calculation results of operating frequency.
Figure 35C:
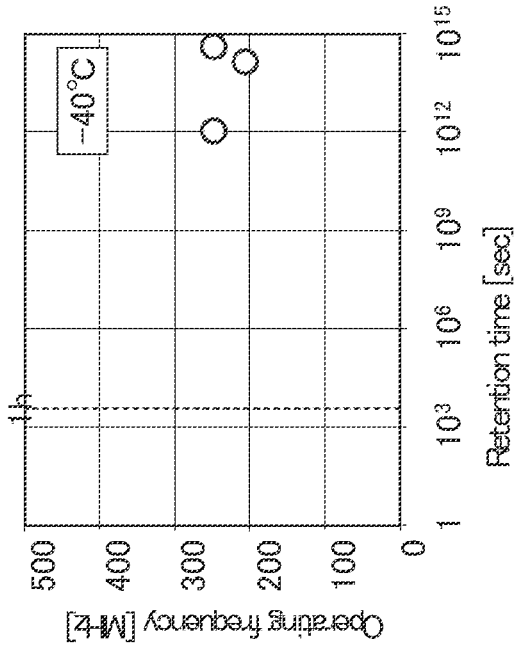
Figure 35B:
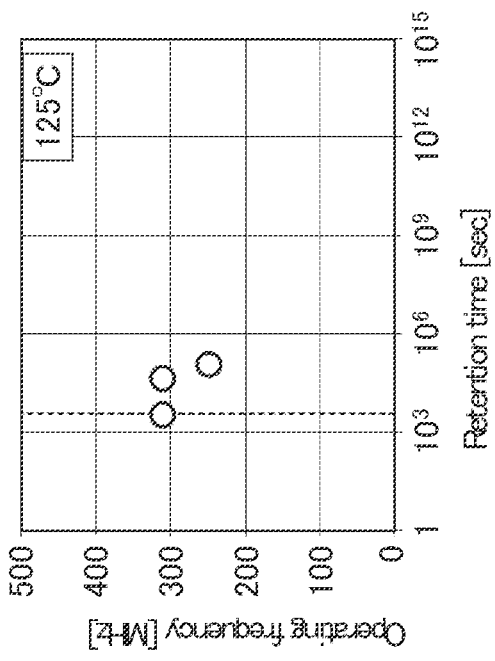
Figure 35D:
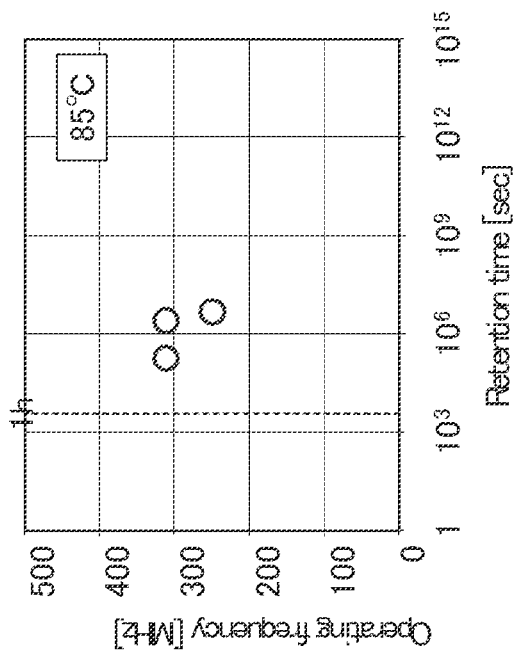

FIG. 35(A) shows estimates of the data retention time and the operating frequency at a measurement temperature of 125° C. FIG. 35(B) shows estimates of the data retention time and the operating frequency at a measurement temperature of 85° C. FIG. 35(C) shows estimates of the data retention time and the operating frequency at a measurement temperature of 27° C. FIG. 35(D) shows estimates of the data retention time and the operating frequency at a measurement temperature of −40° C.

From FIGS. 35(A) to 35(D), an operating frequency of 100 MHz or higher is estimated at all the measurement temperatures. A retention time of approximately one hour or longer is obtained at all the measurement temperatures. It is also demonstrated that a longer retention time is obtained as the measurement temperature decreases.

Figure 36A:
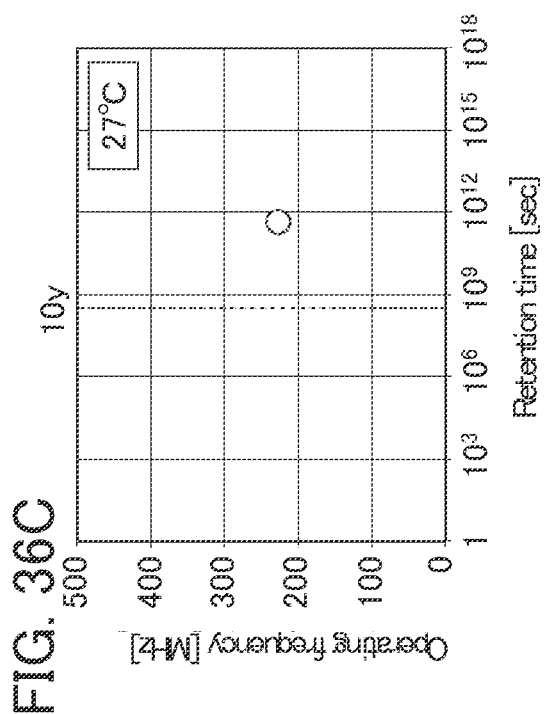
[FIGS. 36A to 36D] Diagrams illustrating calculation results of operating frequency.
Figure 36C:
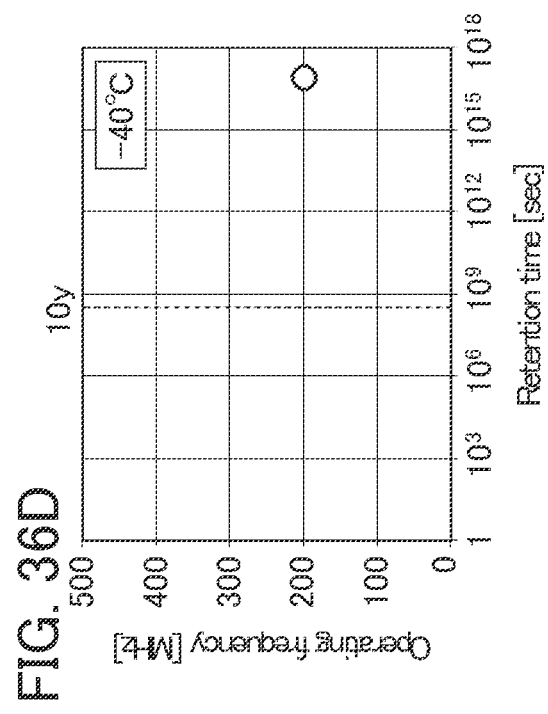
Figure 36B:
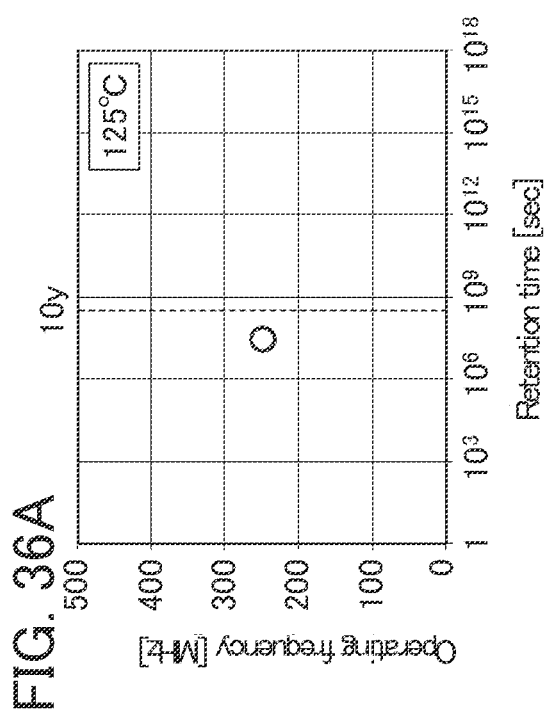
Figure 36D:
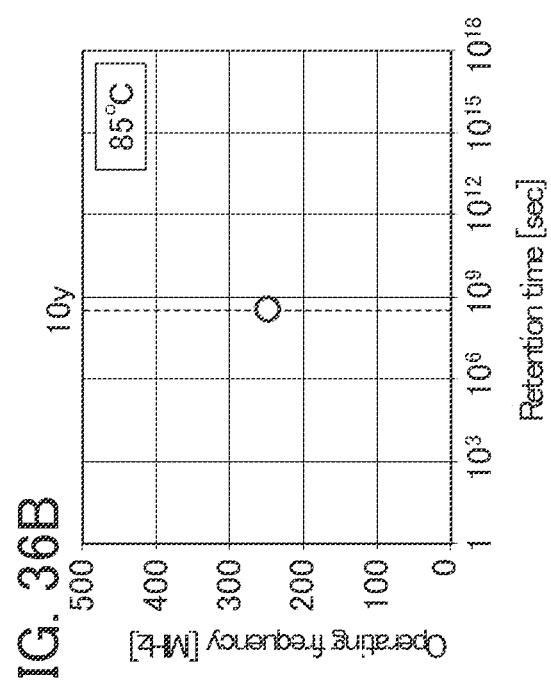

FIGS. 36(A) to 36(D) show estimates of the data retention time and the operating frequency in operating conditions different from those in FIGS. 35(A) to 35(D). Specifically, the voltage $V_{GON}$, the voltage $V_{GOFF}$, and the voltage $V_{BG}$ were 1.65 V, −1.32 V, and −3.0 V, respectively. FIG. 36(A) shows estimates of the data retention time and the operating frequency at a measurement temperature of 125° C. FIG. 36(B) shows estimates of the data retention time and the operating frequency at a measurement temperature of 85° C. FIG. 36(C) shows estimates of the data retention time and the operating frequency at a measurement temperature of 27° C. FIG. 36(D) shows estimates of the data retention time and the operating frequency at a measurement temperature of −40° C. One element was measured for each measurement temperature (n=1).

From FIGS. 36(A) to 36(D), an operating frequency of 100 MHz or higher is estimated at all the measurement temperatures. It is also demonstrated that a longer retention time is obtained as the measurement temperature decreases, as in FIGS. 35(A) to 35(D). The retention time at a measurement temperature of 125° C. is approximately one year, whereas a data retention time of 10 years or longer is obtained at a measurement temperature of 85° C. or lower.

This example demonstrated that the operating frequency and the data retention time of the DOSRAM can be adjusted by adjusting the gate voltage $V_G$ and the back gate voltage $V_{BG}$.

Example 3

A field-effect transistor in which IGZO having a CAAC structure was used in a semiconductor layer (also referred to as a "CAAC-IGZO FET") was fabricated, and the off-state current in a high temperature environment of 150° C., the cutoff frequency $f_T$, and the like were evaluated.

<Structure and Characteristics of CAAC-IGZO FET>

The transistor is a self-aligned transistor having a trench gate structure, like the transistor 500E illustrated in FIG. 17. The EOT (Equivalent Oxide Thickness) of a gate insulating layer on the top gate (front gate) side was 6 nm. The EOT of a gate insulating layer on the back gate side was 31 nm.

The evaluation was performed using a CAAC-IGZO FET having a channel length (L) of 25 nm and a channel width (W) of 21 nm, a CAAC-IGZO FET having a channel length (L) of 60 nm and a channel width (W) of 60 nm, and the like.

Figure 37:
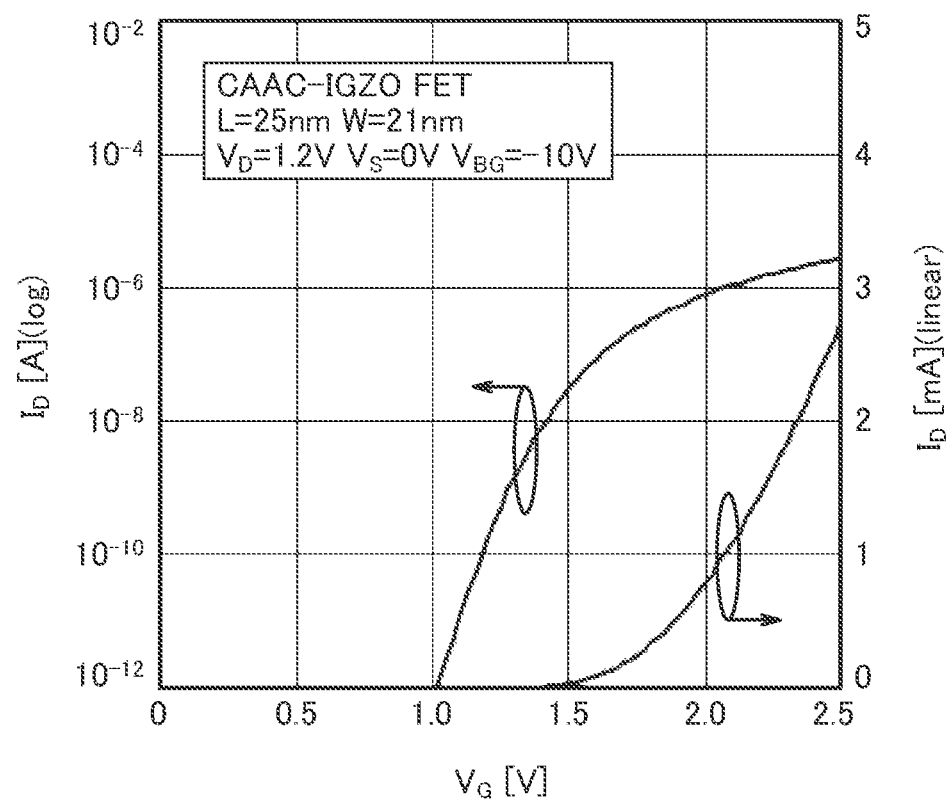
[FIG. 37] A diagram illustrating $I_D$-$V_G$ characteristics of a transistor.

FIG. 37 shows the $I_D$-$V_G$ characteristics of the CAAC-IGZO IGZO FET with L/W=25 nm/21 nm. The $I_D$-$V_G$ characteristics were measured under conditions where the drain voltage $V_D$ was 1.2 V, the source voltage $V_S$ was 0 V, the back gate voltage $V_{BG}$ was −10 V, and the gate voltage $V_G$ was changed from 0 V to 2.5 V.

From the measurement results of the $I_D$-$V_G$ characteristics, an S value of 79 mV/dec, a field-effect mobility of 10.2 cm$^2$/Vs, an on-state current of 2.8 μA ($V_G$=2.5 V), and a threshold voltage Vth of 1.44 V were obtained.

In general, the lower limit of a measuring instrument in current measurement is approximately $1\times10^{-12}$ to $1\times10^{-13}$ A. Therefore, as for the CAAC-IGZO FET having a feature of an extremely low off-state current, it is impossible to accurately measure the off-state current using one transistor. For example, to measure a current value of $1\times10^{-24}$ A, a measurement method in which a plurality of transistors are connected in parallel is considered. However, this is not practical because $10^{11}$ transistors that are connected in parallel would be required.

Figure 38A:
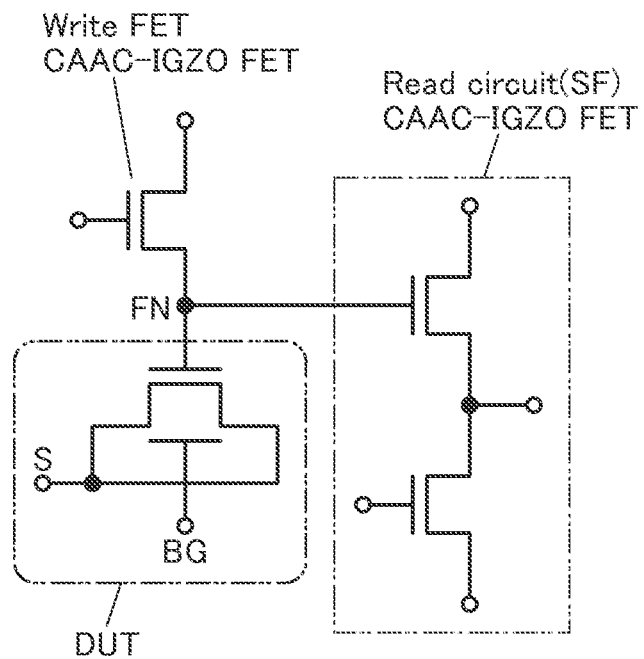
[FIGS. 38A and 38B] Diagrams each illustrating a circuit for measuring leakage current.
Figure 38B:
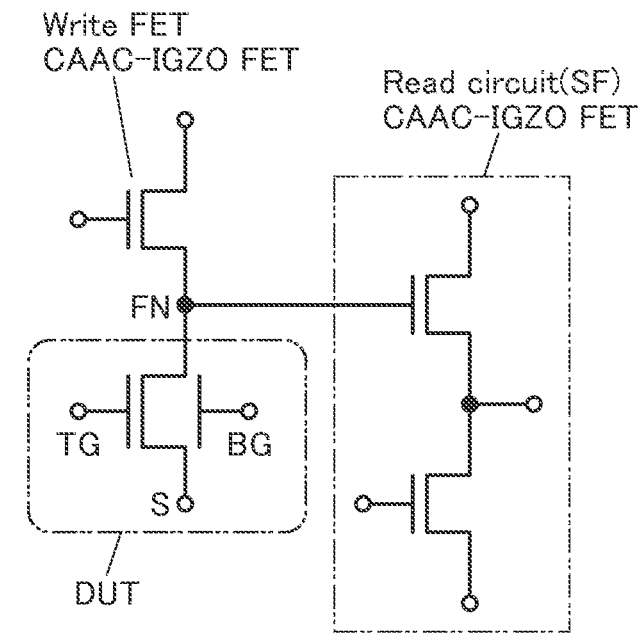

In this example, current measurement was performed using a circuit illustrated in FIG. 38(A) or FIG. 38(B). Specifically, a DUT (Device Under Test) was made by connecting 20000 CAAC-IGZO FETs in parallel, time dependence of a change in potential of a node FN was measured, and a leakage current value was derived. With the use of the circuit illustrated in FIG. 38(A), a value of a gate leakage current Ig (a total of a gate-source current, a gate-drain current, and a gate-back gate current) can be found. With the use of the circuit illustrated in FIG. 38(B), a value of the off-state current can be found.

Figure 39:
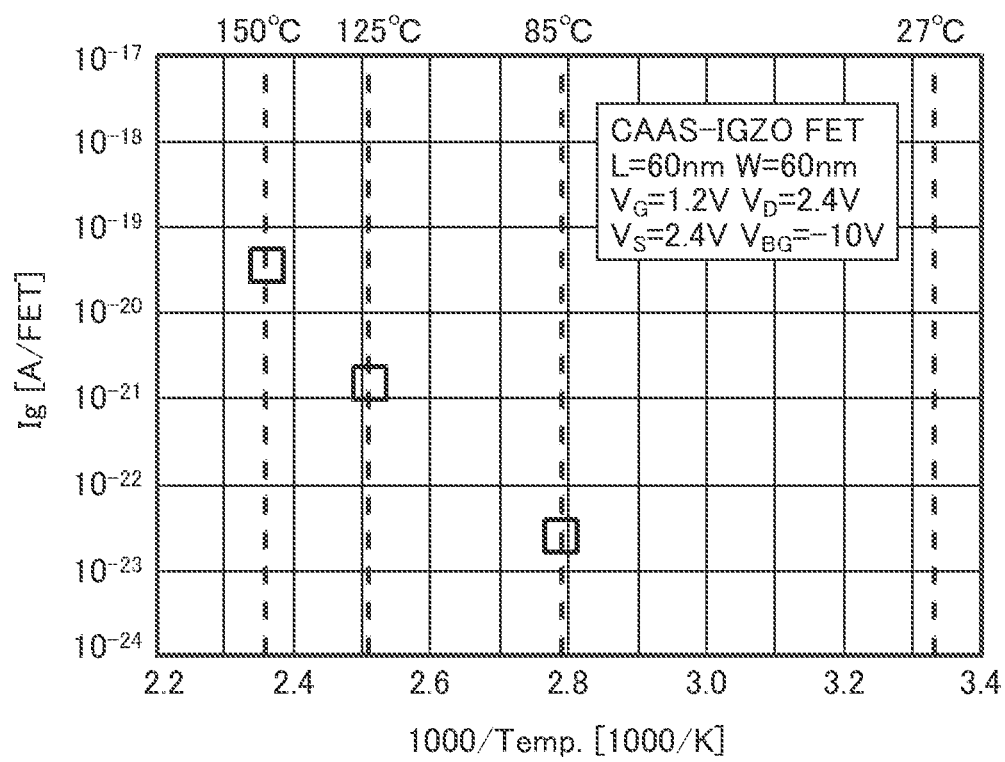
[FIG. 39] A diagram illustrating temperature dependence of gate leakage current.

FIG. 39 shows measurement results of the gate leakage current Ig measured under temperature environments of 85° C., 125° C., and 150° C. As the DUT, 20000 CAAC-IGZO FETs with L/W=60 nm/60 nm were connected in parallel. In FIG. 39, the horizontal axis represents a value obtained by multiplying the inverse of the temperature by 1000, and the vertical axis represents Ig per CAAC-IGZO FET on a logarithmic scale. The measurement was performed with a source voltage $V_S$ of 2.4 V, a drain voltage $V_D$ of 2.4 V, and a gate voltage $V_G$ of 1.2 V. This is the same as conditions where the source voltage $V_S$ is 0 V, the drain voltage Vd is 0 V, and the gate voltage $V_G$ is −1.2 V, meaning that the CAAC-IGZO FETs used as the DUT are in an off state. Note that the back gate voltage $V_{BG}$ was −10 V.

It was found from FIG. 39 that Ig per CAAC-IGZO FET is $3.3\times10^{-20}$ A even under the temperature environment of 150° C., and the gate leakage current Ig is sufficiently low.

Figure 40:
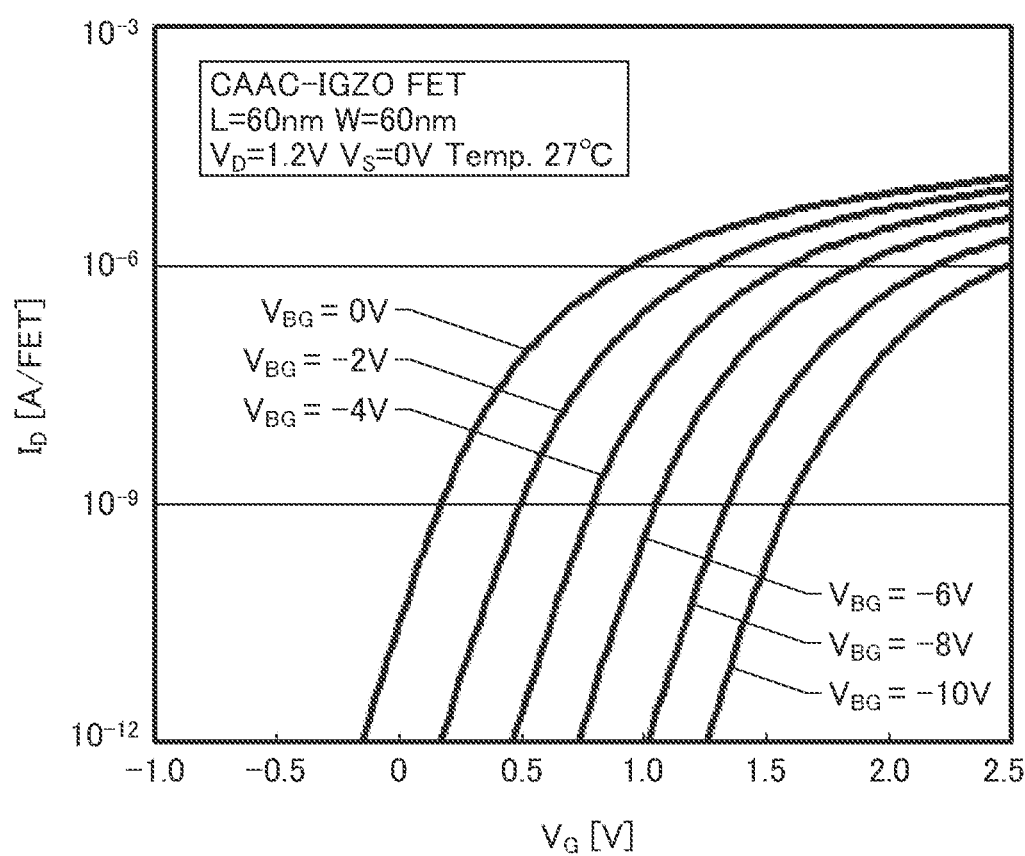
[FIG. 40] A diagram illustrating the relation between back gate voltage and threshold voltage.
Figure 41:
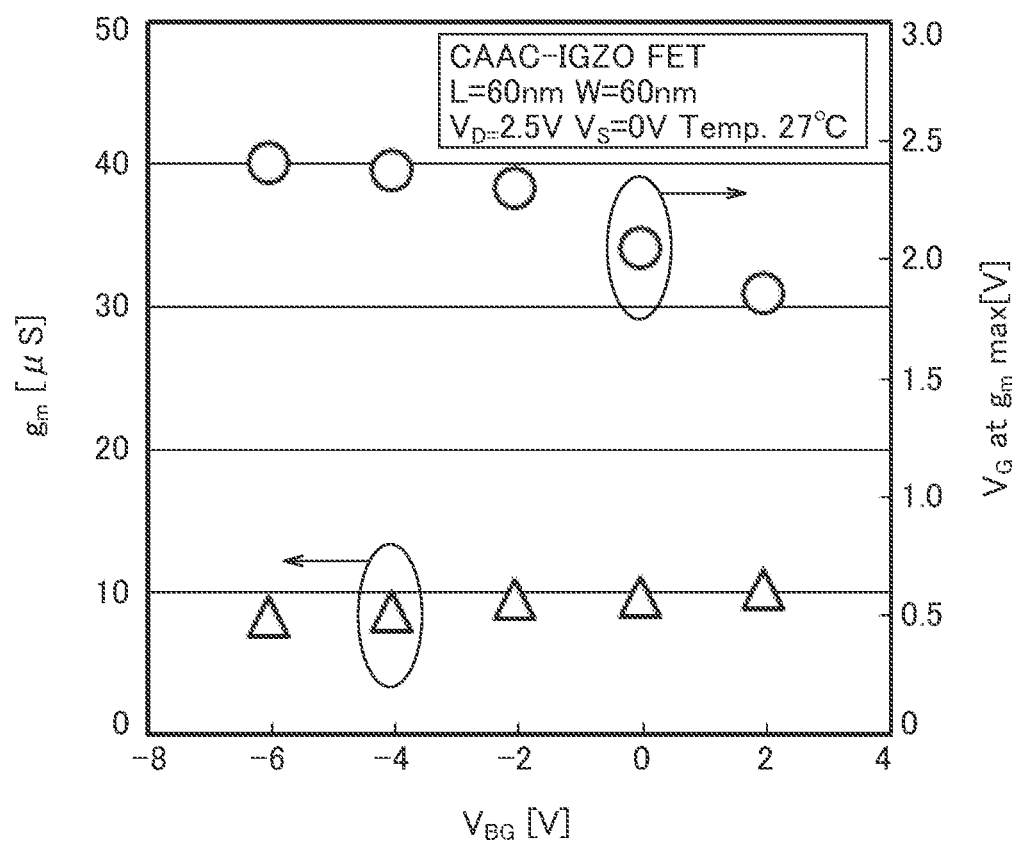
[FIG. 41] A diagram illustrating the relation between back gate voltage and transconductance.

The CAAC-IGZO FET fabricated in this example has a back gate electrode BGE. As shown in FIG. 40, it was demonstrated that the threshold voltage Vth is changed by changing the back gate voltage $V_{BG}$ supplied to the back gate electrode BGE. A threshold voltage fluctuation amount dVth/dV$_{BG}$ is −0.15 V/V. As shown in FIG. 41, it was demonstrated that a change in transconductance $g_m$ with respect to a change in the back gate voltage $V_{BG}$ is small. Meanwhile, it was demonstrated that the maximum value of the transconductance $g_m$ with respect to the change in the back gate voltage $V_{BG}$ shifts in a manner similar to that of Vth.

Dynamic Vth control is possible by providing the back gate electrode BGE. Therefore, it is not necessary to change the manufacturing process of transistors in accordance with the circuit use. On the other hand, there is a disadvantage of providing the back gate electrode BGE. There is a possibility that parasitic capacitance is generated between the back gate electrode BGE and the source/drain of the transistor and may increase a gate delay time. To verify this possibility, the cutoff frequencies $f_T$ of a transistor having the back gate electrode BGE and a transistor without the back gate electrode BGE were compared. The cutoff frequency $f_T$ is derived from Formula (5).

[Formula 5]
$$f_T = \frac{g_m}{2\pi(C_{tg} + C_{bg})} = \frac{g_m}{2\pi C_g} \quad (5)$$

In Formula (5), $C_{tg}$ is a gate capacitance of the top gate (front gate) side, and $C_{bg}$ is a gate capacitance of the back gate side. $C_g$ is a total capacitance of $C_{tg}$ and $C_{bg}$. It is found from Formula (5) that when the two transistors have a similar cutoff frequency $f_T$ in comparing the existence and absence of the back gate electrode BGE, they have similar gm normalized by the gate capacitance.

As for CAAC-IGZO FETs with L/W=25 nm/21 nm, the cutoff frequency $f_T$ of an element having the back gate electrode BGE and an element without BGE was measured. The measurement was performed under an environment of room temperature (27° C.). For the element having the back gate element BGE, the measurement was performed with a back gate voltage $V_{BG}$ of 0 V, −3 V, and −6 V. The measurement was performed on 672 CAAC-IGZO FETs connected in parallel (M=672).

Figure 42:
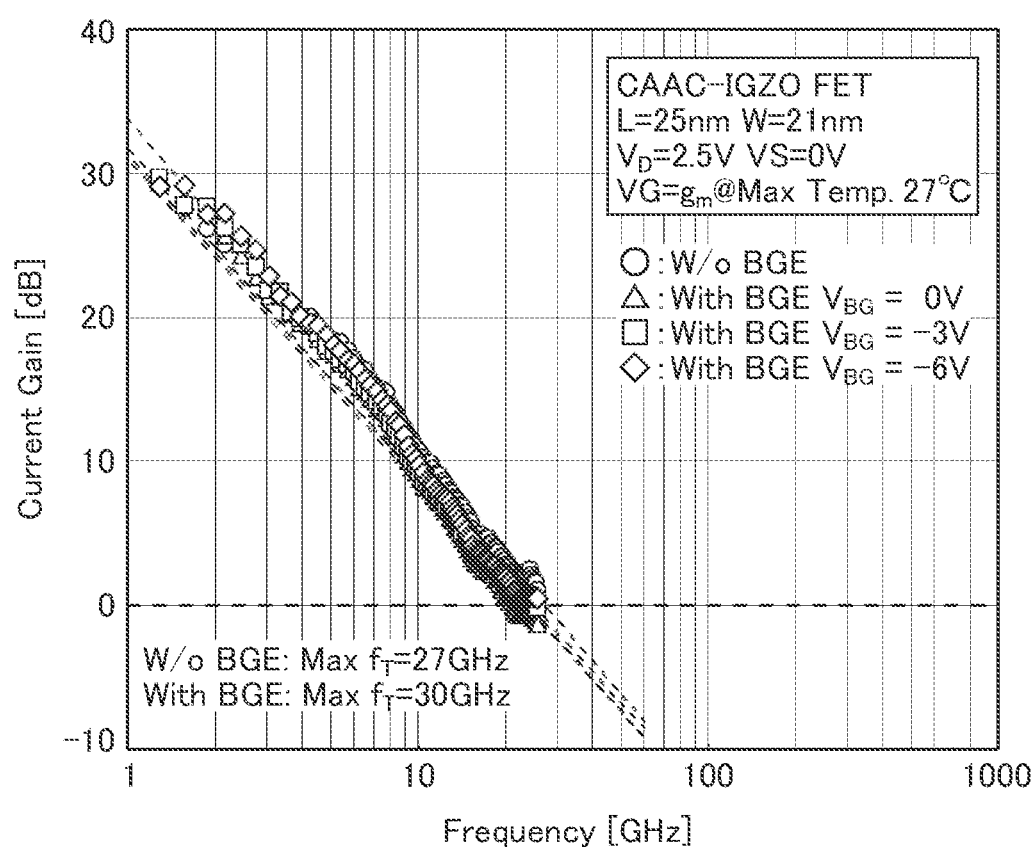
[FIG. 42] A diagram illustrating the relation between existence/absence of a back gate and cutoff frequency.

FIG. 42 shows the measurement results. A cutoff frequency $f_T$ of 30 GHz was obtained in the element having the back gate electrode BGE, and a cutoff frequency $f_T$ of 27 GHz was obtained in the element without the back gate electrode BGE. The cutoff frequency $f_T$ at a back gate voltage $V_{BG}$ of −6 V was 27.7 GHz; that is, the cutoff frequency $f_T$ similar to the case where the back gate voltage $V_{BG}$ was 0 V was obtained. These results showed that a change in the cutoff frequency $f_T$ due to the existence and absence of the back gate electrode BGE is small. Therefore, it was found that the delay time is not increased even when the back gate electrode BGE is provided. It was also found that providing the back gate electrode BGE can inhibit a Vth shift caused by a temperature change.

In addition, the cutoff frequency $f_T$ was measured using an element different from those in FIG. 42. Specifically, the cutoff frequency $f_T$ was measured using a CAAC-IGZO FET that has L/W=39 nm/28 nm and does not include the back gate electrode BGE. The measurement was performed under an environment of room temperature (27° C.). Moreover, the measurement was performed on 672 CAAC-IGZO FETs connected in parallel (M=672).

Figure 43:
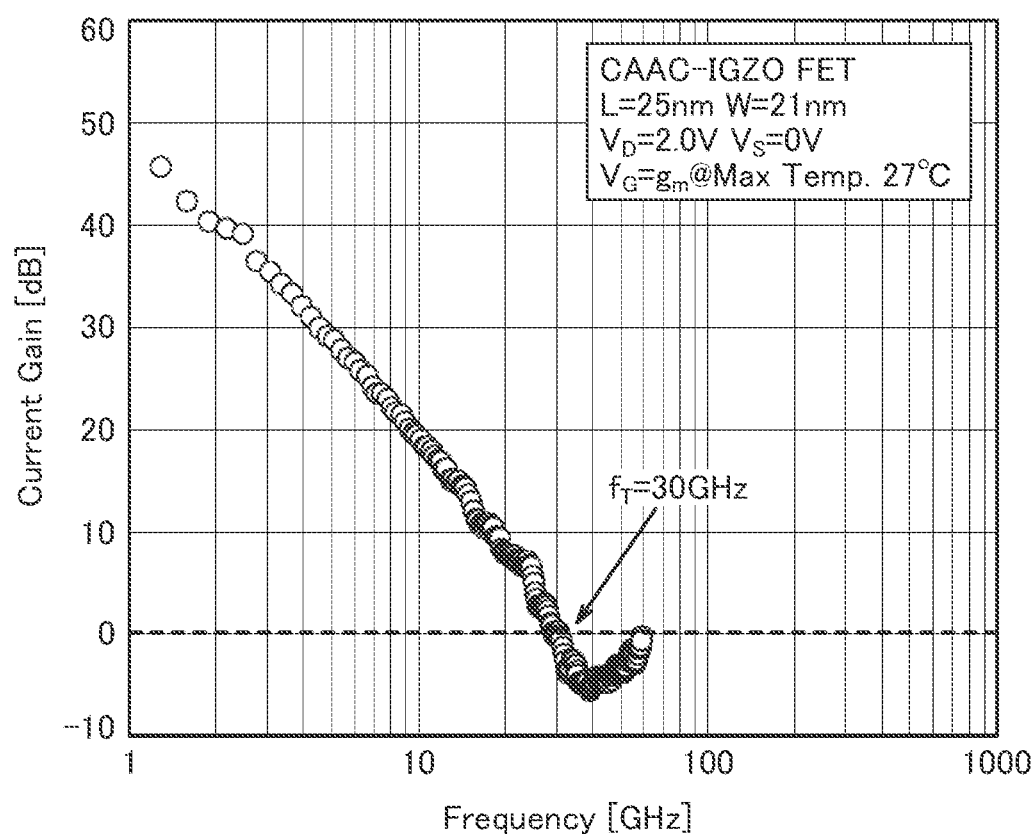
[FIG. 43] A diagram illustrating measurement results of cutoff frequency.

FIG. 43 shows the measurement results. Also in this measurement, a cutoff frequency $f_T$ of 30 GHz was obtained.
<High-Temperature Characteristics of CAAC-IGZO FET>

The CAAC-IGZO FET can be manufactured by a BEOL (Back End Of Line) process in a semiconductor manufacturing process for CMOS or the like. Thus, stacking with a Si transistor (among Si transistors, a field-effect Si transistor is also referred to as a "Si FET") is possible. For example, an application in which a circuit that needs high-speed operation is manufactured by a CMOS process and a circuit that requires a low leakage current is manufactured by a CAAC-IGZO process is possible.

The off-state current of the Si FET increases as the temperature increases, whereas the off-state current of the CAAC-IGZO FET is always below the measurement limit. Accordingly, the temperature characteristics of the off-state current of a Si FET with L/W=60 nm/120 nm and the off-state current of a CAAC-IGZO FET with L/W=60 nm/60 nm were compared. The off-state current of both FETs was measured using the circuit illustrated in FIG. 38(B).

The off-state current of the Si FET was measured with a gate voltage $V_G$=1.0 V, a source voltage $V_S$=0 V, a drain voltage $V_D$=1.2 V, and a body voltage $V_B$=0 V. The off-state current of the CAAC-IGZO FET was measured with a gate voltage $V_G$=−2.0 V, a source voltage $V_S$=0 V, a drain voltage $V_D$=2.0 V, and a back gate voltage $V_{BG}$=−3.0 V.

Figure 44:
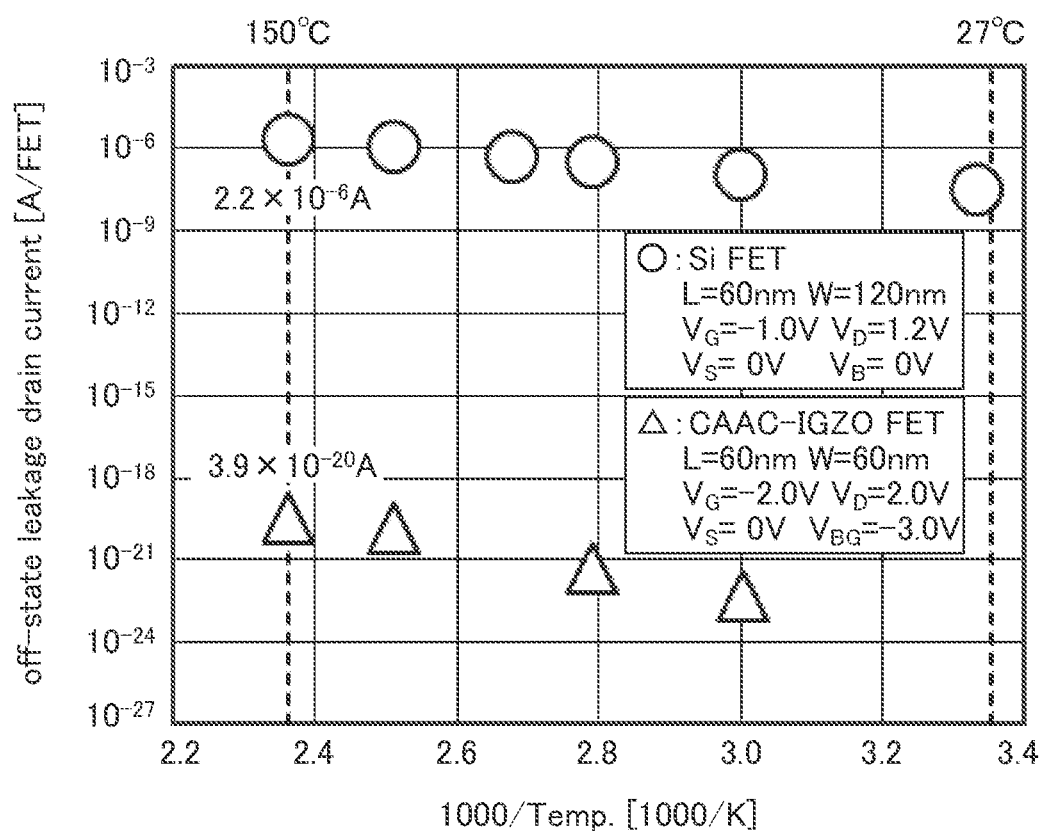
[FIG. 44] A diagram illustrating temperature dependence of off-state current.

FIG. 44 shows the measurement results. At a measurement temperature of 150° C., the off-state current of the Si FET was approximately $2.2 \times 10^{-6}$ A, and the off-state current of the CAAC-IGZO FET was approximately $3.9 \times 10^{-20}$ A. The CAAC-IGZO FET can maintain a low off-state current even in a high-temperature environment. By adjusting the back gate voltage, the off-state current can be further reduced.

Figure 45:
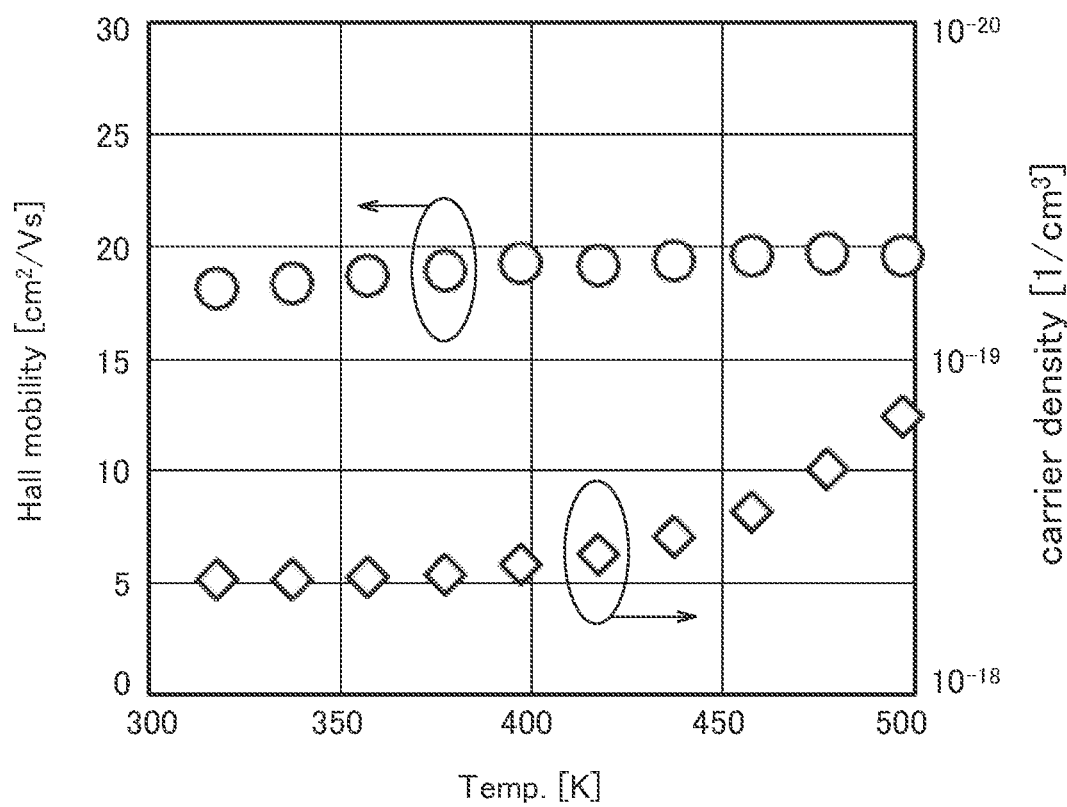
[FIG. 45] A diagram illustrating temperature dependence of Hall mobility and carrier density of a CAAC-IGZO film.

Next, FIG. 45 shows the temperature dependence of the Hall mobility and the carrier density of a CAAC-IGZO film. It is found from FIG. 45 that the Hall mobility of the CAAC-IGZO film hardly changes with respect to temperature change. The Hall mobility of the CAAC-IGZO film does not decrease even at high temperatures because it is assumed to be dominated by Coulomb scattering rather than phonon scattering.

Next, the cutoff frequency $f_T$ of a CAAC-IGZO FET and a Si FET at 25° C. and 150° C. was measured. For the DUT to be measured, a Si FET with L/W=60 nm/480 nm and a CAAC-IGZO FET with L/W=25 nm/21 nm were used. For the Si FET measurement, 21 Si FETs were connected in parallel (M=21). For the CAAC-IGZO FET measurement, 672 CAAC-IGZO FETs were connected in parallel (M=672).

Figure 46:
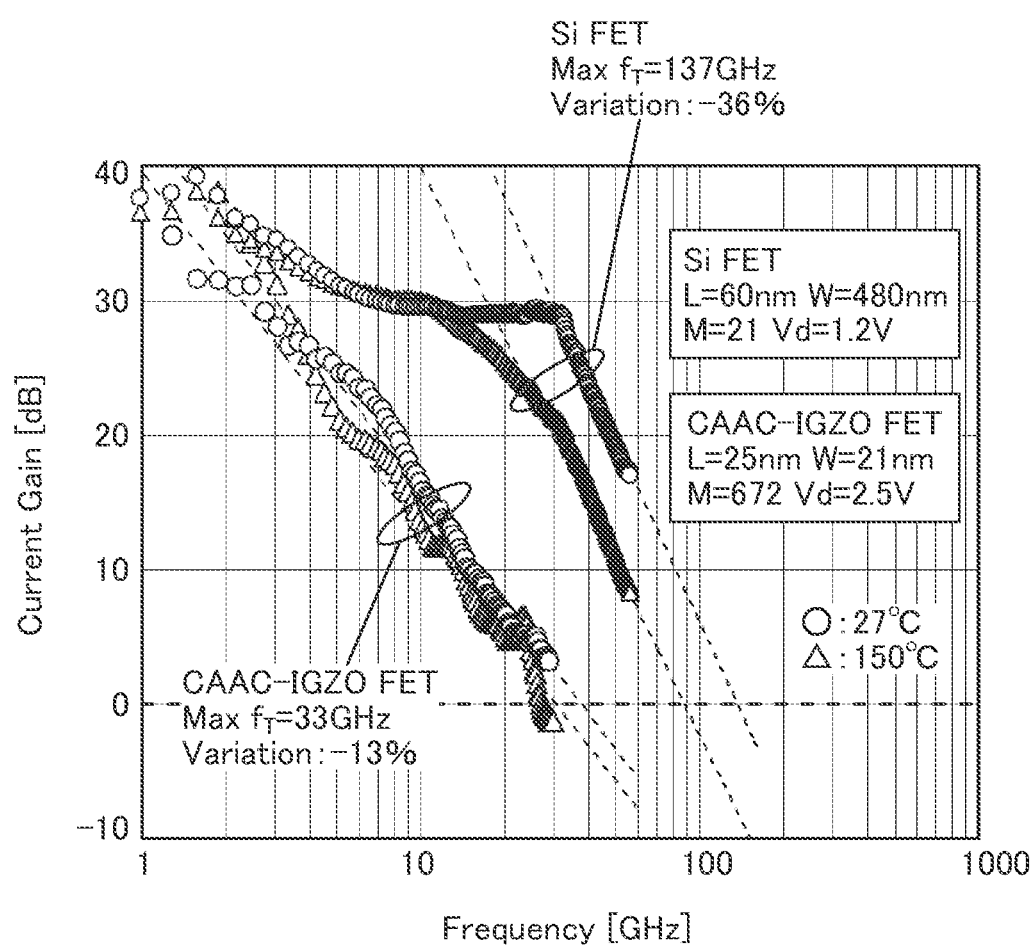
[FIG. 46] A diagram illustrating temperature dependence of cutoff frequency.

FIG. 46 shows the measurement results. The change rate of the maximum cutoff frequency $f_T$ of the Si FET was 36%, and the change rate of the maximum cutoff frequency $f_T$ of the CAAC-IGZO FET was 13%. The CAAC-IGZO FET obtained characteristics such that the difference between the cutoff frequency $f_T$ at 25° C. and the cutoff frequency $f_T$ at 150° C. was smaller than that in the Si FET. In addition, in the CAAC-IGZO FET measured this time, the maximum cutoff frequency $f_T$ at a measurement temperature of 150° C. and $V_D$=2.5 V was 33 GHz.

The above showed that the CAAC-IGZO FET had smaller temperature dependence of the cutoff frequency $f_T$ than the Si FET. It was also found that providing the back gate electrode in the CAAC-IGZO FET can inhibit a Vth fluctuation due to temperature change. It was also found that the amount of change in the cutoff frequency $f_T$ with respect to temperature change is smaller in the CAAC-IGZO FET than in the Si FET. It was also found that the CAAC-IGZO FET has an extremely low off-state current of $10^{-20}$ A even in a high-temperature environment. The use of the CAAC-IGZO FET can achieve a circuit and a memory that have low power consumption in an environment with a wide operating temperature range.

At least part of the structure, the method, and the like described in the above example can be implemented in appropriate combination with other embodiments described in this specification.

REFERENCE NUMERALS

11: voltage generation circuit, 11*a*: voltage generation circuit, 11*b*: voltage generation circuit, 12: voltage holding circuit, 14; capacitor, 15: buffer, 17: temperature sensor, 18: voltage control circuit, 20: correction circuit, 100: semiconductor device

The invention claimed is:

1. A semiconductor device comprising:
a transistor and a first circuit,
wherein the transistor comprises a first gate and a second gate,
wherein the first gate and the second gate overlap each other with a semiconductor layer therebetween,
wherein the first circuit comprises a temperature sensor, a voltage control circuit, and a capacitor,
wherein the temperature sensor is configured to obtain temperature information and output the temperature information to the voltage control circuit,
wherein the voltage control circuit is configured to convert the temperature information into a control voltage,
wherein the control voltage is applied to a first electrode of the capacitor, and
wherein a second electrode of the capacitor is electrically connected to the second gate of the transistor.

2. The semiconductor device according to claim 1,
wherein the voltage control circuit is configured to convert the temperature information into the control voltage according to a conversion formula.

3. The semiconductor device according to claim 1,
wherein the voltage control circuit comprises a microcomputer or an amplifier.

4. The semiconductor device according to claim 1,
wherein the semiconductor layer comprises a metal oxide.

5. The semiconductor device according to claim 1, further comprising a second circuit,
wherein the second circuit applies a negative voltage to the second gate.

6. The semiconductor device according to claim 5,
wherein the second circuit holds the negative voltage.

7. The semiconductor device according to claim 5,
wherein the second circuit comprises a transistor comprising a metal oxide in a channel formation region.

8. The semiconductor device according to claim 1,
wherein a positive voltage or a negative voltage is configured to be applied to the first gate, and
wherein a negative voltage is configured to be applied to the second gate.

9. A semiconductor device comprising:
a transistor comprising a first gate and a second gate;
a voltage generation circuit electrically connected to the second gate of the transistor;
a temperature sensor; and
a capacitor,
wherein the first gate and the second gate overlap each other with a semiconductor layer therebetween,
wherein an output terminal of the temperature sensor is electrically connected to a first electrode of the capacitor, and
wherein a second electrode of the capacitor is electrically connected to the second gate of the transistor.

10. The semiconductor device according to claim 9,
wherein the semiconductor layer comprises a metal oxide.

* * * * *